US012772725B2

(12) United States Patent
Chang et al.

(10) Patent No.: US 12,772,725 B2
(45) Date of Patent: Oct. 20, 2026

(54) BLOCK CONJUGATED POLYMER MATERIAL AND ACTIVE LAYER MATERIAL AND ORGANIC OPTOELECTRONIC DEVICE USING THE SAME

(71) Applicant: Raynergy Tek Incorporation, Hsinchu (TW)

(72) Inventors: Yi-Ming Chang, Hsinchu (TW); Chuang-Yi Liao, Hsinchu (TW); Yu-Tang Hsiao, Hsinchu (TW); Cheng-Chang Lai, Hsinchu (TW)

(73) Assignee: Raynergy Tek Incorporation, Hsinchu (TW)

( * ) Notice: Subject to any disclaimer, the term of this patent is extended or adjusted under 35 U.S.C. 154(b) by 552 days.

(21) Appl. No.: 18/235,565

(22) Filed: Aug. 18, 2023

(65) Prior Publication Data

US 2024/0099121 A1 Mar. 21, 2024

Related U.S. Application Data

(60) Provisional application No. 63/401,145, filed on Aug. 26, 2022.

(51) Int. Cl.
*H10K 85/10* (2023.01)
*C08G 61/12* (2006.01)
(Continued)

(52) U.S. Cl.
CPC ......... *H10K 85/113* (2023.02); *C08G 61/126* (2013.01); *H10K 85/151* (2023.02);
(Continued)

(58) Field of Classification Search
CPC ............. H10K 85/151; H10K 2101/40; C08G 2261/1426
See application file for complete search history.

(56) References Cited

U.S. PATENT DOCUMENTS

2020/0274069 A1 8/2020 Son et al.

FOREIGN PATENT DOCUMENTS

CN 103229322 A 7/2013
JP 2013058713 A 3/2013
(Continued)

OTHER PUBLICATIONS

Taiwan Intellectual Property Office Office Action dated May 14, 2024.

*Primary Examiner* — Khanh T Nguyen
(74) *Attorney, Agent, or Firm* — WPAT, PC

(57) ABSTRACT

An organic optoelectronic device comprises a first electrode, an active layer and a second electrode. Active layer materials of the active layer comprise a block conjugated polymer materials which includes a structure of formula I:

$$-\!\!\left[\text{polymer 1}\right]_o\!\left[\text{polymer 2}\right]_p\!- \quad \text{(formula I)}$$

The polymer 1 is a p-type polymer with high energy gap, and the polymer 1 comprises a first electron donor and a first electron acceptor arranged alternately. The polymer 2 is a p-type polymer with low energy gap, and the polymer 2 comprises a second electron donor and a second electron acceptor arranged alternately. Wherein, o and p>0. The organic optoelectronic device of the present invention transfers carriers through the polymer 2 with low energy gap, and suppresses the recombination probability of carriers through the polymer 1 with high energy gap, thereby reducing the leakage current of the organic optoelectronic device.

10 Claims, 4 Drawing Sheets

(51) Int. Cl.
*H10K 30/30* (2023.01)
*H10K 30/40* (2023.01)
*H10K 85/20* (2023.01)

(52) U.S. Cl.
CPC .................. *C08G 2261/126* (2013.01); *C08G 2261/1412* (2013.01); *C08G 2261/149* (2013.01); *C08G 2261/3223* (2013.01); *C08G 2261/3243* (2013.01); *C08G 2261/3246* (2013.01); *C08G 2261/334* (2013.01); *C08G 2261/414* (2013.01); *C08G 2261/512* (2013.01); *C08G 2261/94* (2013.01); *H10K 30/30* (2023.02); *H10K 30/40* (2023.02); *H10K 85/215* (2023.02)

(56) References Cited

FOREIGN PATENT DOCUMENTS

TW 201006862 A 2/2010
TW 202116877 A * 5/2021 ............. H01L 51/54

* cited by examiner

BLOCK CONJUGATED POLYMER MATERIAL AND ACTIVE LAYER MATERIAL AND ORGANIC OPTOELECTRONIC DEVICE USING THE SAME

The present application is based on, and claims priority from, America provisional patent application number U.S. 63/401,145, filed on 2022 Aug. 26, the disclosure of which is hereby incorporated by reference herein in its entirety.

BACKGROUND OF THE INVENTION

Field of the Invention

The present invention relates to a conjugated polymer material, and more particularly, relates to a block conjugated polymer material and an active layer material and an organic optoelectronic device using the same.

Description of the Prior Art

Organic photodetector (OPD) technology refers to a photosensitive diode that uses an organic semiconductor material as a source of photocurrent response. Its principle and concept are very similar to the operating mechanism of organic photovoltaic (OPV). In the active layer of the organic photodetector, there are generally two or more semiconductor materials whose energy levels are functionally paired with each other by an electron donor and an electron acceptor. When the material absorbs light with a specific response range, an electron/hole pair (also known as exciton) is generated, and the electron/hole pair will diffuse to the interface between the electron donor and the electron acceptor. Driven by the energy level force between heterogeneous materials, the electron/hole pair is separated into a hole and an electron, and the hole and the electron are transmitted to the corresponding positive and negative electrodes along the energy band to form a current. The difference from solar technology is that since the organic photodetector is configured for light detecting requirements, the detectivity of materials for a specific wavelength region and the signal/noise ratio of the overall device are very demanding. Therefore, in terms of technical evaluation, the third quadrant characteristics of the voltage-current curve are generally considered, and the external quantum efficiency (EQE) and the leakage current of the device are used as the basis.

Image sensors have become one of the fastest growing semiconductor product categories, and organic photodetector is among the passive components. Its application can be mainly classified according to the photosensitive band. For example, lens, optical communication, biochip or fingerprint scanning all need to rely on the photodetection technology in the visible region, and the current mainstream technology is the photodetector device composed of single crystal silicon. In the foreseeable future, the demand for invisible region applications will be increased significantly, for example, biometric technologies, such as vein scanners, iris sensors, and facial recognition. The physiological vital sign monitoring technology of pulse oximetry measurement, whose demand has increased due to the COVID-19 epidemic, and machine vision applications like LiDAR and time of flight sensors that are currently required by self-driving cars. Therefore, how to provide an organic photodetector with high performance and low cost in the absorption range of near infrared or shortwave infrared corresponding to the above applications is a very important issue at present.

SUMMARY OF THE INVENTION

In view of this, the first category of the present invention is to provide a block conjugated polymer material to break through the detectivity of the prior art. According to one embodiment of the present invention, the block conjugated polymer material comprises a structure of formula I:

$$-\!\!\left[\text{polymer 1}\right]_o\!\!\left[\text{polymer 2}\right]_p\!\!- \quad \text{(formula I)}$$

Wherein the polymer 1 is a p-type polymer with high energy gap, and the polymer 1 comprises a first electron donor and a first electron acceptor arranged alternately. The polymer 2 is a p-type polymer with low energy gap, and the polymer 2 comprises a second electron donor and a second electron acceptor arranged alternately. Wherein, o and p>0.

Wherein, the wavelength of the maximum absorption of the film of the polymer 1 is ≤800 nm, and the wavelength of the maximum absorption of the film of the polymer 2 is >800 nm.

Wherein, the polymer 1 is one of the following structures:

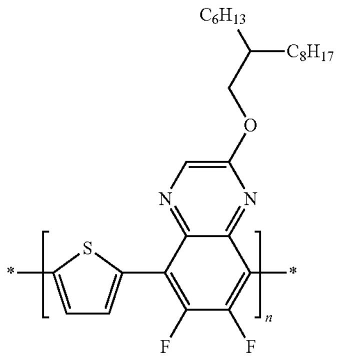

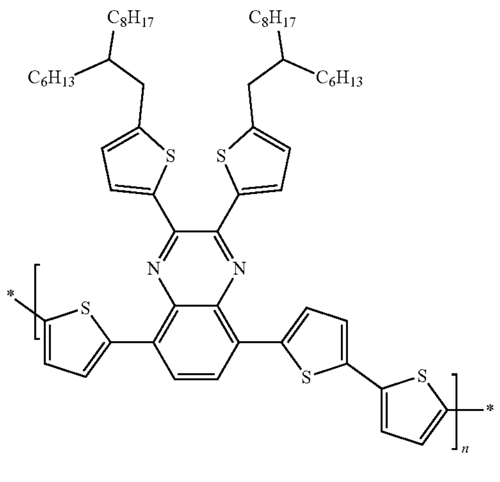

-continued
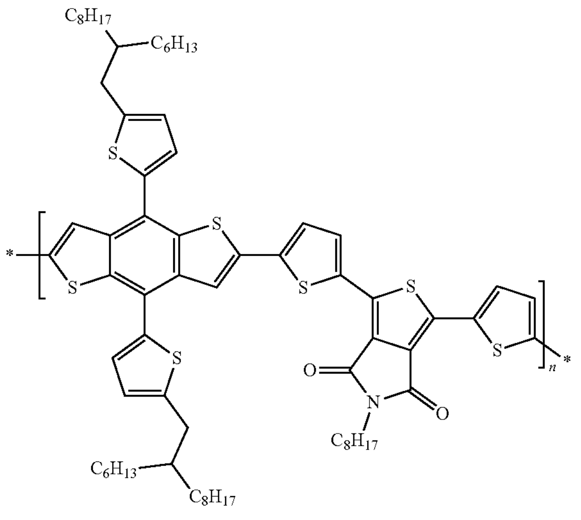
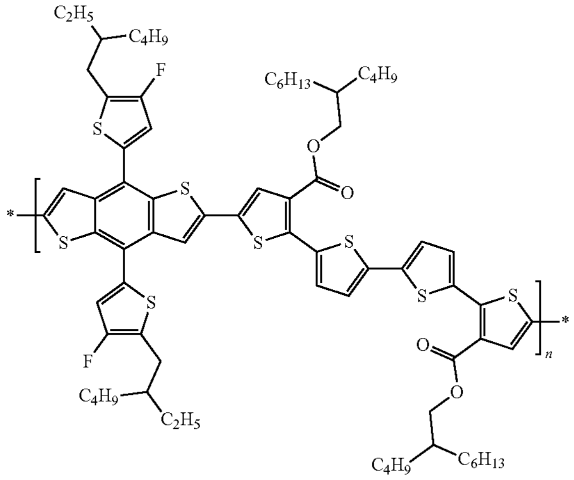
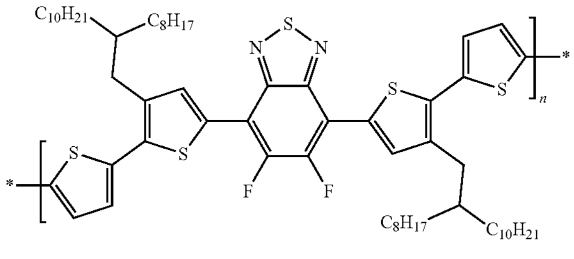
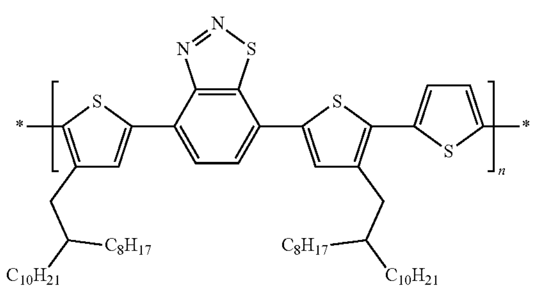
-continued
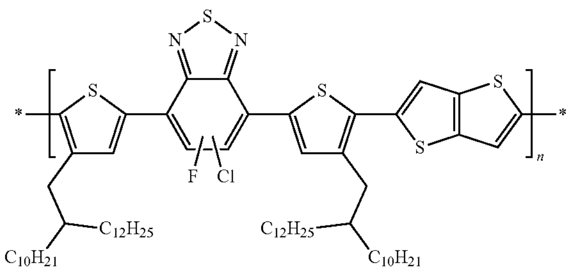
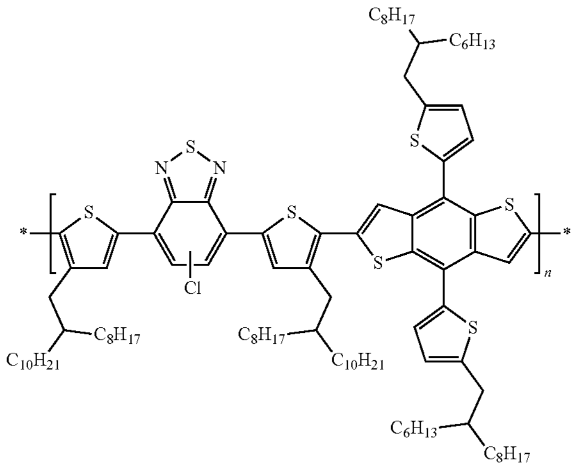
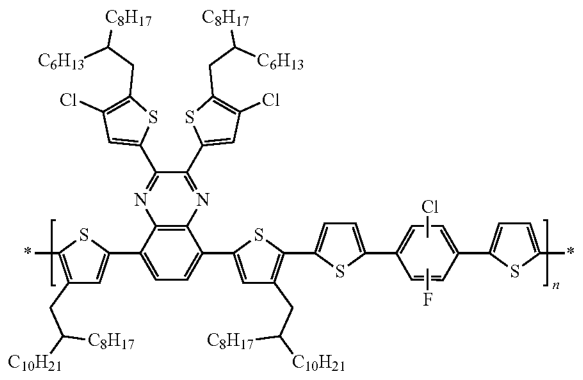
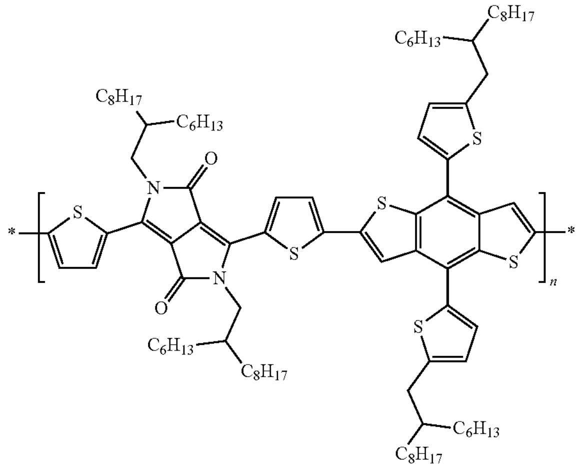

-continued
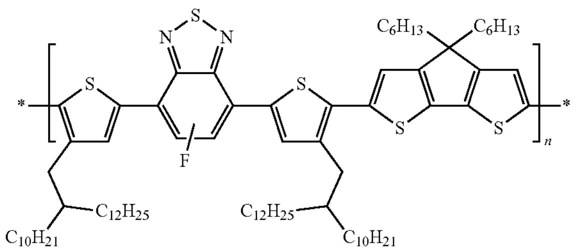
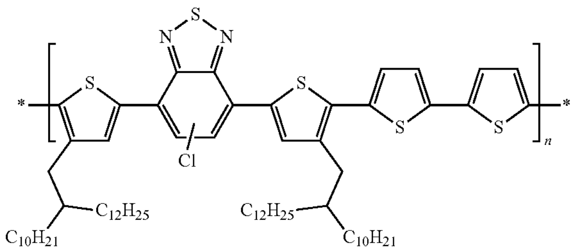
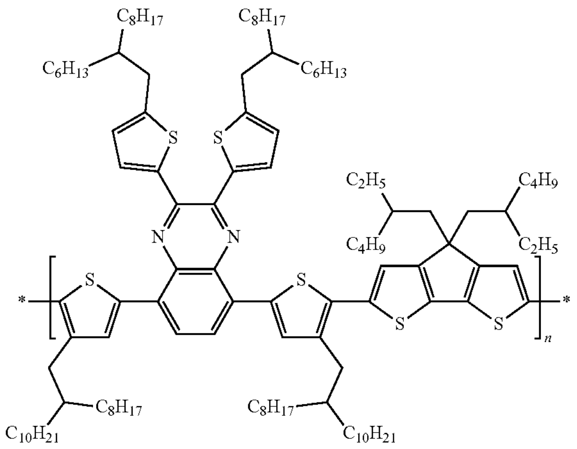
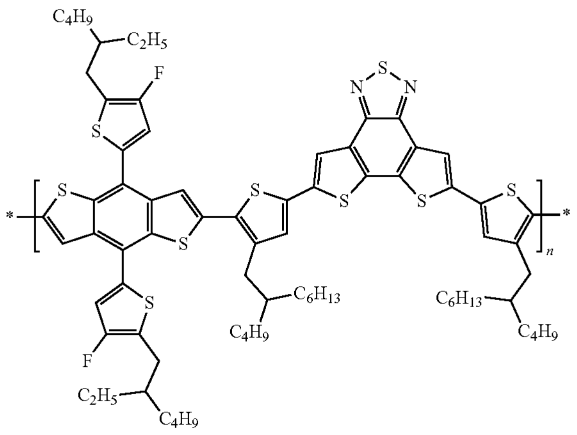
-continued
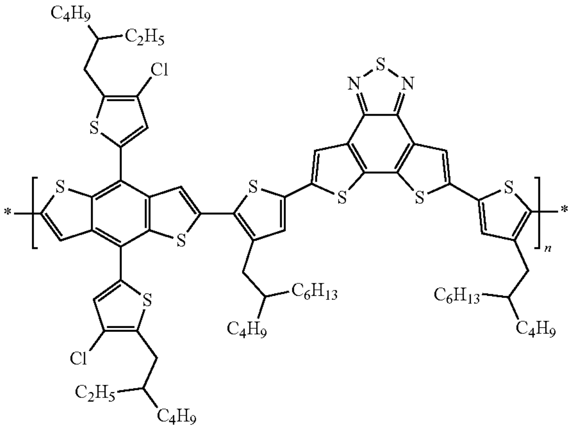
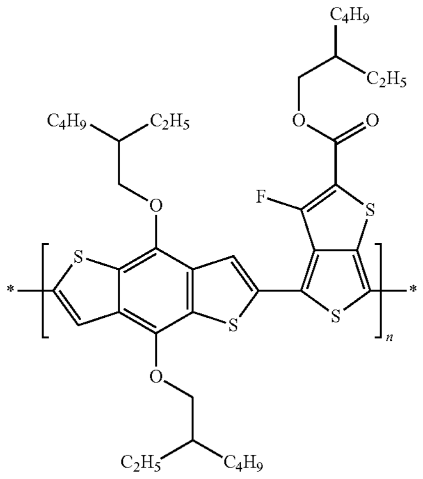
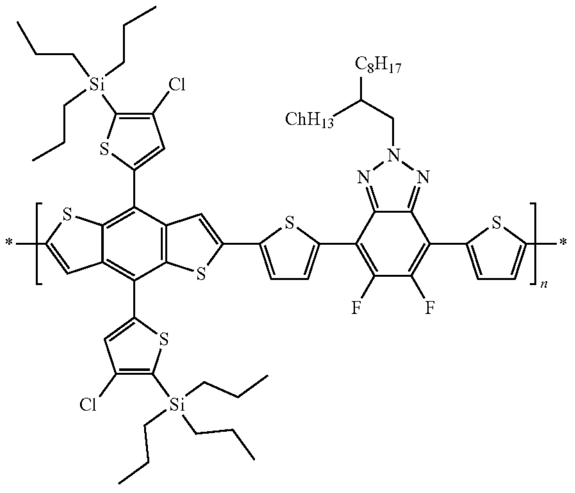
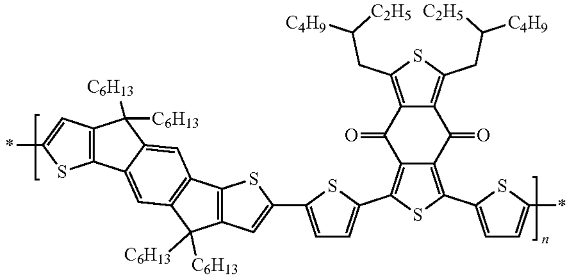

-continued
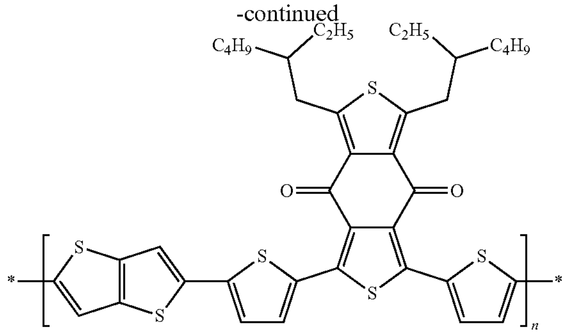
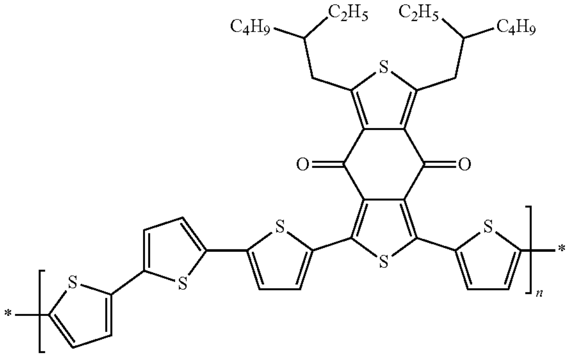
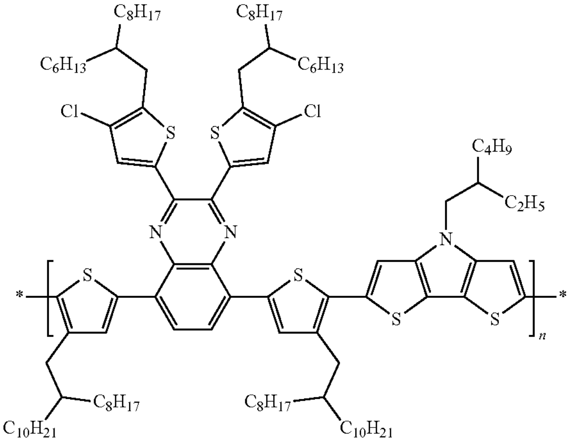
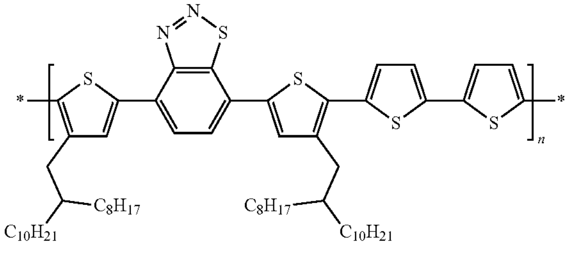
-continued
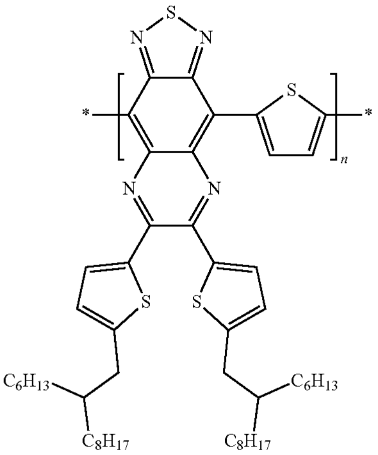
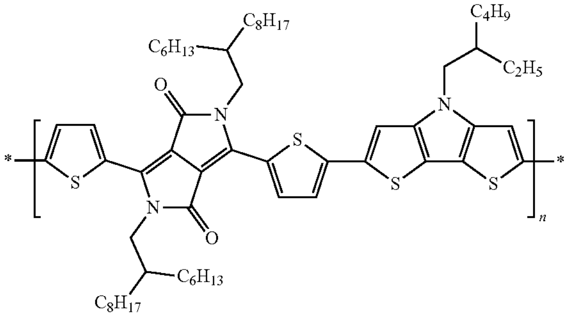
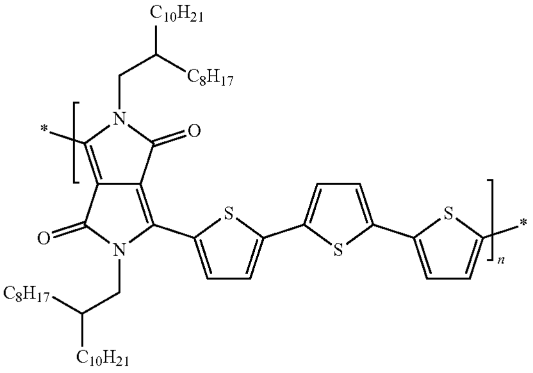
Wherein, n is positive integer.
Wherein, the polymer 2 is one of the following structures:
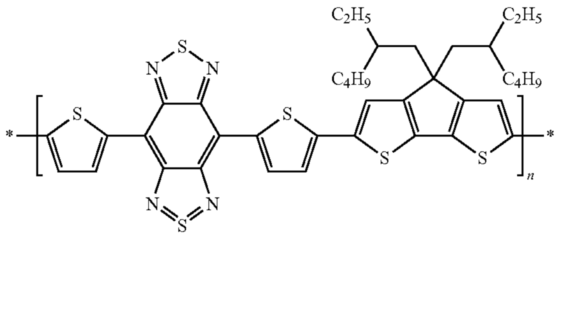
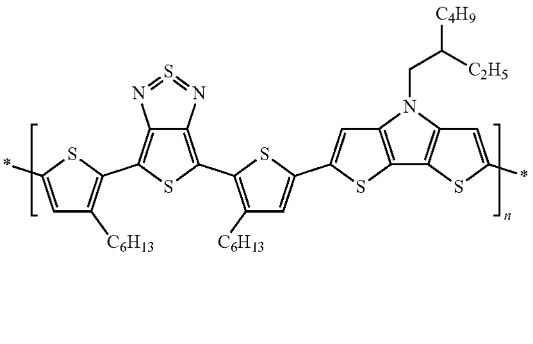

-continued
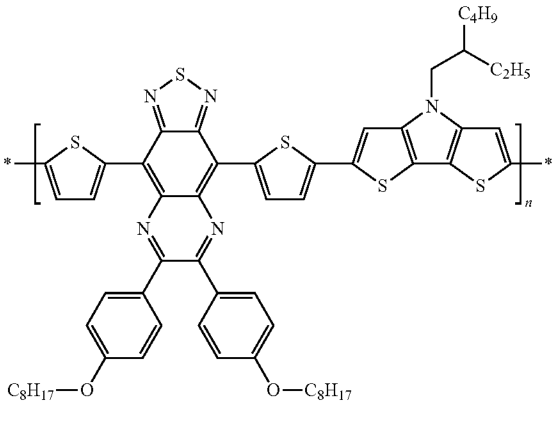
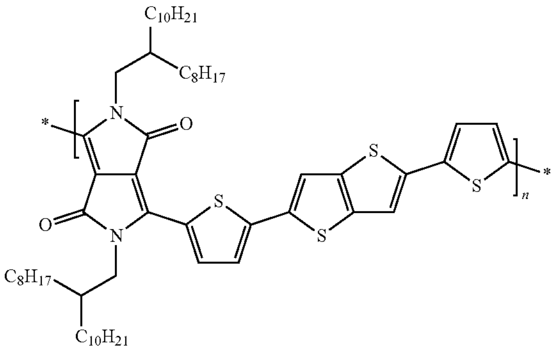
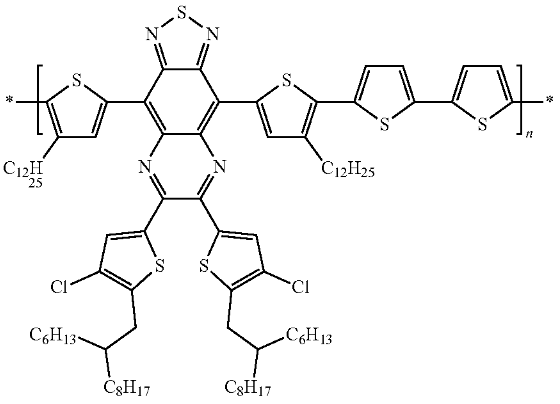
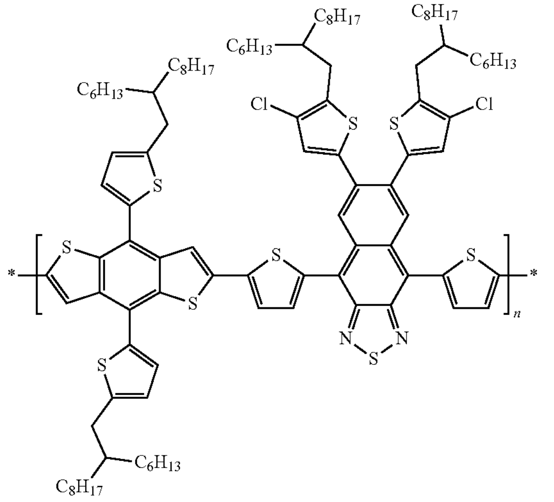
-continued
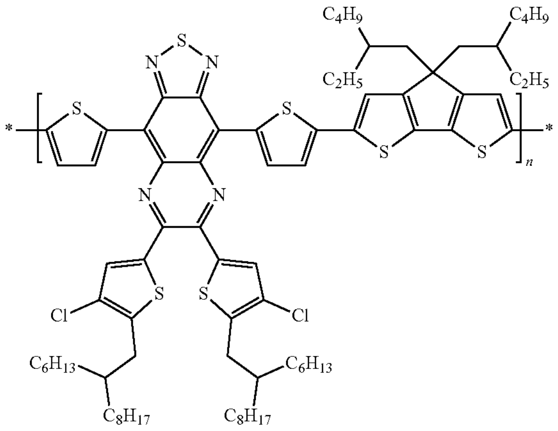
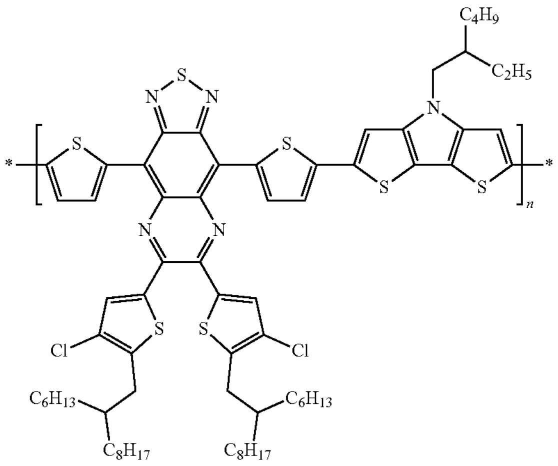
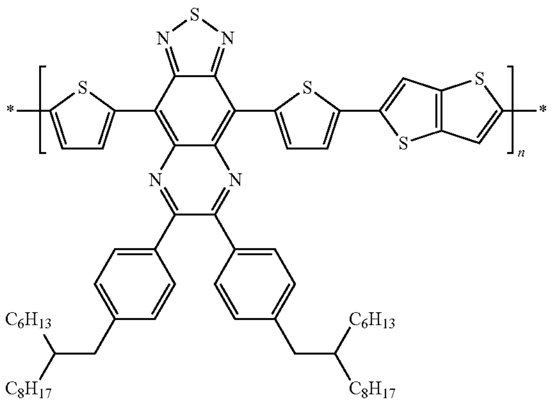

-continued

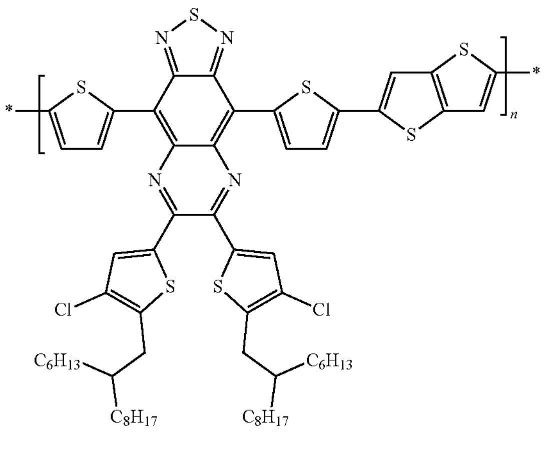

Wherein, n is positive integer.

The second category of the present invention is to provide an active layer material which comprises a p-type material and an n-type material. The p-type material comprises the block conjugated polymer material aforementioned. The n-type material comprises a non-fullerene material structure or a fullerene material structure with an electron-withdrawing group, and the energy gap of the n-type material is less than 2.5.

Wherein, the structure of the non-fullerene material comprises a structure of formula II: Ar2-Ar1-Ar2 (formula II). Ar1 comprises a conjugated structure with 5 to 40 carbon, and comprises more than one fused ring or fused heterocyclic ring. Ar2 comprises a monocyclic structure with ketone or a fused ring structure with ketone.

Wherein, Ar1 is one of the following structures:

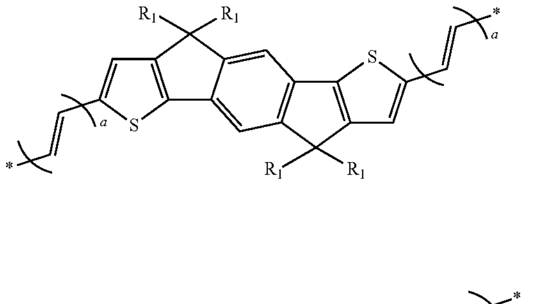

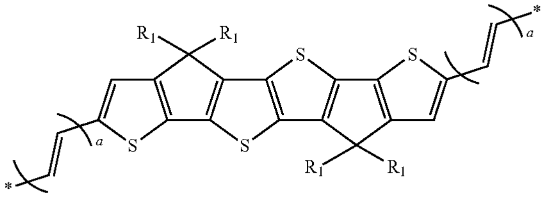

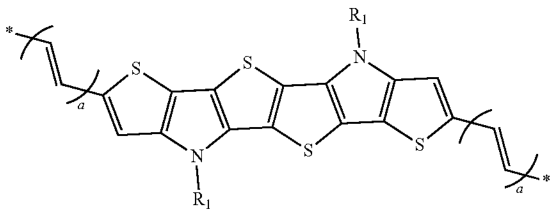

-continued

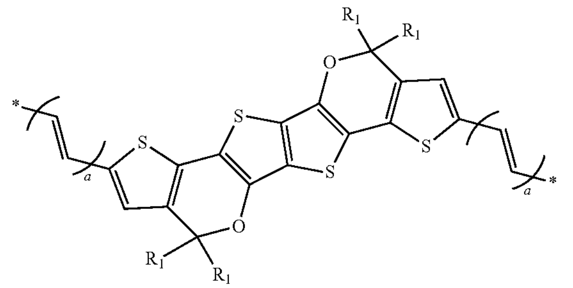

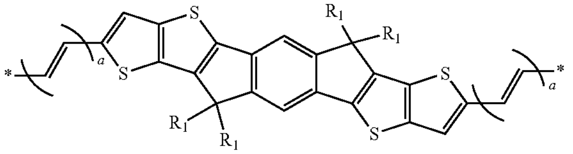

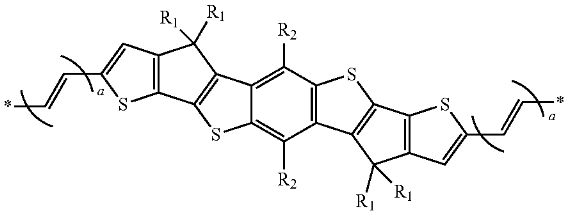

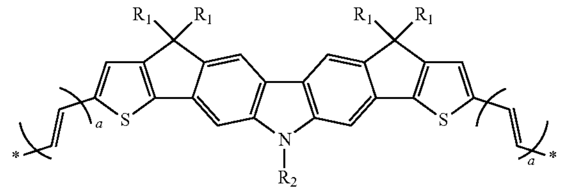

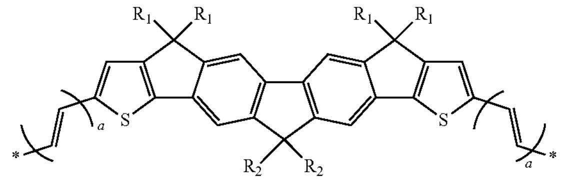

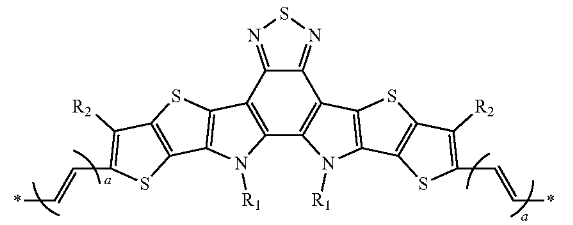

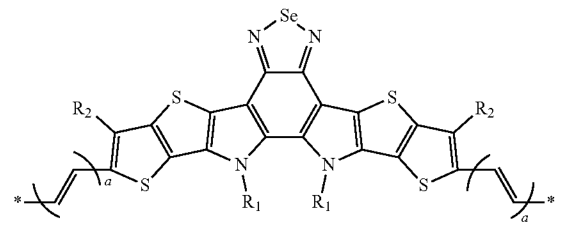

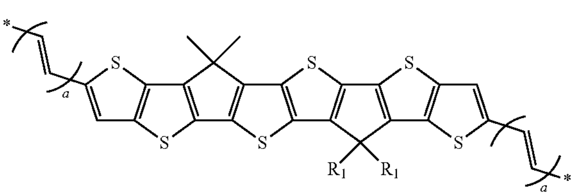

-continued

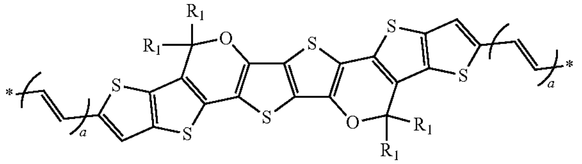

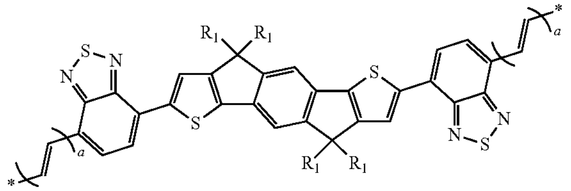

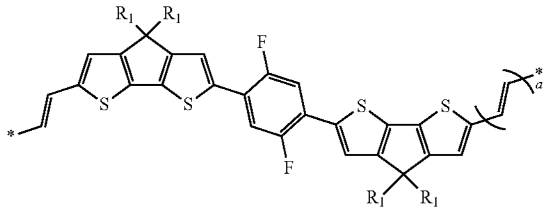

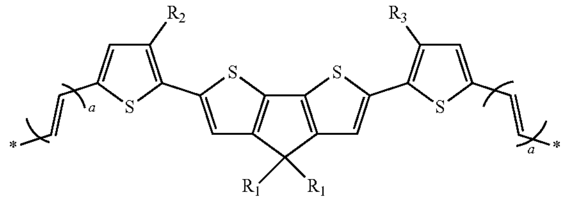

Wherein, a=0 or 1. $R_1$, $R_2$ and $R_3$ are those independently selected from the following group: C1~C30 alkyl, C1~C30 silyl, C1~C30 alkoxy, C1~C30 alkylthio, C1~C30 haloalkyl, C2~C30 ester group, C1~C30 alkylaryl, C1~C30 alkylheteroaryl, C1~C30 silylaryl, C1~C30 silylheteroaryl, C1~C30 alkoxyaryl, C1~C30 alkoxyheteroaryl, C1~C30 alkylthioaryl, C1~C30 alkylthioheteroaryl, C1~C30 haloalkylaryl, C1~C30 haloalkylheteroaryl, C1~C30 ester aryl or C1~C30 ester heteroaryl.

Wherein, Ar2 is one of the following structures:

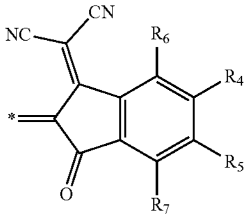

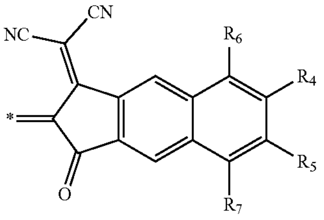

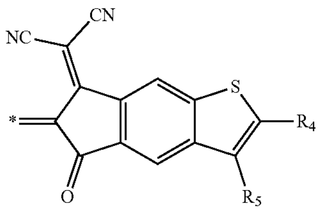

-continued

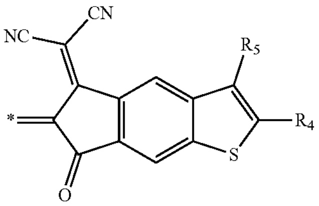

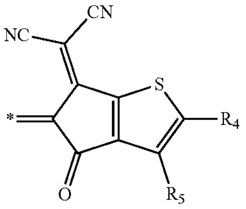

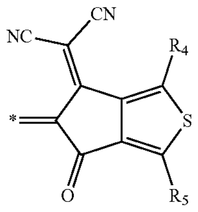

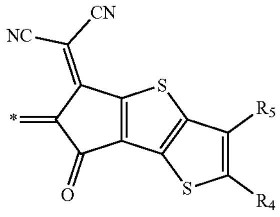

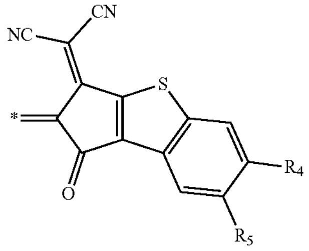

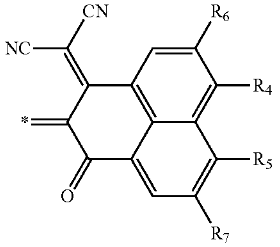

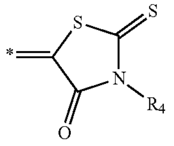

Wherein, $R_4$, $R_5$, $R_6$ and $R_7$ are independently selected from one of the following groups: C1~C30 alkyl, C1~C30 silyl, C1~C30 alkoxy, C1~C30 alkylthio, C1~C30 haloalkyl, halogen, hydrogen and cyano.

Wherein, the fullerene material structure is one of the following structures:

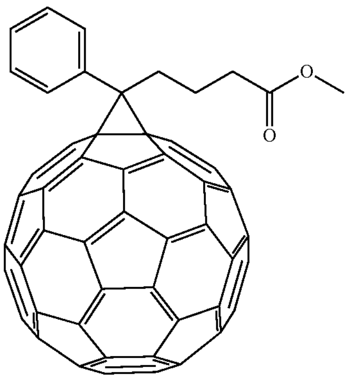

-continued

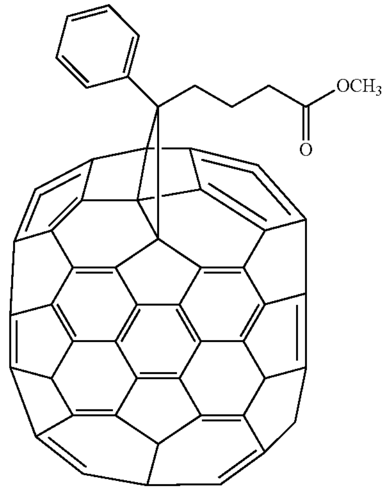

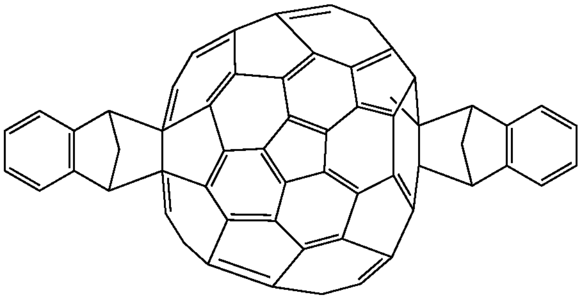

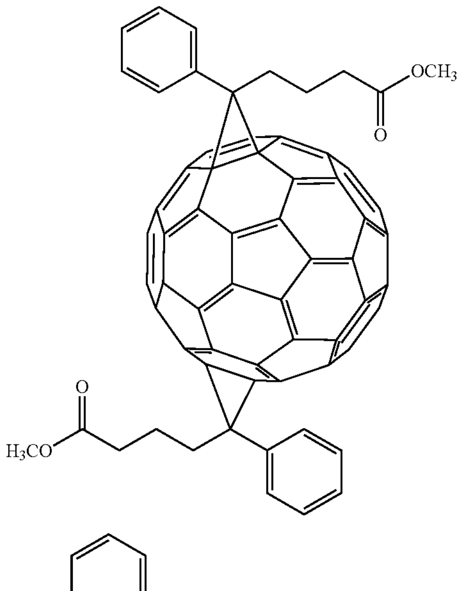

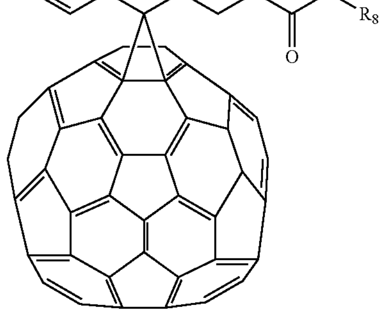

-continued

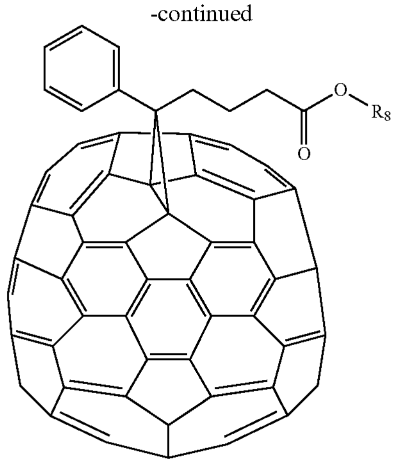

Wherein, $R_8$ is C2~C30 alkyl.

The third category of the present invention is to provide an organic optoelectronic device which comprises a first electrode, an active layer and a second electrode. The active layer comprises an active layer material which at least comprises an active layer material aforementioned. Wherein, the active layer is disposed between the first electrode and the second electrode, and at least one of the first electrode and the second electrode is a transparent or semi-transparent electrode.

Wherein, the organic optoelectronic device further comprises a first carrier transporting layer and a second carrier transporting layer. The first carrier transporting layer is disposed between the first electrode and the active layer. The active layer is disposed between the first carrier transporting layer and the second carrier transporting layer, and the second carrier transporting layer is disposed between the active layer and the second electrode.

Compared with the prior art, the block conjugated polymer material of the present invention is a block polymer composed of the polymer 1 and the polymer 2. Wherein, the polymer 1 is the p-type polymer with high energy gap, and the polymer 2 is the p-type polymer with low energy gap. The active layer material is formed by the block conjugated polymer material used as the p-type material, in which the polymer 2 with low energy gap can absorb light and perform exciton dissociation and carrier transporting with the n-type material in the active layer material. The polymer 1 with high energy gap can suppress the carrier recombination probability, thereby effectively reducing the leakage current of the organic optoelectronic device.

BRIEF DESCRIPTION OF THE APPENDED DRAWINGS

Some of the embodiments will be described in detail, with reference to the following figures, wherein like designations denote like members, wherein.

DETAILED DESCRIPTION OF THE INVENTION

Figure 1:
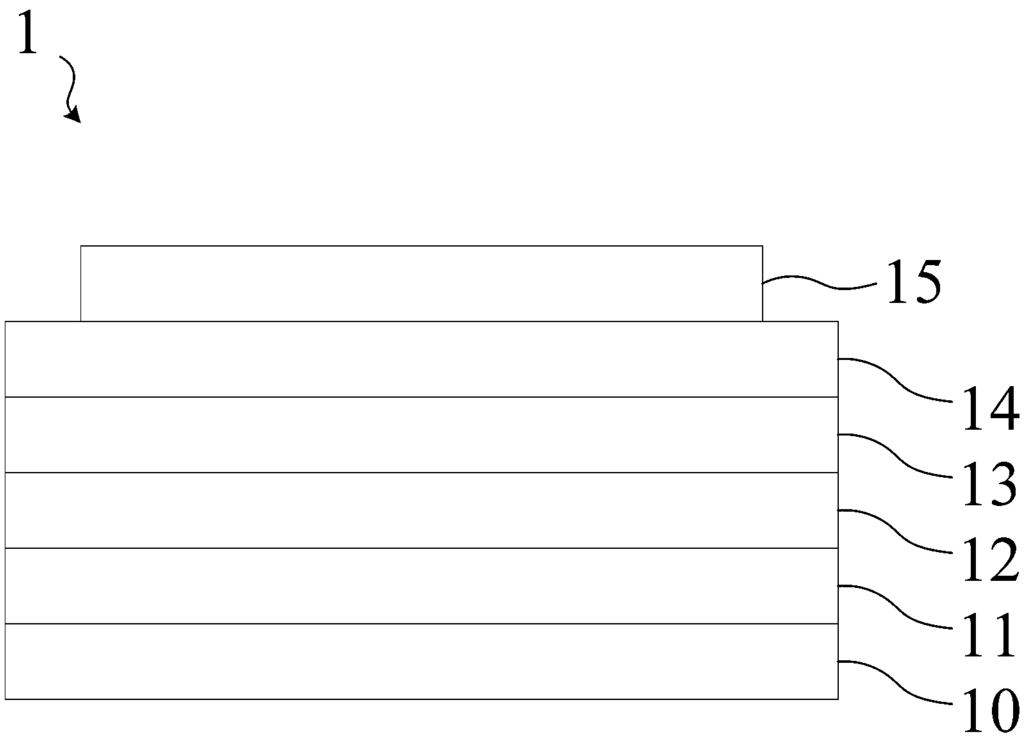
FIG. 1 shows a schematic structural diagram of one embodiment of an organic optoelectronic device of the present invention.

In order to make the advantages, spirit and features of the present invention easier and clearer, it will be detailed and discussed in the following with reference to the embodiments and the accompanying drawings. It is worth noting that the specific embodiments are merely representatives of the embodiments of the present invention, but it can be implemented in many different forms and is not limited to the embodiments described in this specification. Rather, these embodiments are provided so that this disclosure will be thorough and complete.

The terminology used in the various embodiments disclosed in the present invention is only for the purpose of describing specific embodiments, and is not intended to limit the various embodiments disclosed in the present invention. As used herein, singular forms also include plural forms unless the context clearly indicates otherwise. Unless otherwise defined, all terms (including technical and scientific terms) used in this specification have the same meanings as commonly understood by one of ordinary skill in the art to which the various embodiments disclosed herein belong. The above terms (such as those defined in commonly used dictionaries) will be interpreted as having the same meaning as the contextual meaning in the same technical field, and will not be interpreted as having an idealized or overly formal meaning, unless explicitly defined in the various embodiments disclosed herein.

In the description of this specification, the description of the reference terms "an embodiment", "a specific embodiment" and the like means that specific features, structures, materials, or characteristics described in connection with the embodiment are included in at least one embodiment of the present invention. In this specification, the schematic expressions of the above terms do not necessarily refer to the same embodiment. Furthermore, the particular features, structures, materials, or characteristics described may be combined in any suitable manner in any one or more embodiments.

Definition

As used herein, "donor" material refers to a semiconductor material, such as an organic semiconductor material, having holes as a primary current or charge carrier. In some embodiments, when a p-type semiconductor material is deposited on a substrate, it can provide the hole mobility greater than about $10^{-5}$ $cm^2/Vs$. In the case of field effect devices, current on/off ratio of the p-type semiconductor material exhibits more than about 10.

As used herein, "acceptor" material refers to the semiconductor material, such as the organic semiconductor material, having electrons as the primary current or the charge carrier. In some embodiments, when a n-type semiconductor material is deposited on a substrate, it can provide the electron mobility greater than about $10^{-5}$ $cm^2/Vs$. In the case of field effect devices, current on/off ratio of the n-type semiconductor material exhibits more than about 10.

The "electron-withdrawing group" refers to a group or an atom with a stronger electron-withdrawing ability than that of hydrogen, that is, it has an electron-withdrawing inductive effect. The "electron-donating group" refers to a group or an atom whose electron-donating ability is stronger than that of hydrogen, that is, it has an electron-donating induction effect. The inductive effect is the effect that the bonding electron cloud moves in a certain direction on the atomic bond due to the difference in polarity (electronegativity) of atoms or groups in the molecule. The electron cloud tends to move towards the more electronegative groups or atoms.

"★" or "*" in the structures listed herein represents the available bonding positions of this structure, but not limited thereto.

As used herein, "mobility" refers to a speed rate of the charge carrier moving through the material under the influence of an electric field. The charge carrier is the hole (positive charge) in the p-type semiconductor material and the electron (negative charge) in the n-type semiconductor material. This parameter depends on architecture of device and can be measured by field effect component or space charge limiting current.

As used herein, "polymer" refers to a very large molecule consisting of thousands of covalently bonded atoms. Polymer is composed of many repeating units, that is, monomers (composed of one or more atoms) bonded together by covalent bonds. From the point of view of physical properties, the number of repeating units should be so large that adding some more repeating units will not significantly change the physical properties. Polymer is further divided into copolymer and homopolymer. The homopolymer is polymerized from only one type of monomer. The copolymer is polymer formed by the polymerization of two or more monomers. The copolymer is divided into alternating copolymer, random copolymer, block copolymer and graft copolymer. In the alternating copolymer, the two structural units A and B are strictly alternating, and the mole fraction of both in the copolymer is about 50%. In the random copolymer, the two structural units A and B appear randomly, and the number of continuous units of A and B is not many, usually a few to a dozen. Statistically, the content of a structural unit of a random polymer in the polymer chain is equal to its content in the entire polymer. The block copolymer is composed of longer chain segments with only structural unit A and longer chain segments with only structural unit B, wherein each chain segment can reach tens to thousands of structural units. Gradient polymers have recently emerged with the development of controlled free radical polymerization. The composition of the structural units of A and B gradually changes with the extension of the main chain, unlike the random copolymer and the alternating copolymer, which are basically unchanged, and do not show sudden changes like the graft copolymer. The graft copolymer is a branched polymer in structure, which not only has a main chain, but also has longer branch chains, and the main chain and branch chains are composed of different structural units. The main chain is all structural unit A, and the branch chains are all structural unit B. Sometimes, the main chain and the branch chains of the graft polymer may be both copolymers, for example, the main chain is a random copolymer of A and B, the branch chains are an alternating copolymer of A and B, and the whole is still a graft copolymer.

The compound as used herein is considered as "environmentally stable" or "stabilized under ambient conditions"

and refers to that when a transistor incorporates the compound as semiconductor material, the carrier mobility is shown to remain as its initial value after the compound has been exposed to ambient conditions such as air, ambient temperature and humidity for a period of time. For example, a compound may be considered to be environmentally stable if the change in carrier mobility of a transistor incorporating the compound is less than 20% or 10% of the initial value after being exposed to the environmental conditions including air, humidity and temperature for 3, 5 or 10 days.

As used herein, "component" (such as a thin film layer) may be considered "photoactive" if it contains one or more compounds that absorb photons to generate excitons for generating photocurrent.

As used herein, "solution proceeding" refers to a process in which a compound (e.g., a polymer), material, or composition can be used in a solution state, such as spin coating, printing (e.g., inkjet printing, gravure printing, and lithography printing), spray coating, slit coating, drop casting, dip coating, and blade coating.

As used herein, "annealing" refers to a post-deposition thermal treatment to a semi-crystalline polymer film for certain duration in the environment or under decompressed or pressurized environment. "Annealing temperature" refers to the temperature at which the polymer film or the mixed film of the polymer and other molecules can perform small-scale molecular movement and rearrangement during the annealing process. Without limitation by any particular theory, it is believed that annealing can lead to an increase in crystallinity in the polymer film and enhance the carrier mobility of the polymer film or a mixed film formed by the polymer and other molecules, and the molecules are arranged alternately to achieve the effect of independent transporting paths of effective electrons and holes.

Dark current ($J_d$) as used herein also known as no-illumination current, refers to the current flows in an opto-electronic device in the absence of light irradiation.

The responsibility (R) and the detectivity (D) as used herein are based on measuring the dark current and external quantum efficiency (EQE) of the organic photodetector, and are calculated by the following formula:

$$R(\lambda) = EQE\frac{\lambda q}{hc},\quad D = \frac{R}{\sqrt{2qJ_d}}$$

Wherein, λ is the wavelength, q is the elementary charge ($1.602\times10^{-19}$ Coulombs), h is Planck's constant ($6.626\times10^{-34}$ $m^2$ kg/s), c is the speed of light ($3\times10^8$ m/sec), and $J_d$ is the dark current.

In an embodiment, a block conjugated polymer material of the present invention comprises a structure of formula 1:

(formula I)

$$-\left[\text{polymer 1}\right]_o\left[\text{polymer 2}\right]_p-$$

Wherein, the polymer 1 is a p-type polymer with high energy gap, and the polymer 1 comprises a first electron donor and a first electron acceptor arranged alternately. The polymer 2 is a p-type polymer with low energy gap, and the polymer 2 comprises a second electron donor and a second electron acceptor arranged alternately. Wherein, o and p>0.

In practice, the polymer 1 is regarded as a block A, and the polymer 2 is regarded as a block B. The structure of the block conjugated polymer material can be further structured as follows:

(formula III)

$$-\left[\text{polymer 1}\right]_o\left[\text{polymer 2}\right]_p\left[\text{polymer 1}\right]_q-$$

(formula IV)

$$-\left[\text{polymer 2}\right]_o\left[\text{polymer 1}\right]_p\left[\text{polymer 2}\right]_q-$$

(formula V)

$$-\left[\text{polymer 1}\right]_o\left[\text{polymer 2}\right]_p\left[\text{polymer 3}\right]_q-$$

Formula III is an ABA block type. Formula IV is a BAB block type. Formula V is an ABC block type in which a functional polymer 3 is added as a block C. Wherein, o, p, and q>0 in the above structure. Among them, the polymer 3 can have functions such as adjusting solubility and material phase separation. It should be understood that the above-listed embodiments are only intended to allow those skilled in the art to understand the structure and composition of the present invention more clearly, and are not limited thereto.

In practice, the wavelength of the maximum absorption of the film of the polymer 1 is ≤800 nm, and the wavelength of the maximum absorption of the film of the polymer 2 is >800 nm.

In this embodiment, the polymer 1 is one of the following structures P1~P22:

P1

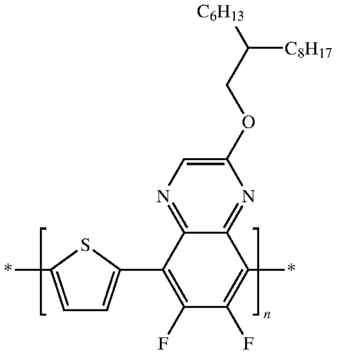

P2

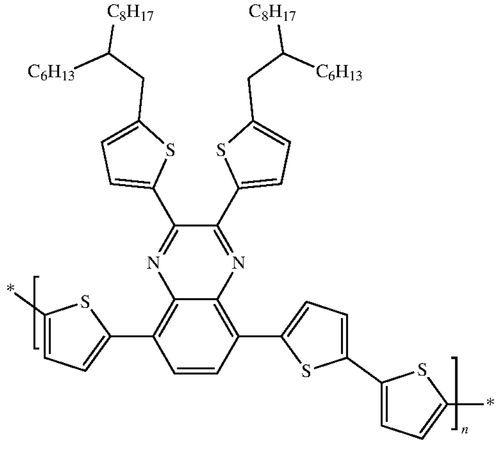

-continued
P3
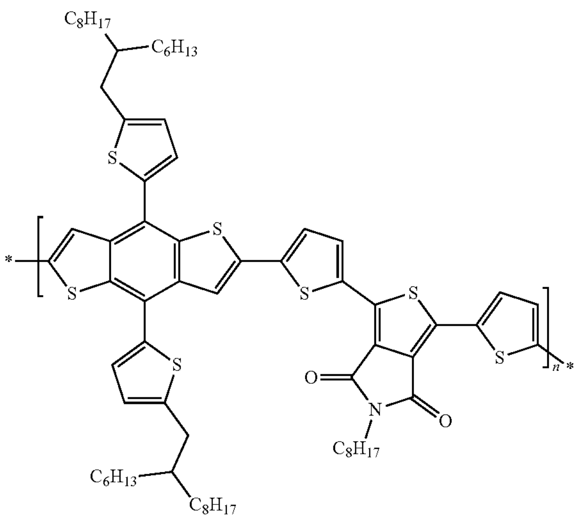
P4
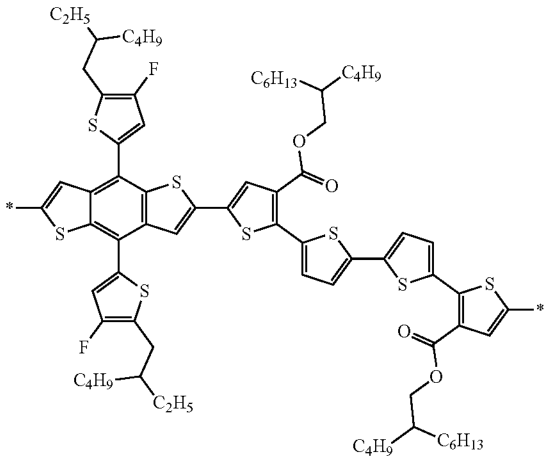
P5
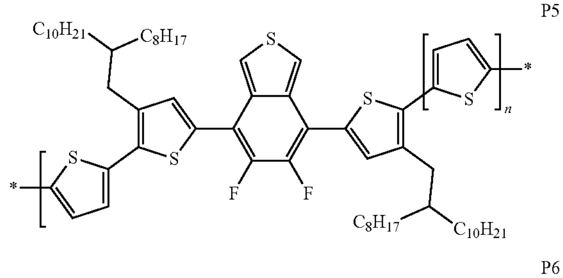
P6
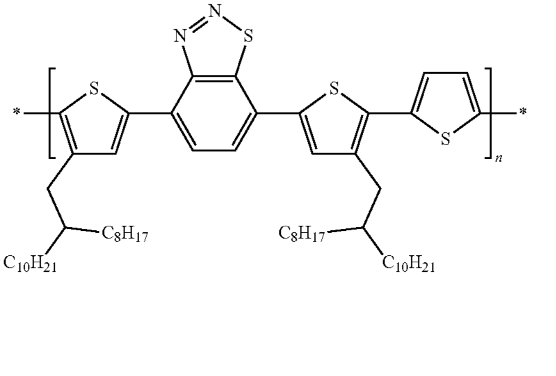
-continued
P7
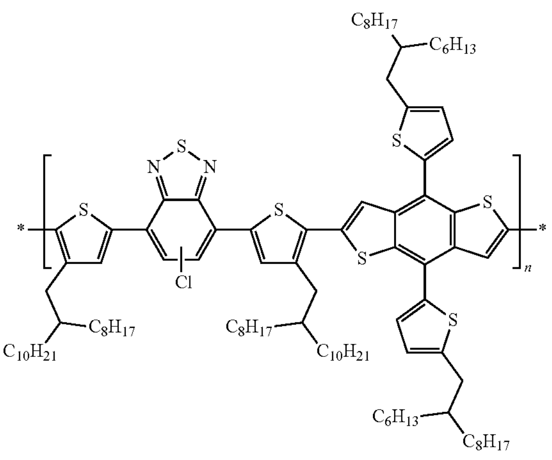
P8
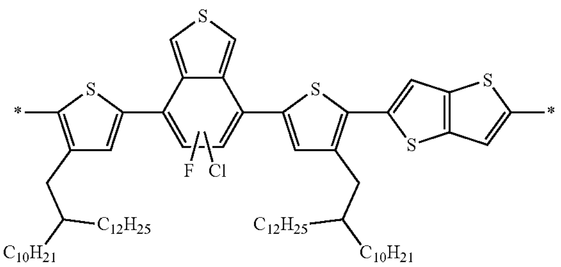
P9
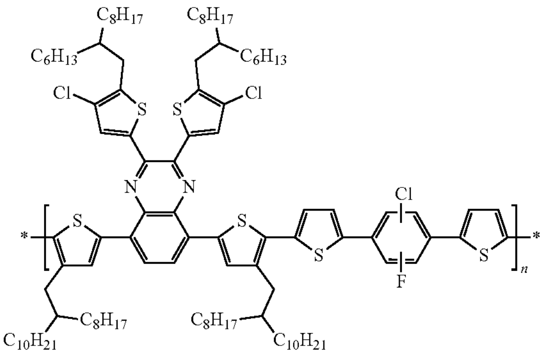
P10
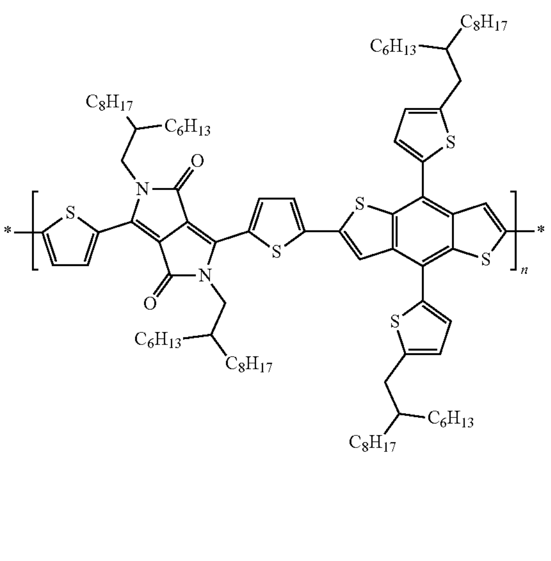

P11
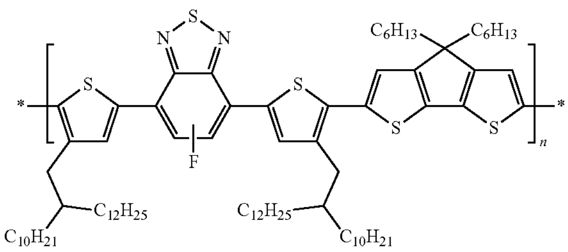
P12
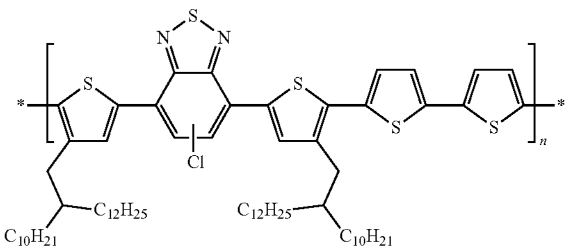
P13
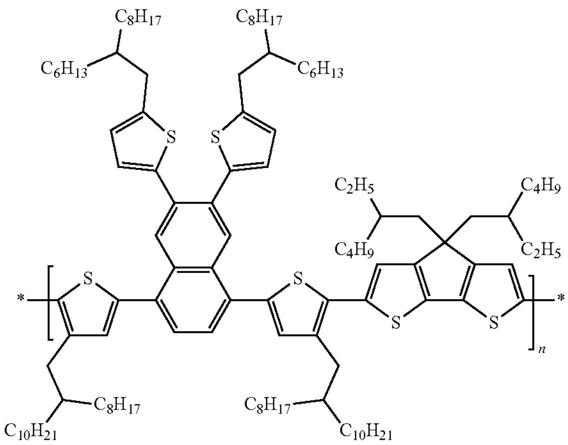
P14
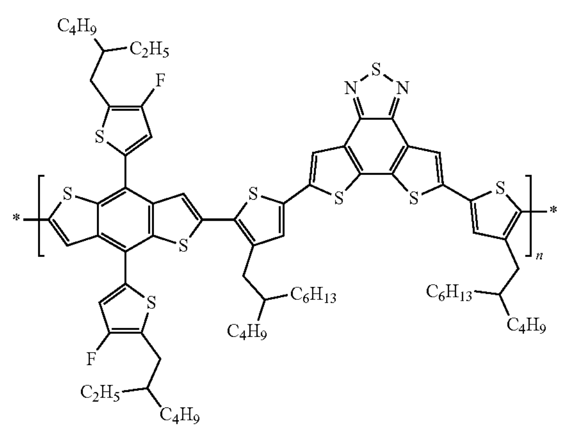
P15
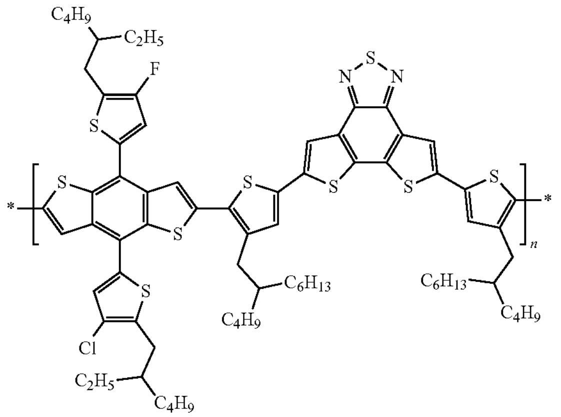
P16
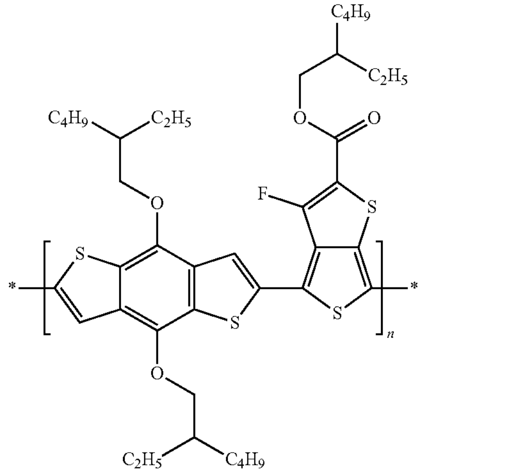
P17
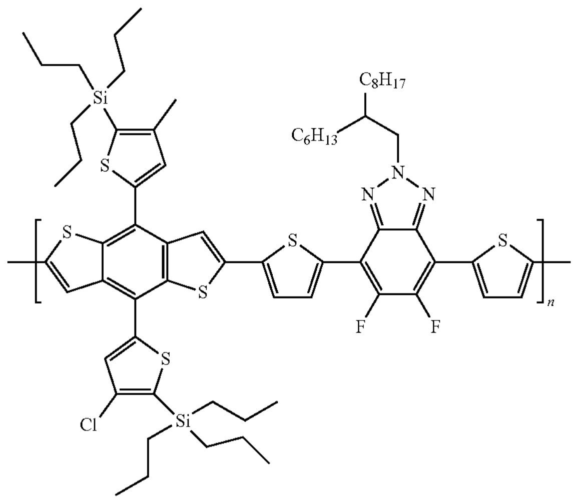

-continued
P18
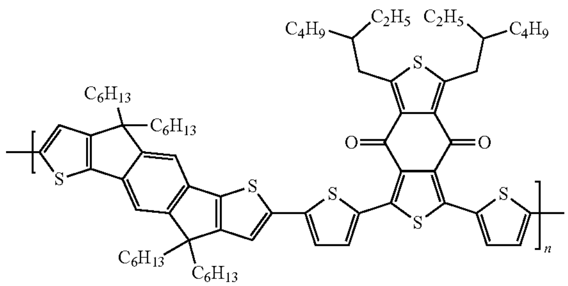
P19
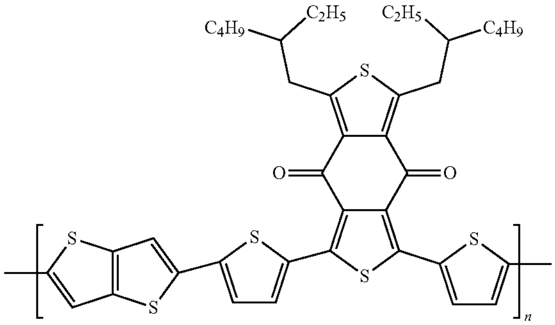
P20
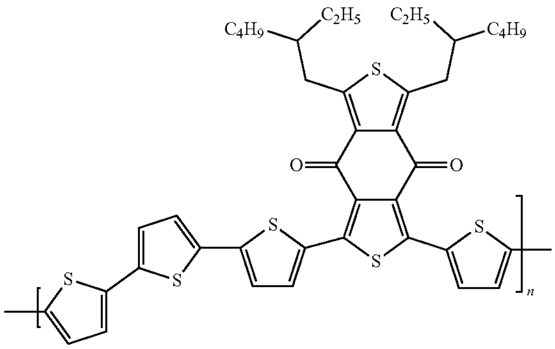
P21
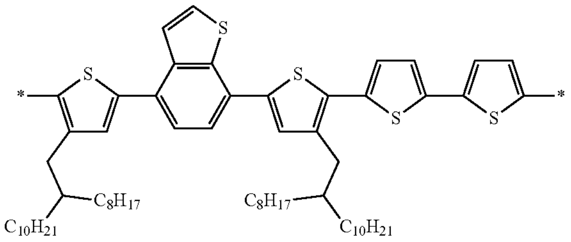
-continued
P22
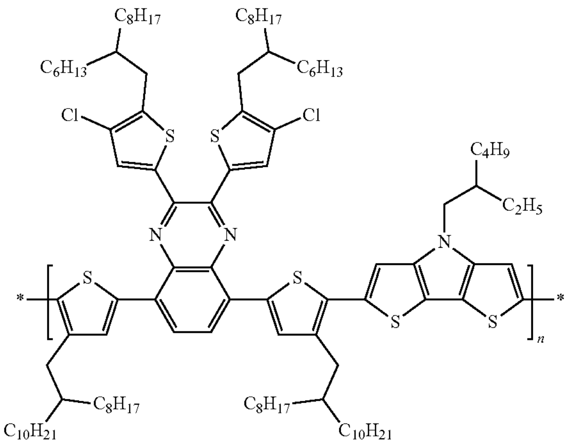
It should be understood that the above-listed embodiments are only intended to allow those skilled in the art to understand the structure and composition of the present invention more clearly, and are not limited thereto.
In this embodiment, the polymer 2 is one of the following structures P23~P35:
P23
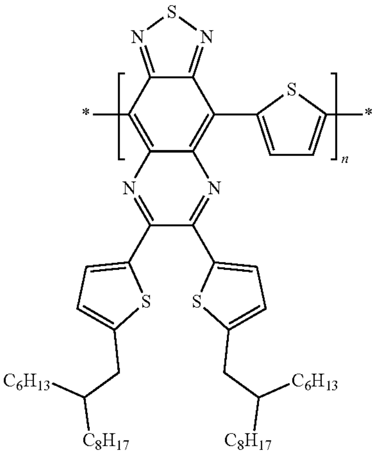
P24
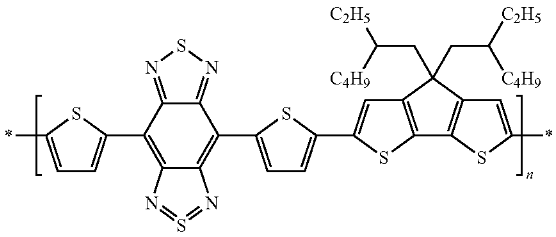

-continued
P25
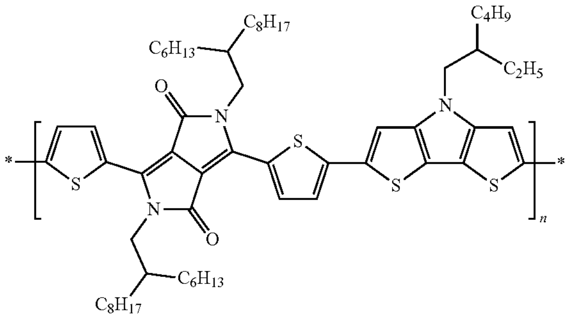
P26
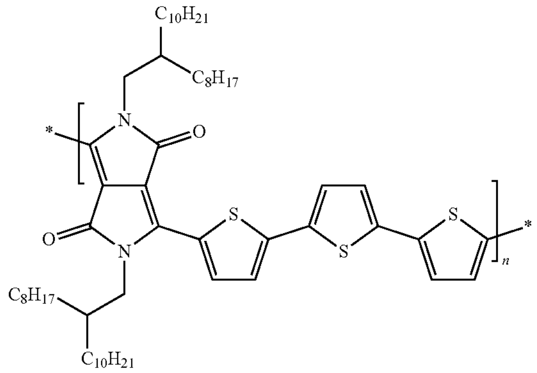
P27
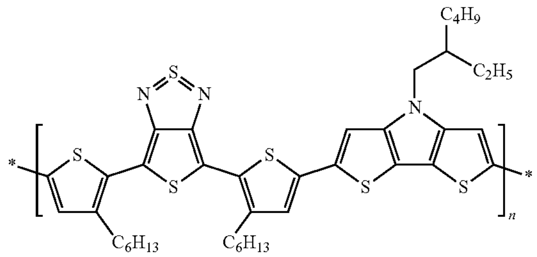
P28
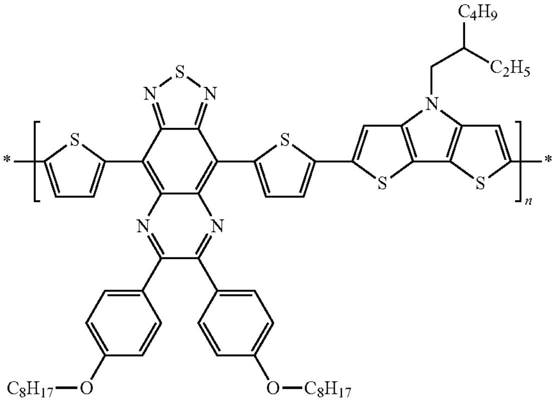
-continued
P29
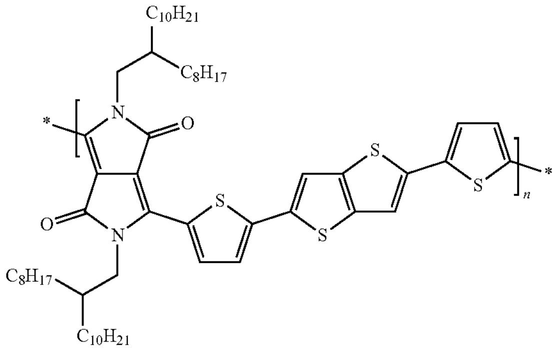
P30
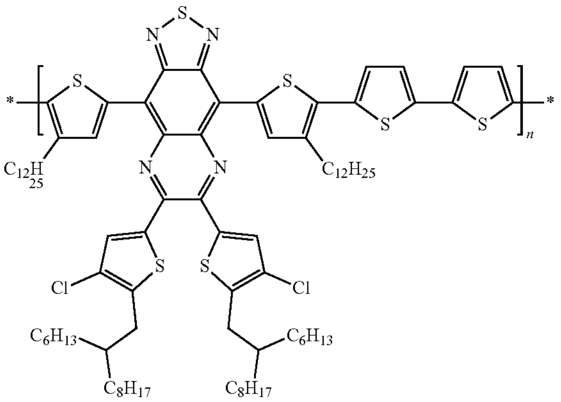
P31
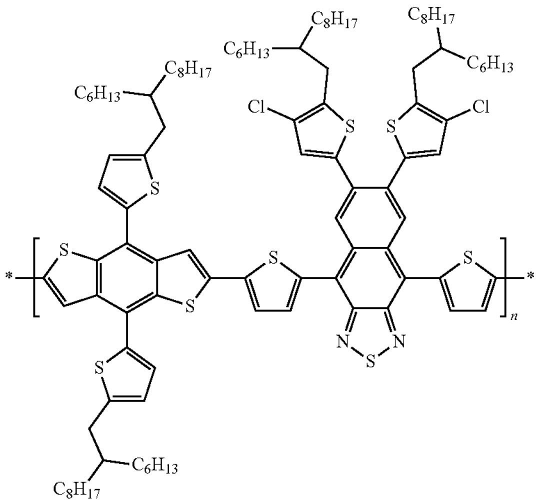

-continued

P32

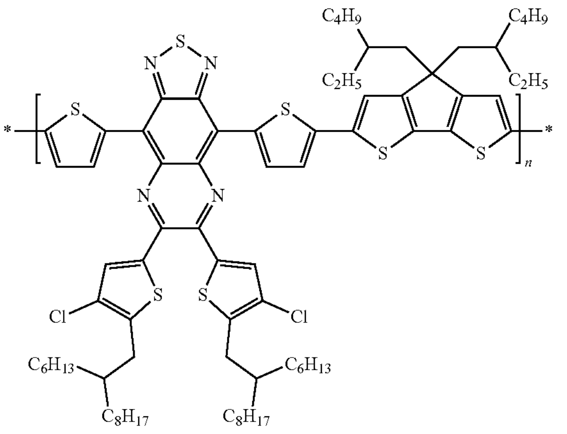

P33

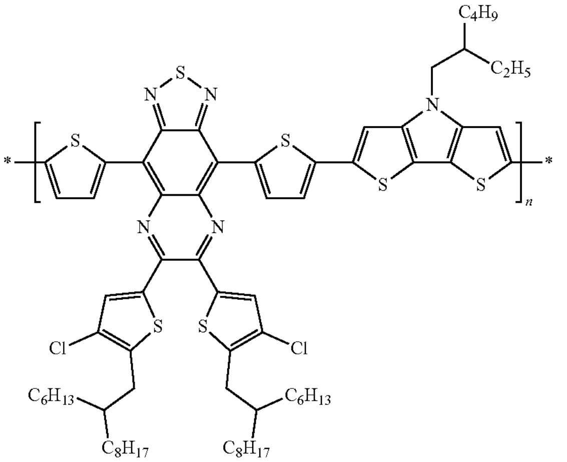

-continued

P34

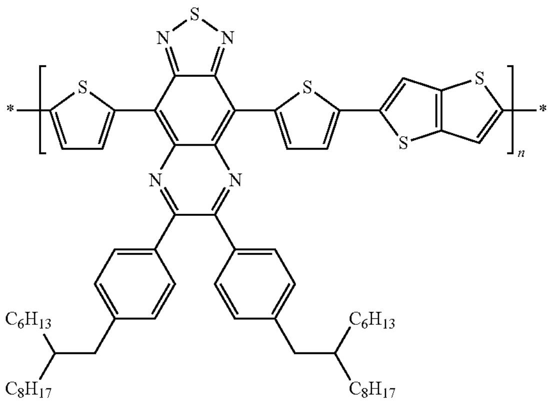

P35

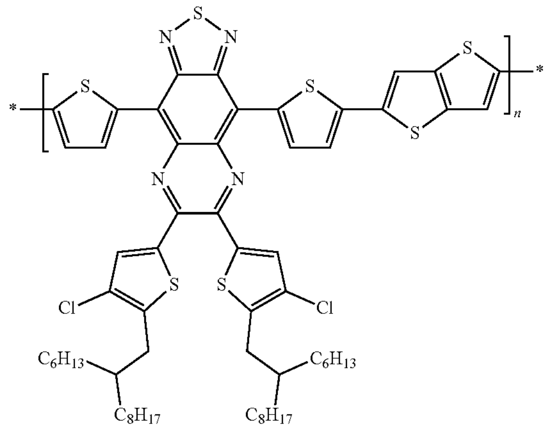

It should be understood that the above-listed embodiments are only intended to allow those skilled in the art to understand the structure and composition of the present invention more clearly, and are not limited thereto. Wherein, since both the polymer 1 and the \polymer 2 are polymers, and n is a positive integer. In practice, n can be independently selected from any integer in the range of 5~200,000, preferably in the range of 5~10,000, and most preferably in the range of 5~2,000.

In practice, the block conjugated polymer material can comprise the following structures:

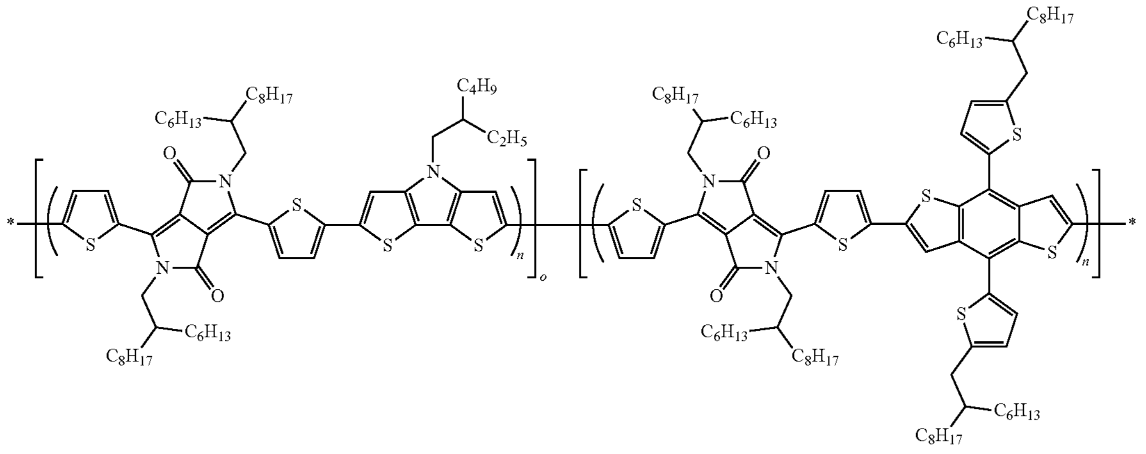

-continued
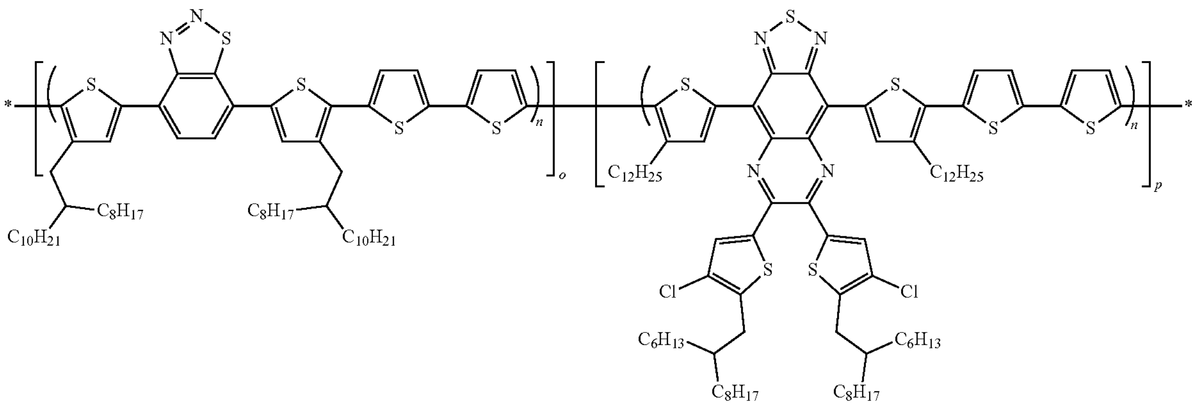
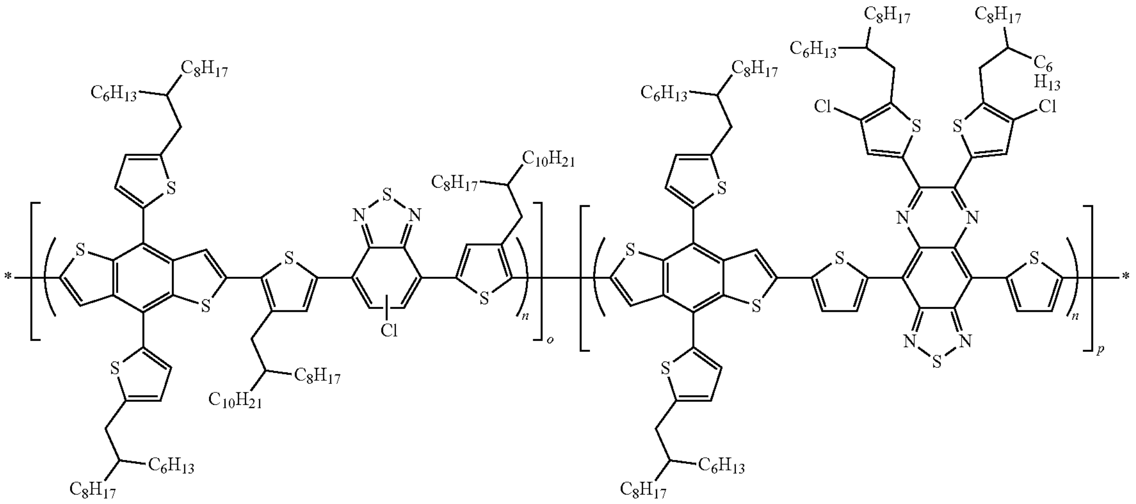
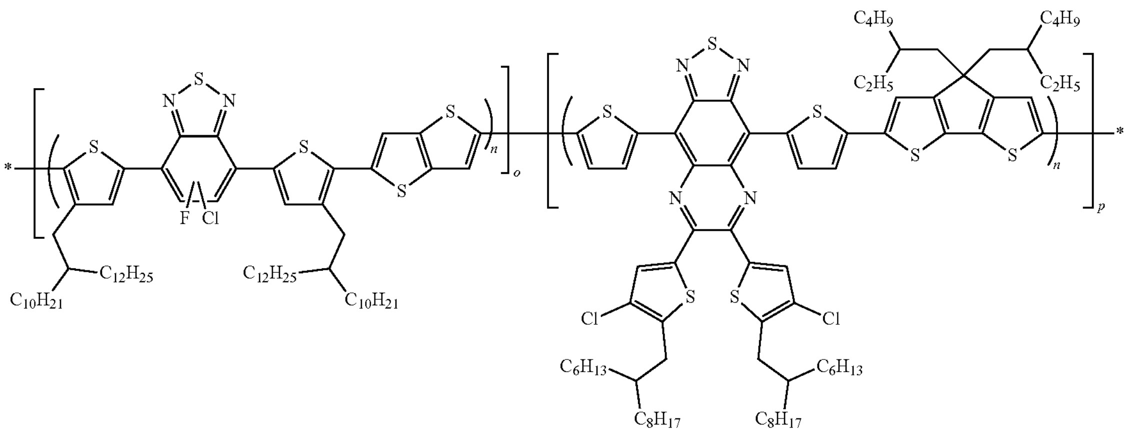

-continued
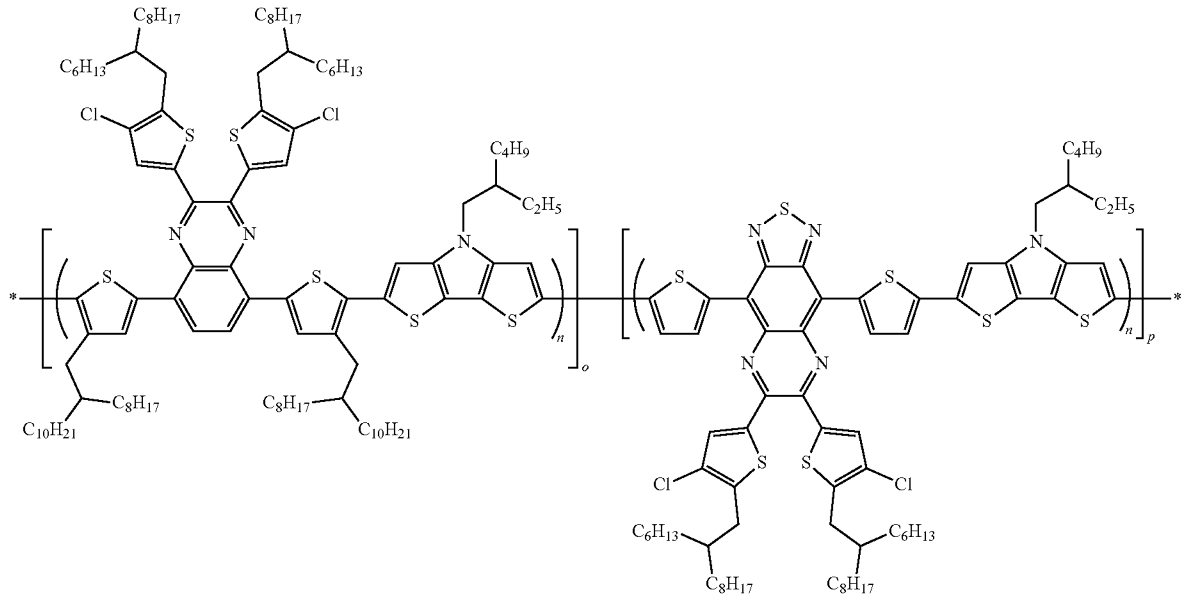
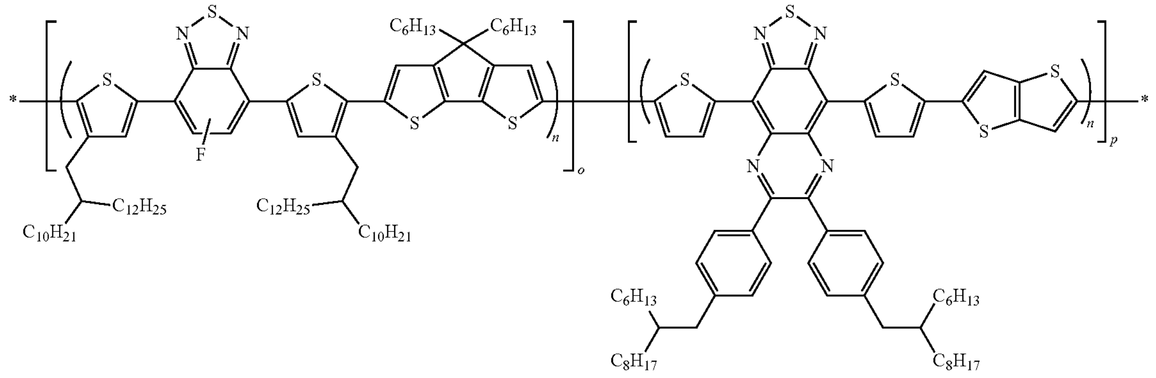
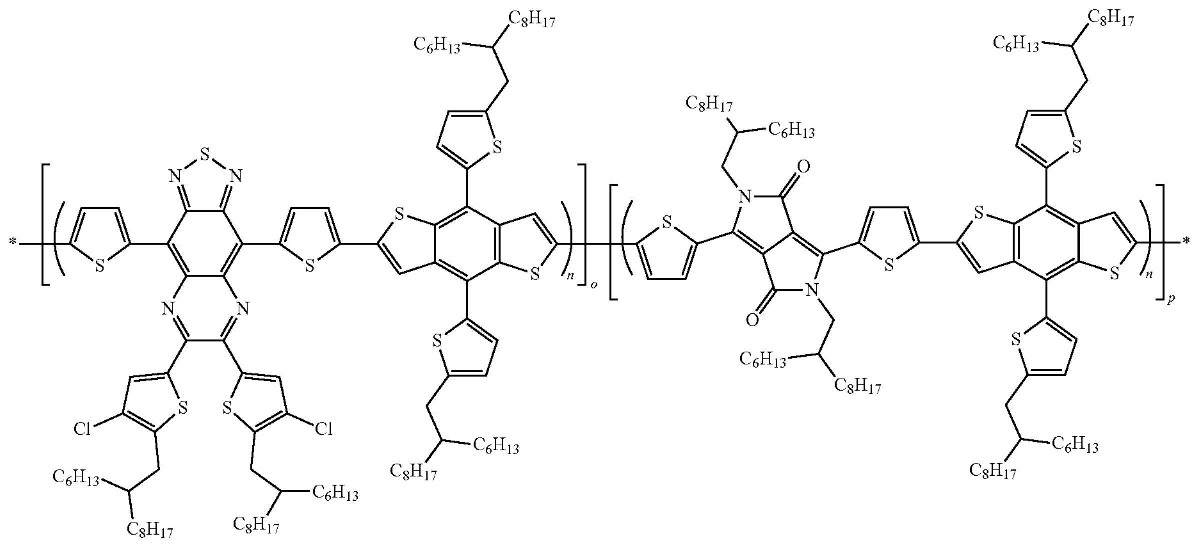

-continued

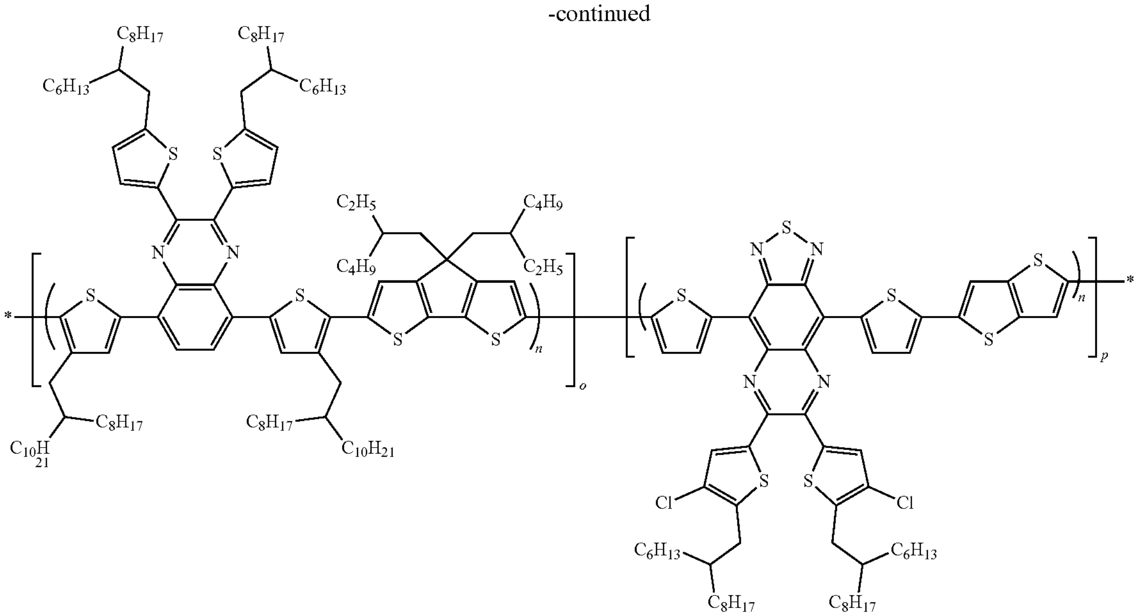

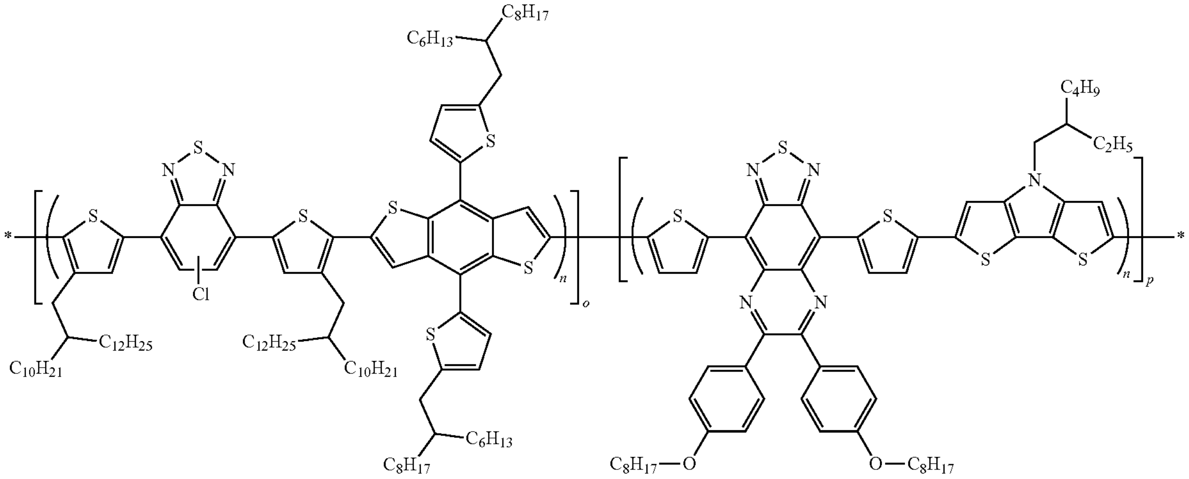

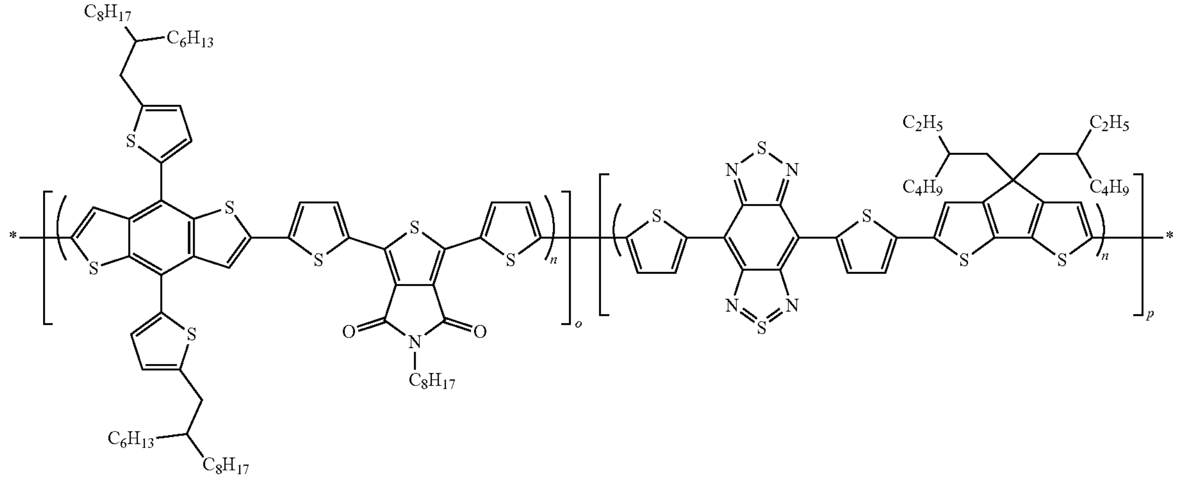

It should be understood that the above-listed embodiments are only intended to allow those skilled in the art to understand the structure and composition of the present invention more clearly, and are not limited thereto. In addition, in the process of polymer synthesis, end-capping will be carried out in part of the actual mass production to make the final modification to the polymer. The advantages of end-capping reactions are as follows: (1) avoid the continuous polymerization of polymers in the subsequent heating process; (2) effectively reduce the content of metal ions to avoid affecting the stability of components; and (3) remove active sites to avoid unexpected defects. Therefore, it needs to be understood that the polymer after the end-capping reaction will be end-capped with different substituents at the end of the structure and retain the characteristics of the original polymer. This is a commonly used method in the art and is not limited to different end-capping structures.

In an embodiment, an active layer material of the present invention comprises an n-type material and a p-type material. The p-type material comprises the block conjugated polymer material aforementioned. The n-type material comprises a non-fullerene material structure or a fullerene material structure with an electron-withdrawing group, and the energy gap of the n-type material is less than 2.5.

Wherein, the structure of the non-fullerene material comprises a structure of formula II: Ar2-Ar1-Ar2 (formula II). Ar1 comprises a conjugated structure with 5 to 40 carbon, and comprises more than one fused ring or fused heterocyclic ring. Ar2 comprises a monocyclic structure with ketone or a fused ring structure with ketone.

In practice, Ar1 is one of the following structures:

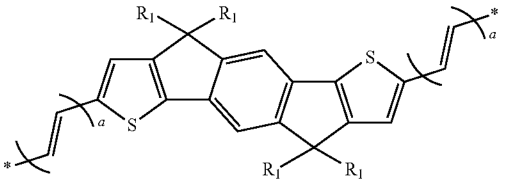

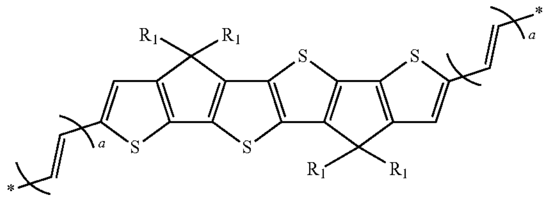

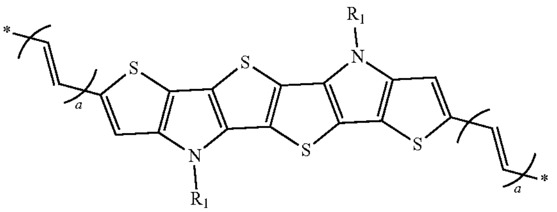

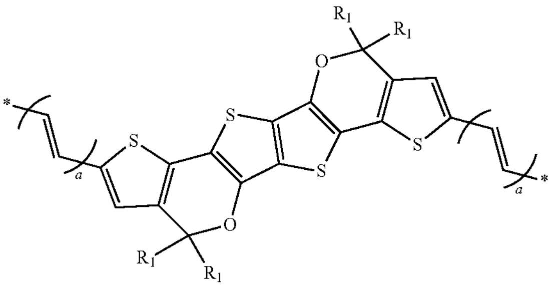

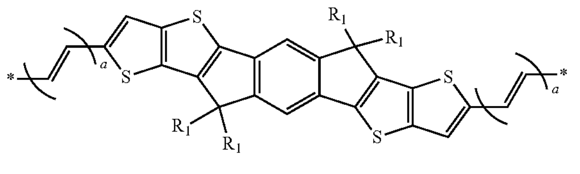

-continued

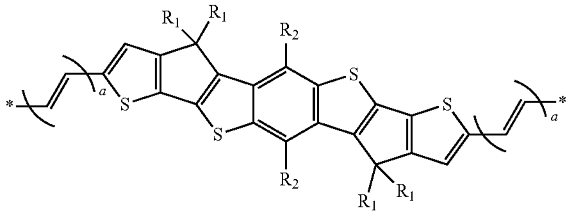

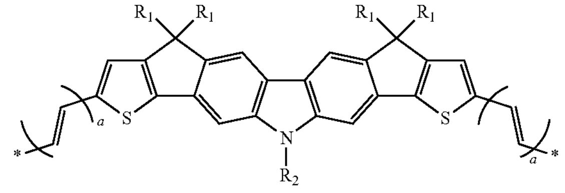

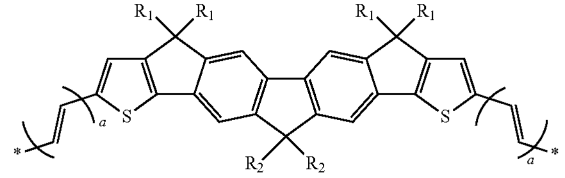

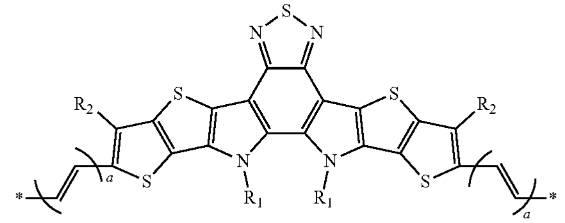

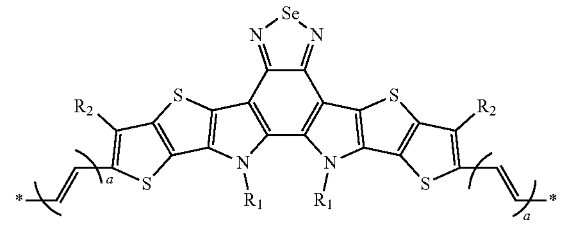

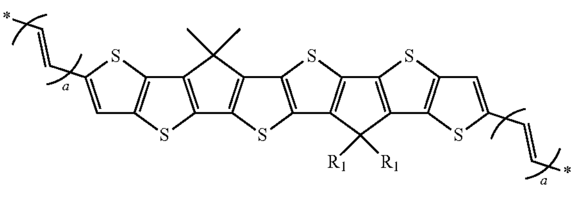

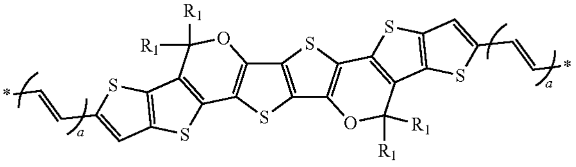

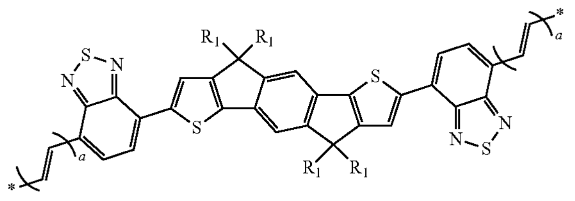

-continued

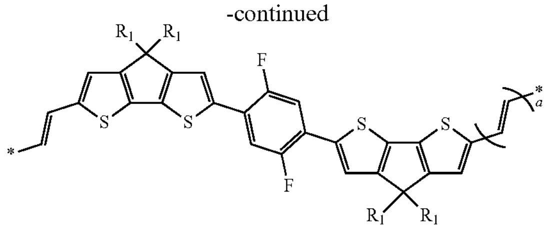

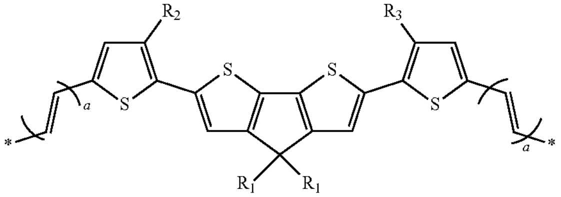

Wherein, a=0 or 1. $R_1$, $R_2$ and $R_3$ are those independently selected from the following group: C1~C30 alkyl, C1~C30 silyl, C1~C30 alkoxy, C1~C30 alkylthio, C1~C30 haloalkyl, C2~C30 ester group, C1~C30 alkylaryl, C1~C30 alkylheteroaryl, C1~C30 silylaryl, C1~C30 silylheteroaryl, C1~C30 alkoxyaryl, C1~C30 alkoxyheteroaryl, C1~C30 alkylthioaryl, C1~C30 alkylthioheteroaryl, C1~C30 haloalkylaryl, C1~C30 haloalkylheteroaryl, C1~C30 ester aryl or C1~C30 ester heteroaryl.

In detail, the non-fullerene material may comprise the following embodiments N1~N35:

N1

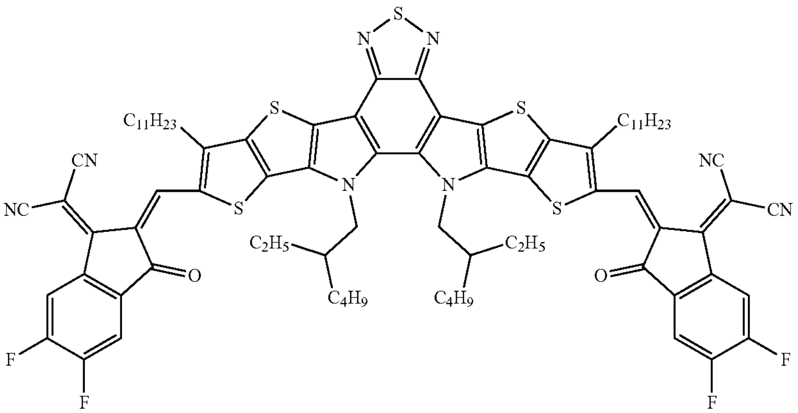

N2

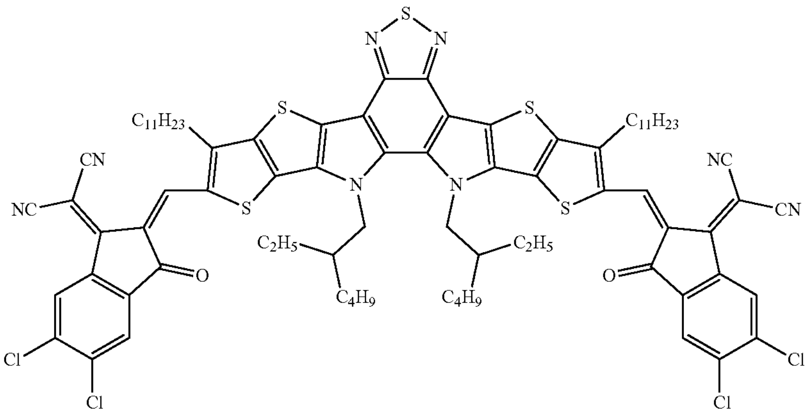

-continued
N3
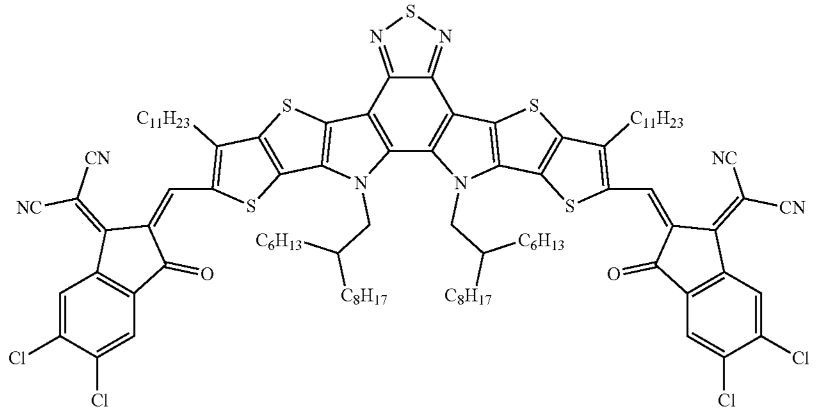
N4
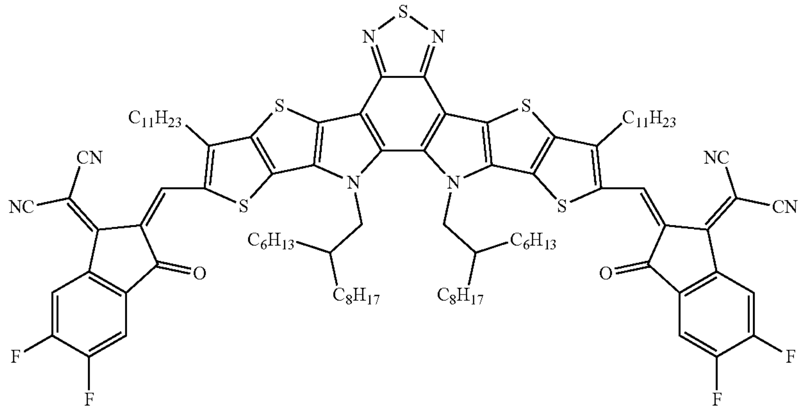
N5
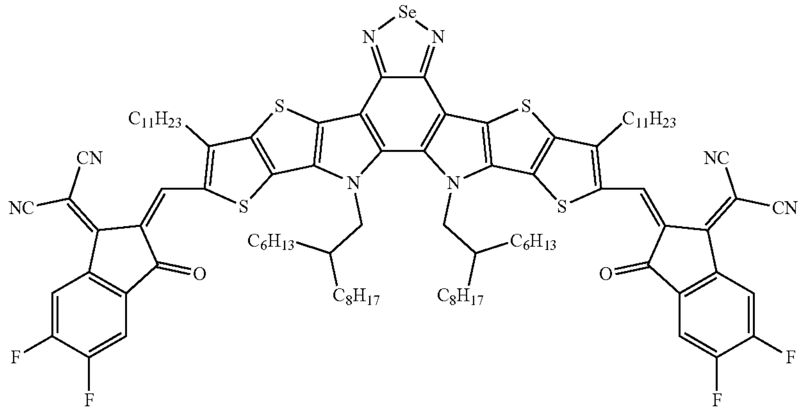
N6
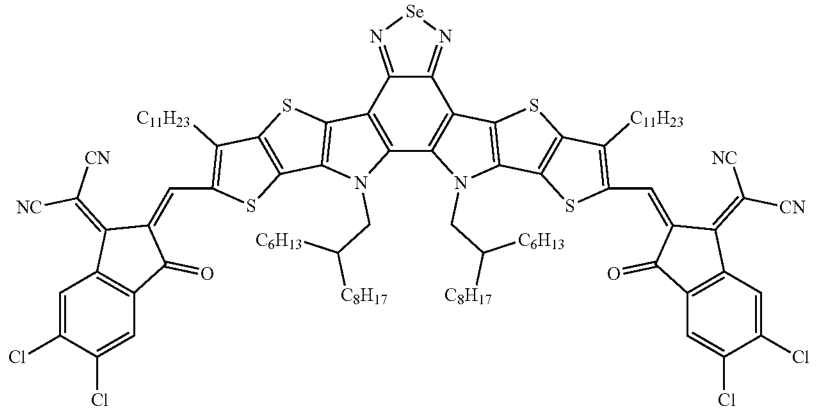

-continued
N7
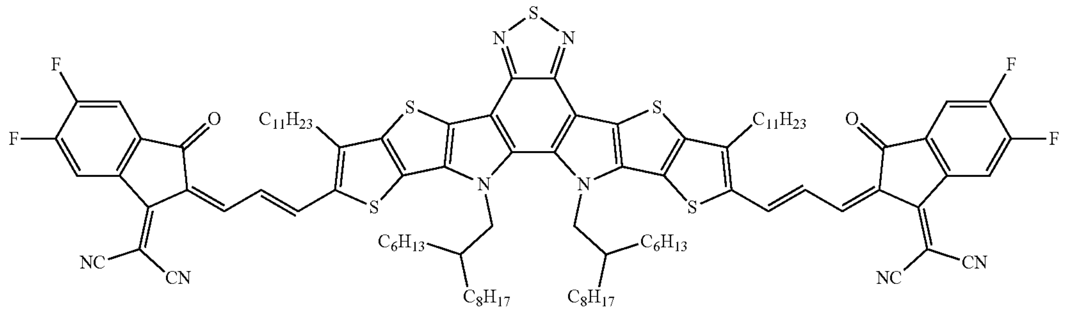
N8
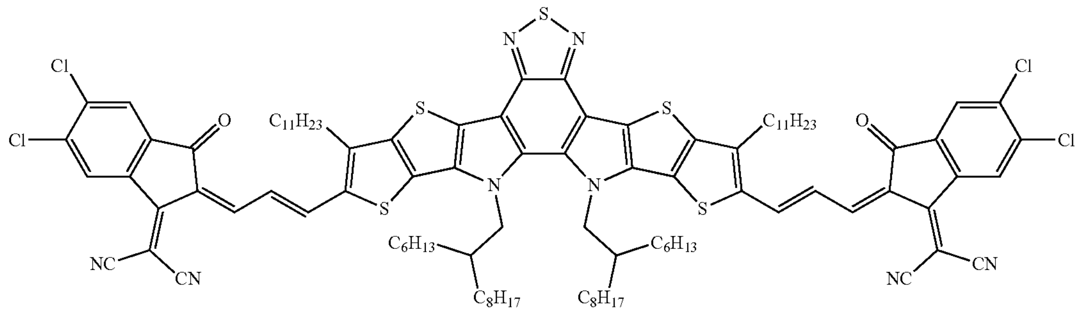
N9
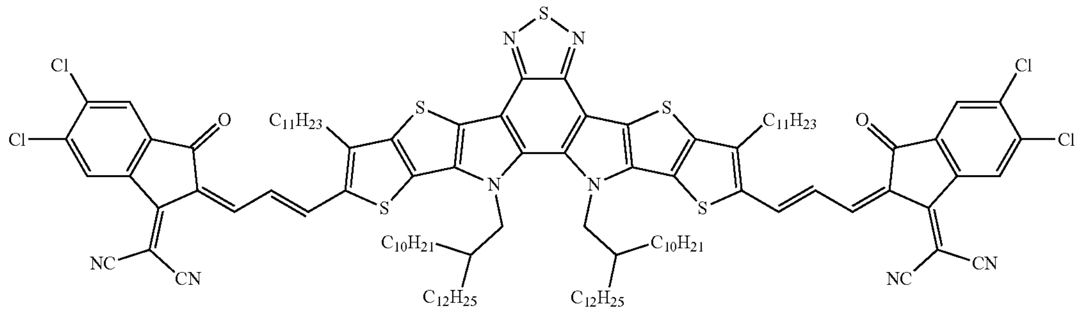
N10
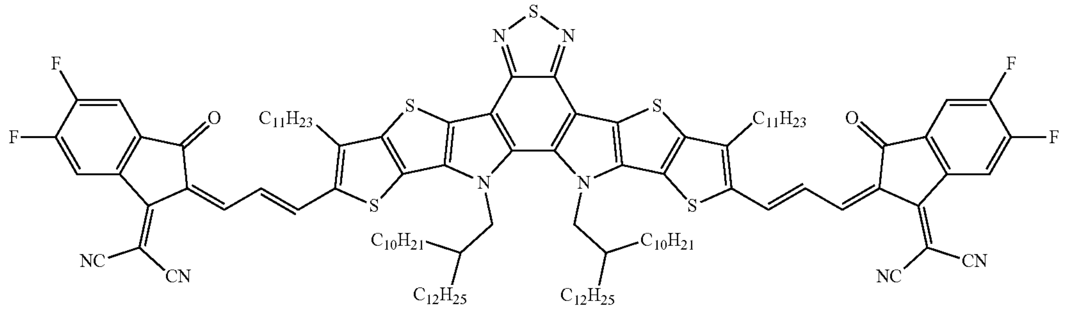

-continued
N11
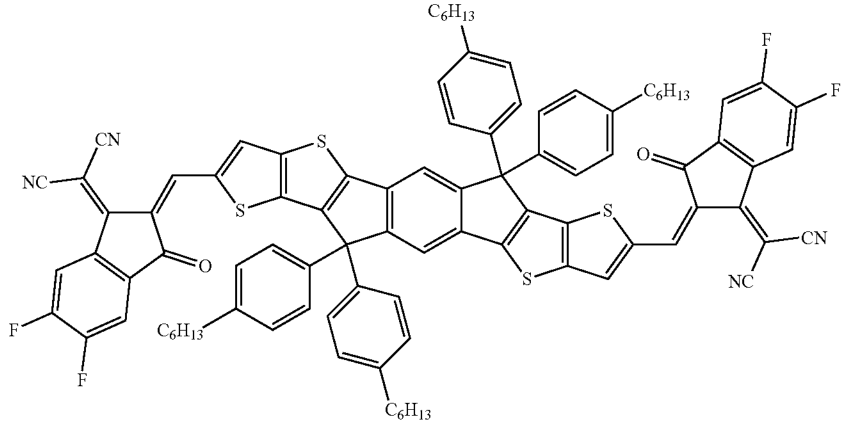
N12
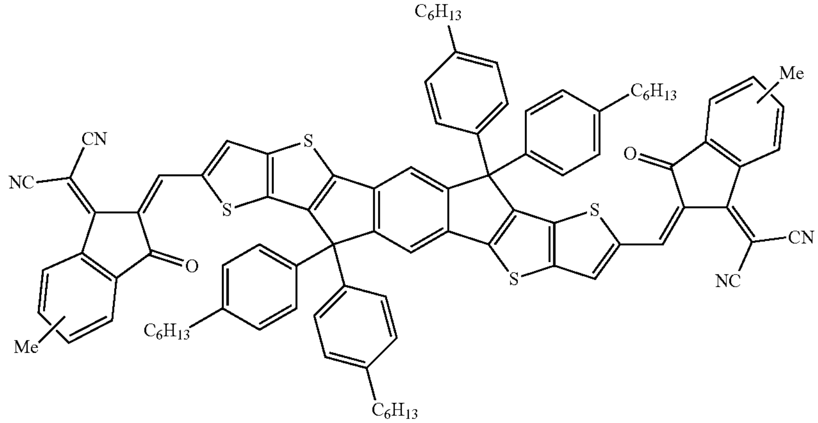
N13
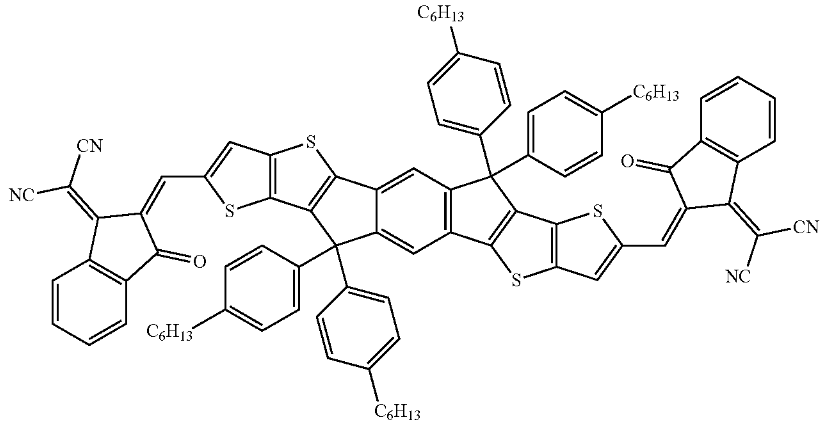

-continued
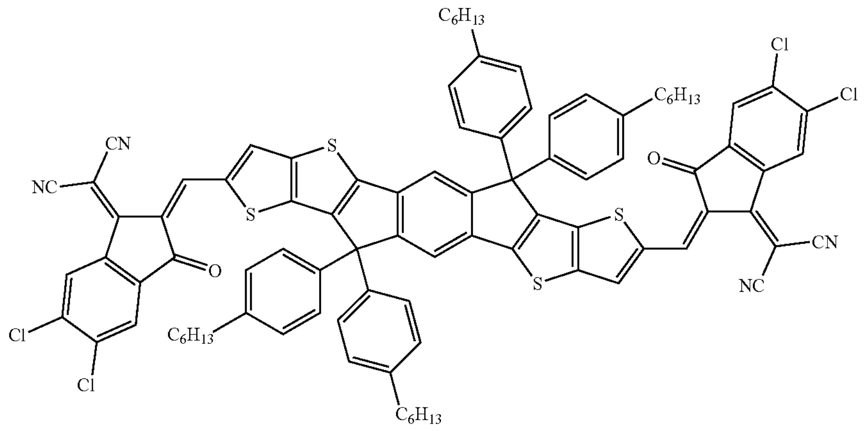
N14
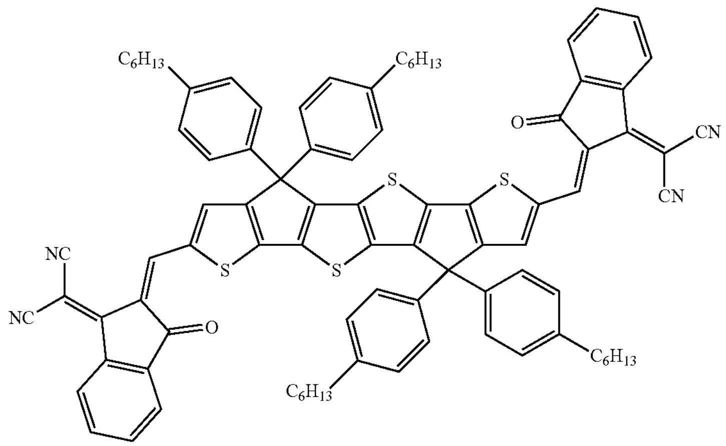
N15
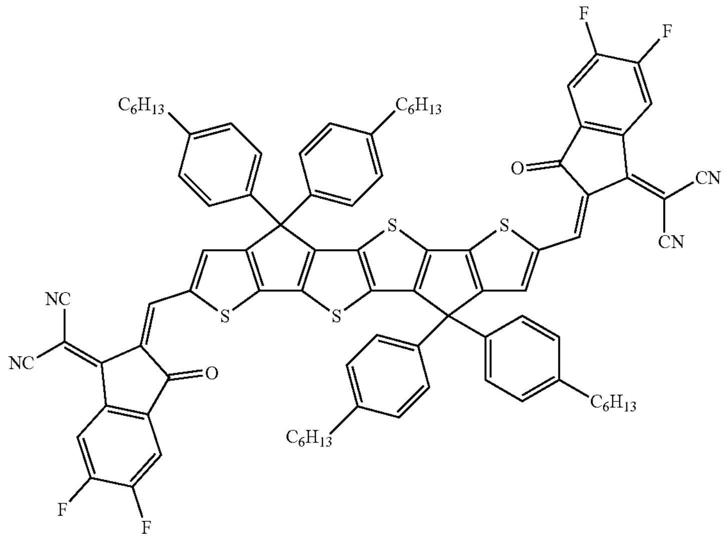
N16

-continued
N17
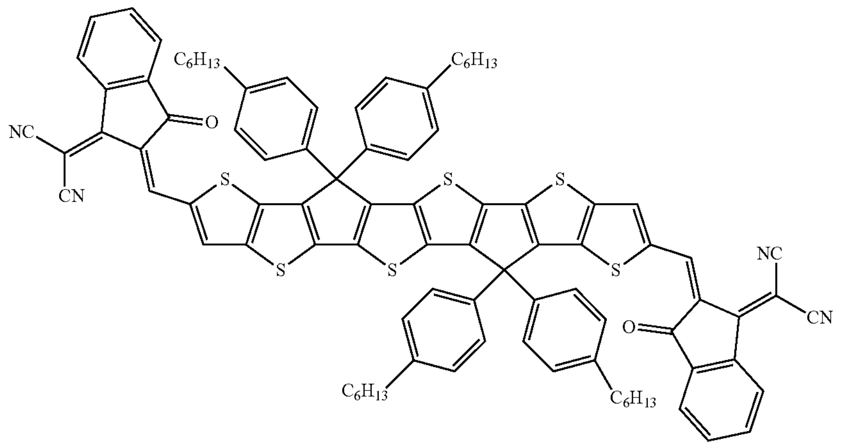
N18
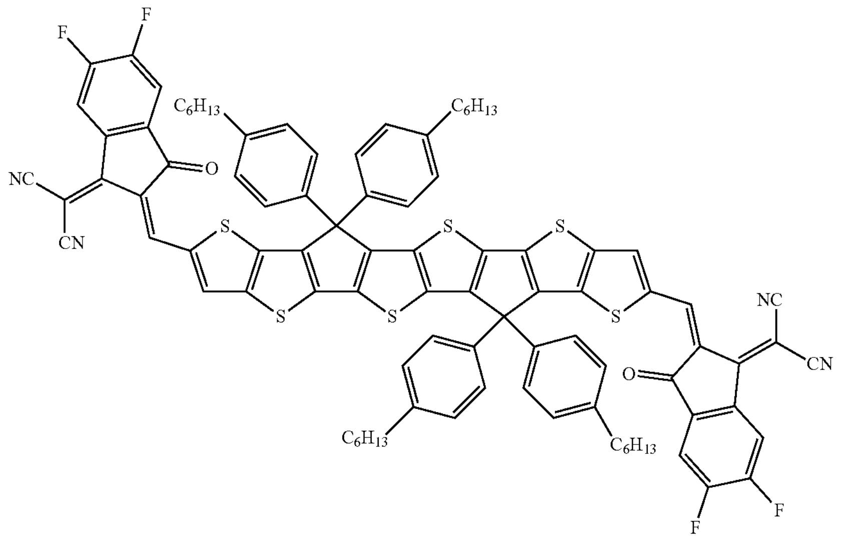
N19
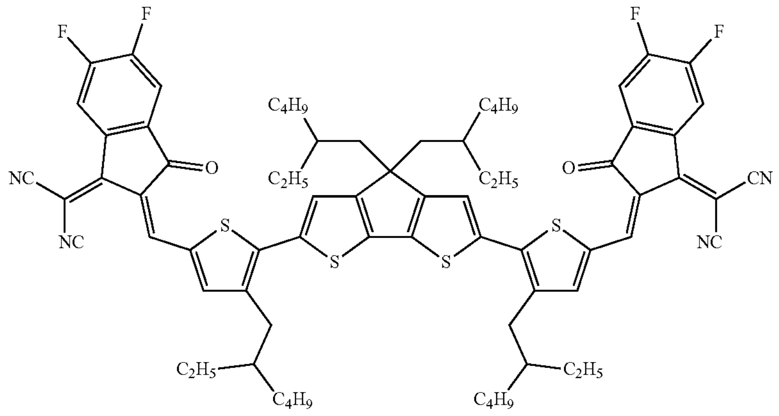

-continued
N20
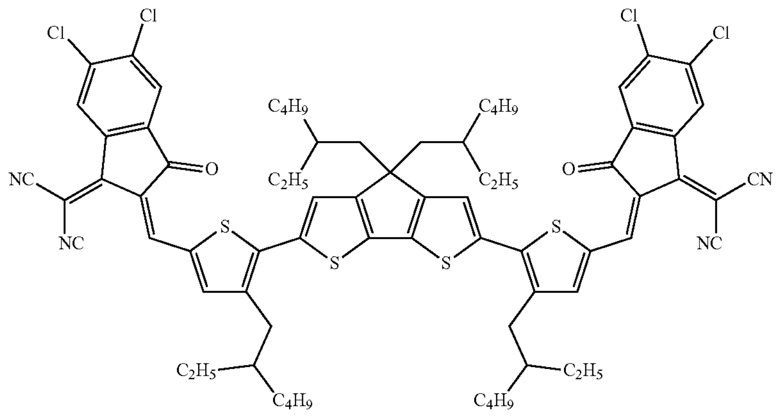
N21
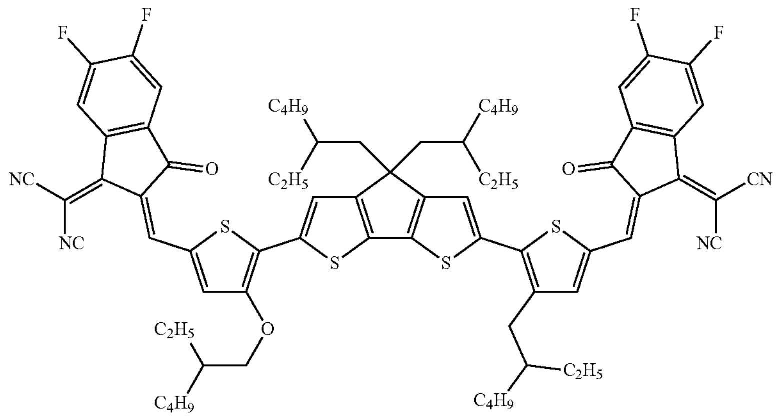
N22
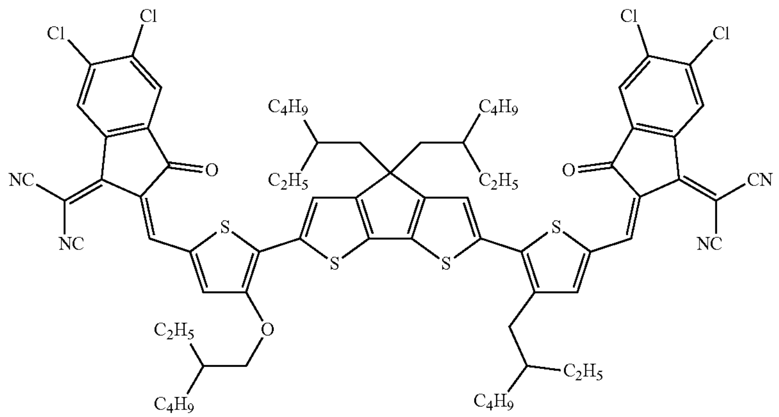

-continued
N23
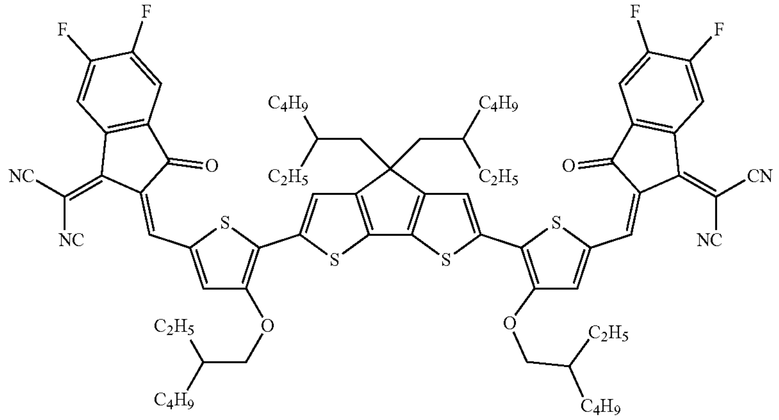
N24
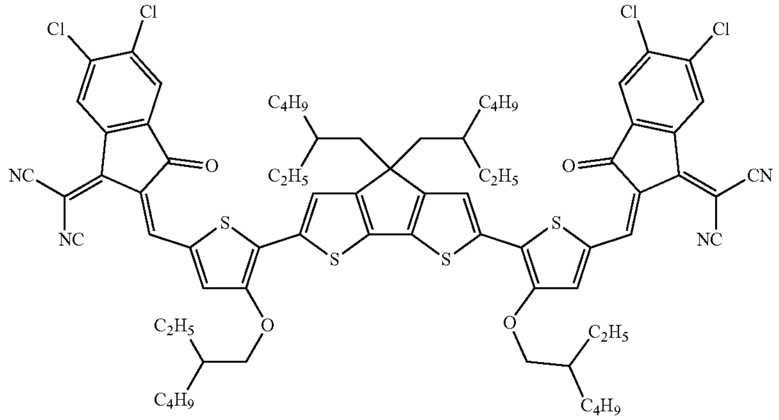
N25
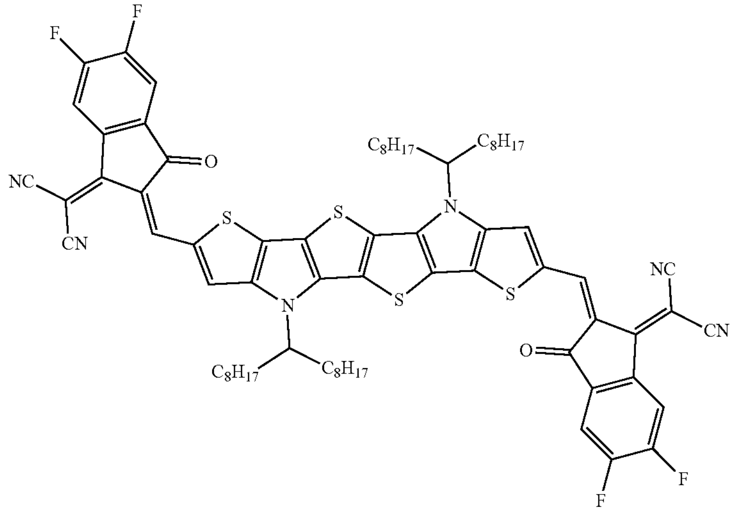

-continued
N26
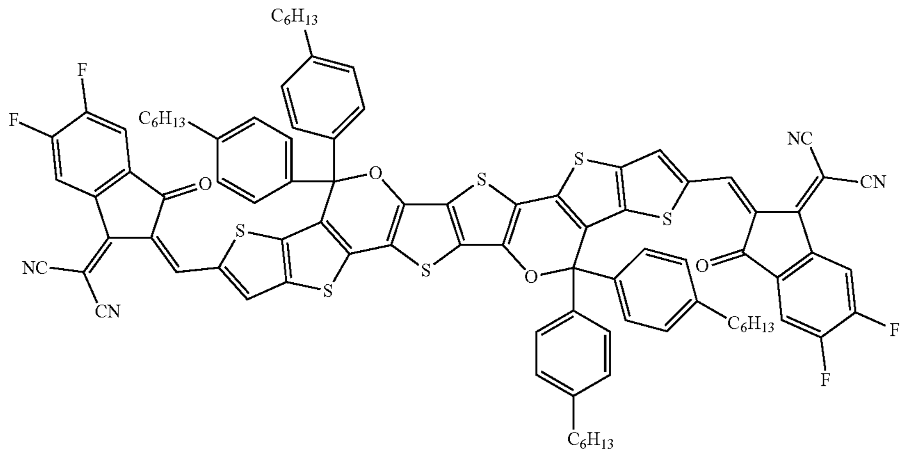
N27
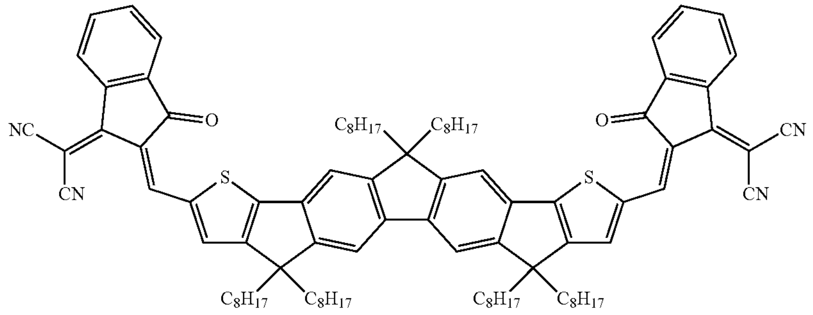
N28
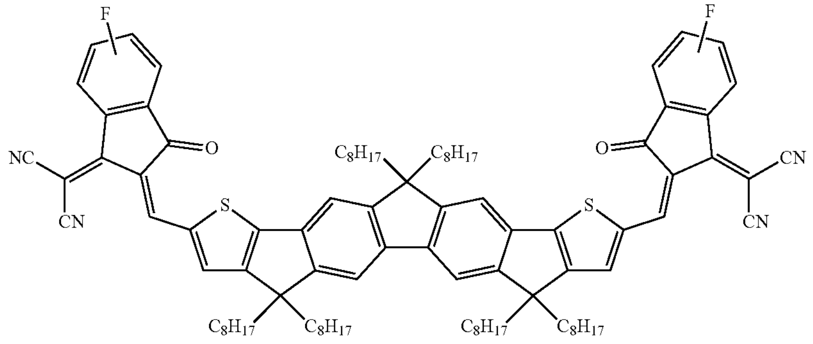
N29
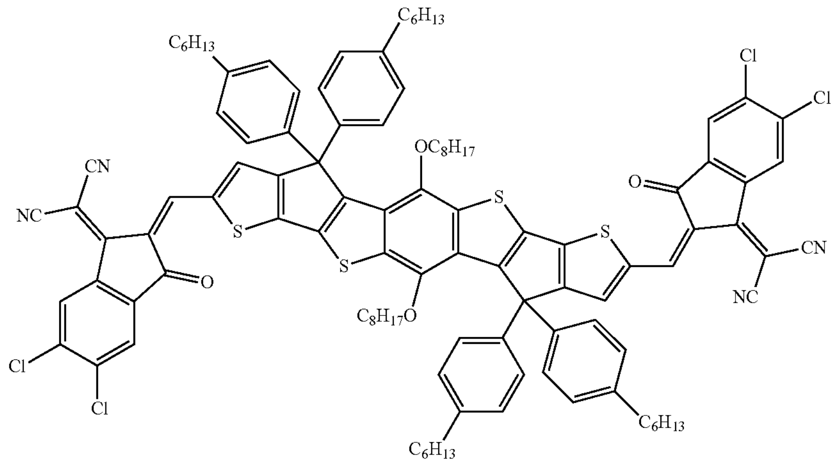

-continued
N30
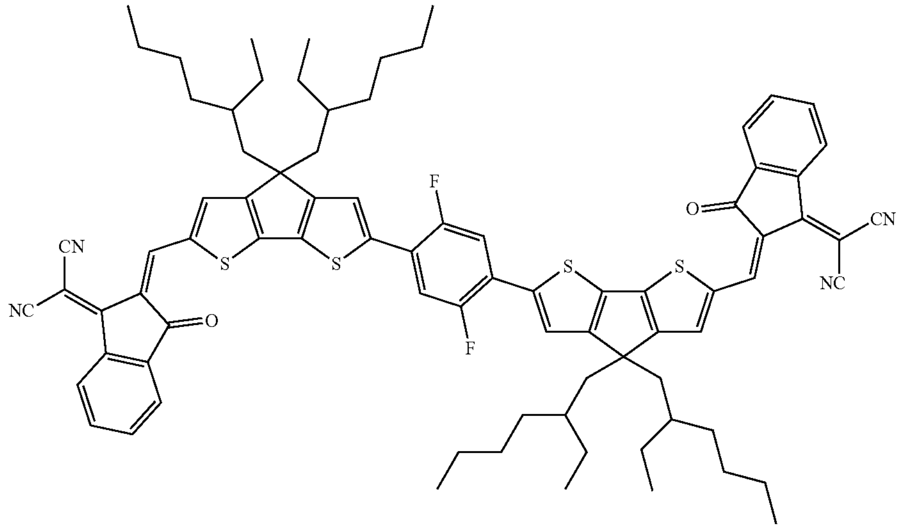
N31
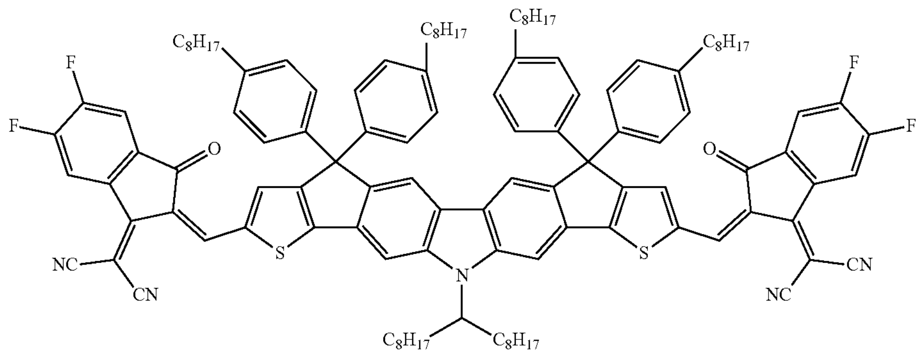
N32
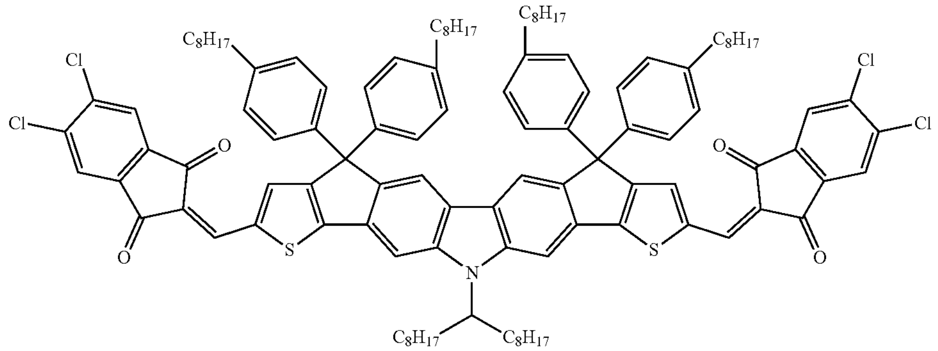
N33
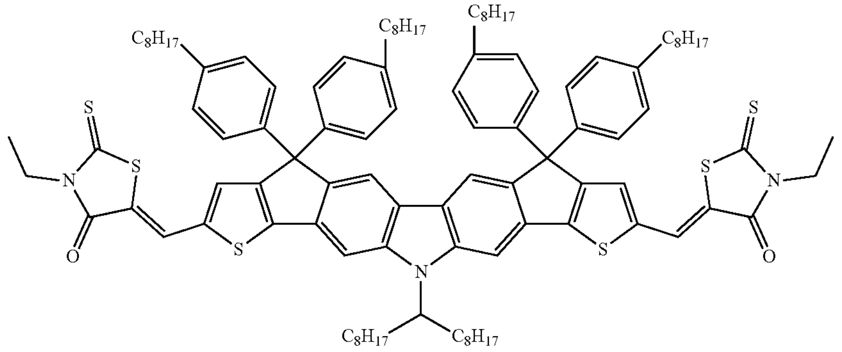

-continued
N34
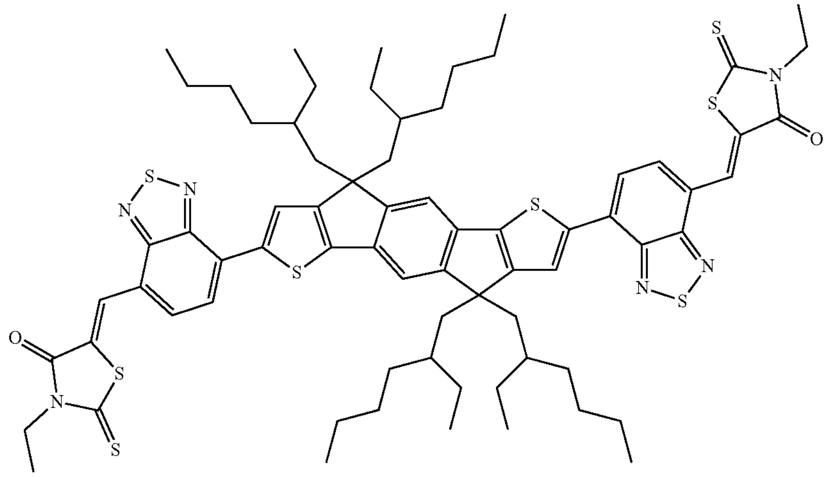
N35
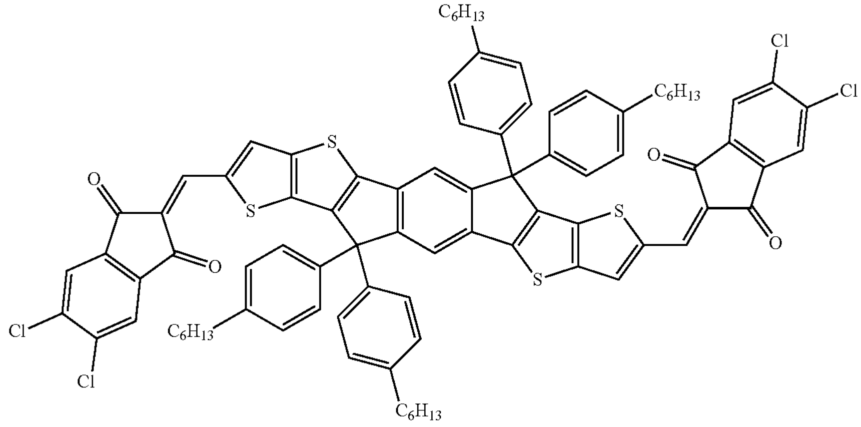
It should be understood that the above-listed embodiments are only intended to allow those skilled in the art to understand the structure and composition of the present invention more clearly, and are not limited thereto.
In practice, Ar2 is one of the following structures:
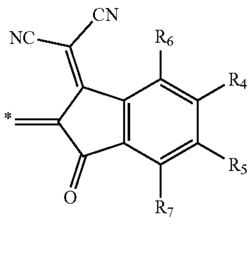
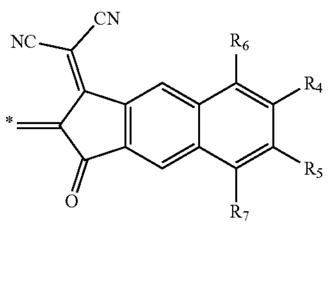
-continued
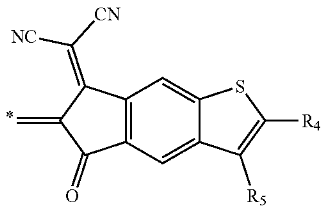
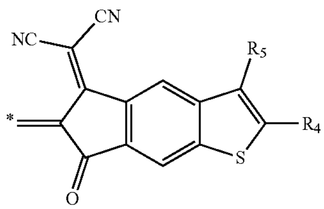
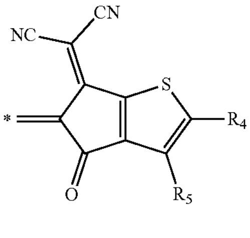
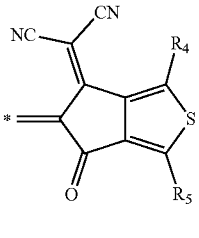

-continued
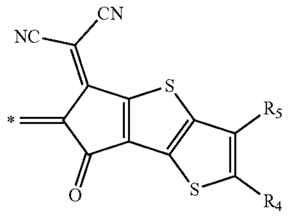
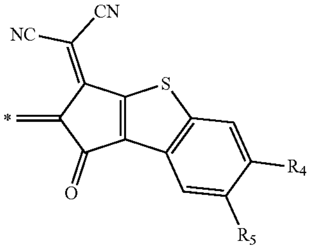
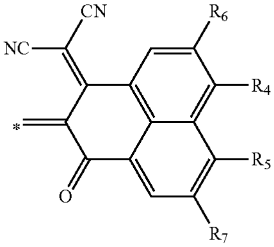
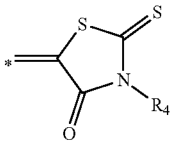
Wherein, $R_4$, $R_5$, $R_6$ and $R_7$ are independently selected from one of the following groups: C1~C30 alkyl, C1~C30 silyl, C1~C30 alkoxy, C1~C30 alkylthio, C1~C30 haloalkyl, halogen, hydrogen and cyano.
In detail, the fullerene material can comprise the following embodiments N36~N39, ICBA, Bis-PCBM:
N36
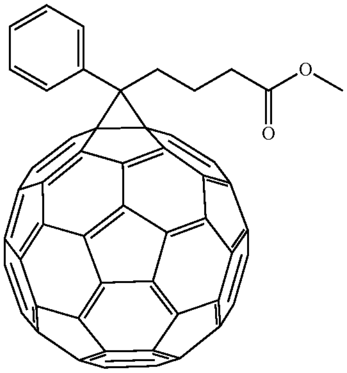
-continued
N37
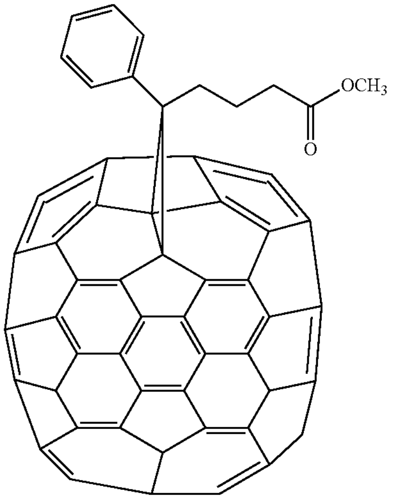
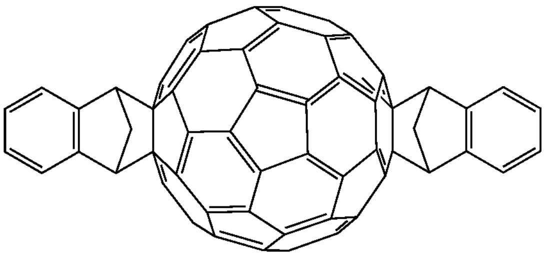
ICBA
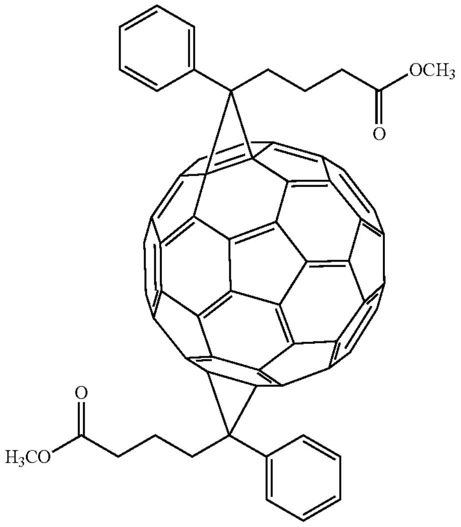
Bis-PCBM -continued

N38

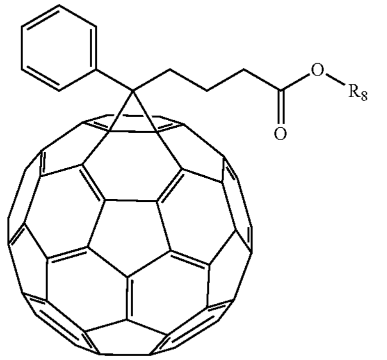

N39

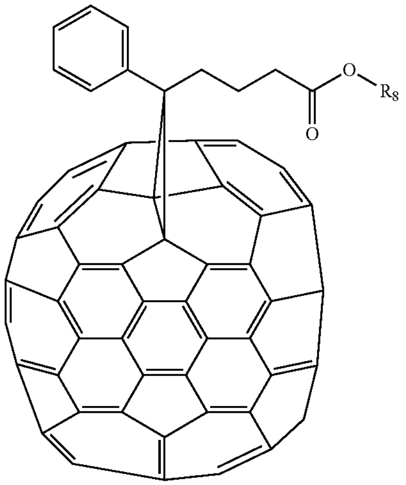

Wherein, $R_8$ is a C2-C30 alkyl group. It should be understood that the above-listed embodiments are only intended to allow those skilled in the art to understand the structure and composition of the present invention more clearly, and are not limited thereto.

Please refer to FIG. 1. FIG. 1 shows a schematic structural diagram of one embodiment of an organic optoelectronic device of the present invention. As shown in FIG. 1, in an embodiment, the present invention further provides an organic optoelectronic device 1, which comprises a first electrode 11, a second electrode 15 and an active layer 13. The active layer 13 is disposed between the first electrode 11 and the second electrode 15. In one embodiment, the active layer 13 comprises the active layer material with formula I. The organic optoelectronic device 1 may have a stacked structure, which sequentially includes a substrate 10, the first electrode 11 (transparent or semi-transparent electrode), a first carrier transporting layer 12, the active layer 13, a second carrier transporting layer 14 and the second electrode 15. Wherein, the first carrier transporting layer is one of an electron transporting layer and a hole transporting layer, and the second carrier transporting layer is the other one. In detail, when the first carrier transporting layer is the electron transport layer, the second carrier transporting layer is the hole transport layer, which is an inverted stacked structure; when the first carrier transporting layer is the hole transporting layer, the second carrier transporting layer is an electron transporting layer, which is a conventional stacked structure. In practice, the organic optoelectronic device 1 may comprise an organic photovoltaic device, an organic photodetector device, or an organic light emitting diode.

In order to more clearly illustrate the block conjugated polymer material of the present invention, the following descriptions will be taken as Comparative Example RP1 and Example BP1 of the present invention, and it will be further prepared as an active layer material and an organic optoelectronic device for material testing and device testing.

For the optical and physical quality measurement part of material testing and device testing, the UV absorption spectrum measuring instrument model is Hitachi UH5700, and the oxidation potential is measured using cyclic voltammetry with CH Instrument 611E.

p-type material: synthesis of Comparative Example RP1:

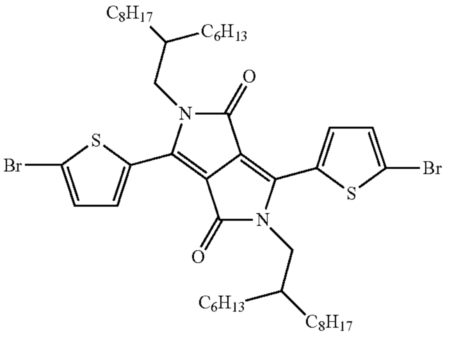

D1

+

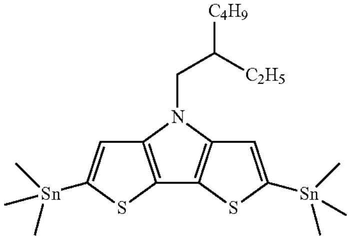

A1

+

-continued

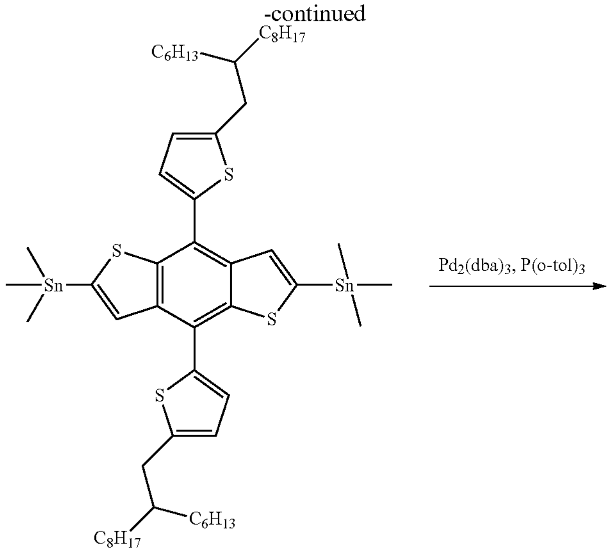

A2

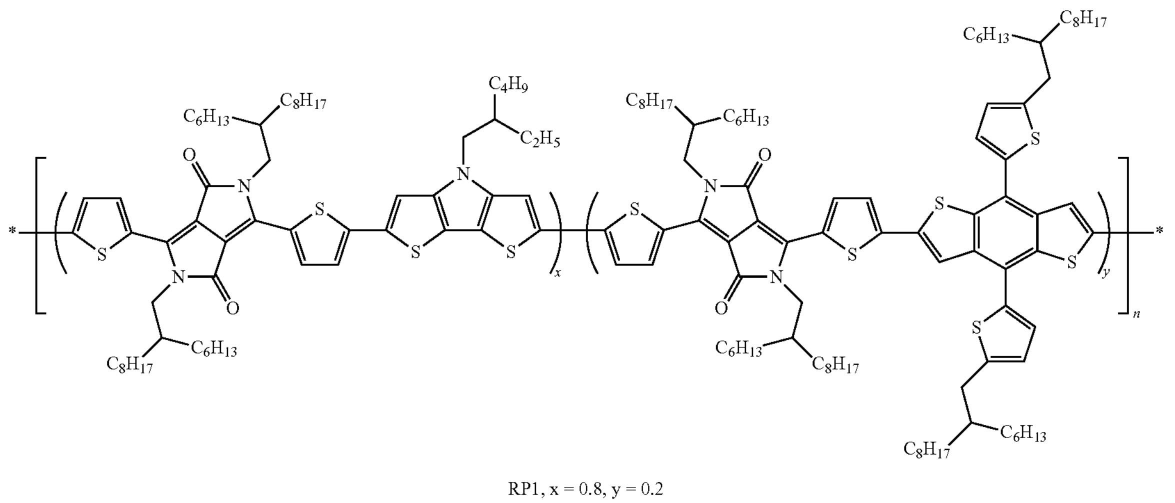

RP1, x = 0.8, y = 0.2

A1 (0.1563 g, 0.2533 mmol), A2 (0.0715 g, 0.0633 mmol) and D1 (0.2871 g, 0.3166 mmol) were placed in a 100 mL double-neck reaction flask. Under magnetic stirring, chlorobenzene (14 mL) was added and dissolved. The reaction was purged with argon for 30 minutes, and then tris(dibenzylideneacetone)dipalladium ($Pd_2(dba)_3$, 0.0116 g, 0.0127 mmol) and tris(o-methylphenyl)phosphine ($P(o\text{-}tol)_3$, 0.015 g, 0.0506 mmol) were added. The system was placed in a preheated 130° C. oil bath under positive argon pressure for 17 hours. After cooling down to room temperature, the reaction mixture was poured into methanol to precipitate a black solid. The solid was collected by filtration and purified by Soxhlet extraction (methanol and ethyl acetate) for 16 hours. After the Soxhlet extraction, the solid in the filter cartridge was taken out, dried and then reprecipitated with chlorobenzene and methanol. The solid was collected by filtration. After the solid was rinsed with acetone and dried in vacuum, the product was obtained (0.31 g, yield: 86%).

p-type material: synthesis of Example BP1:

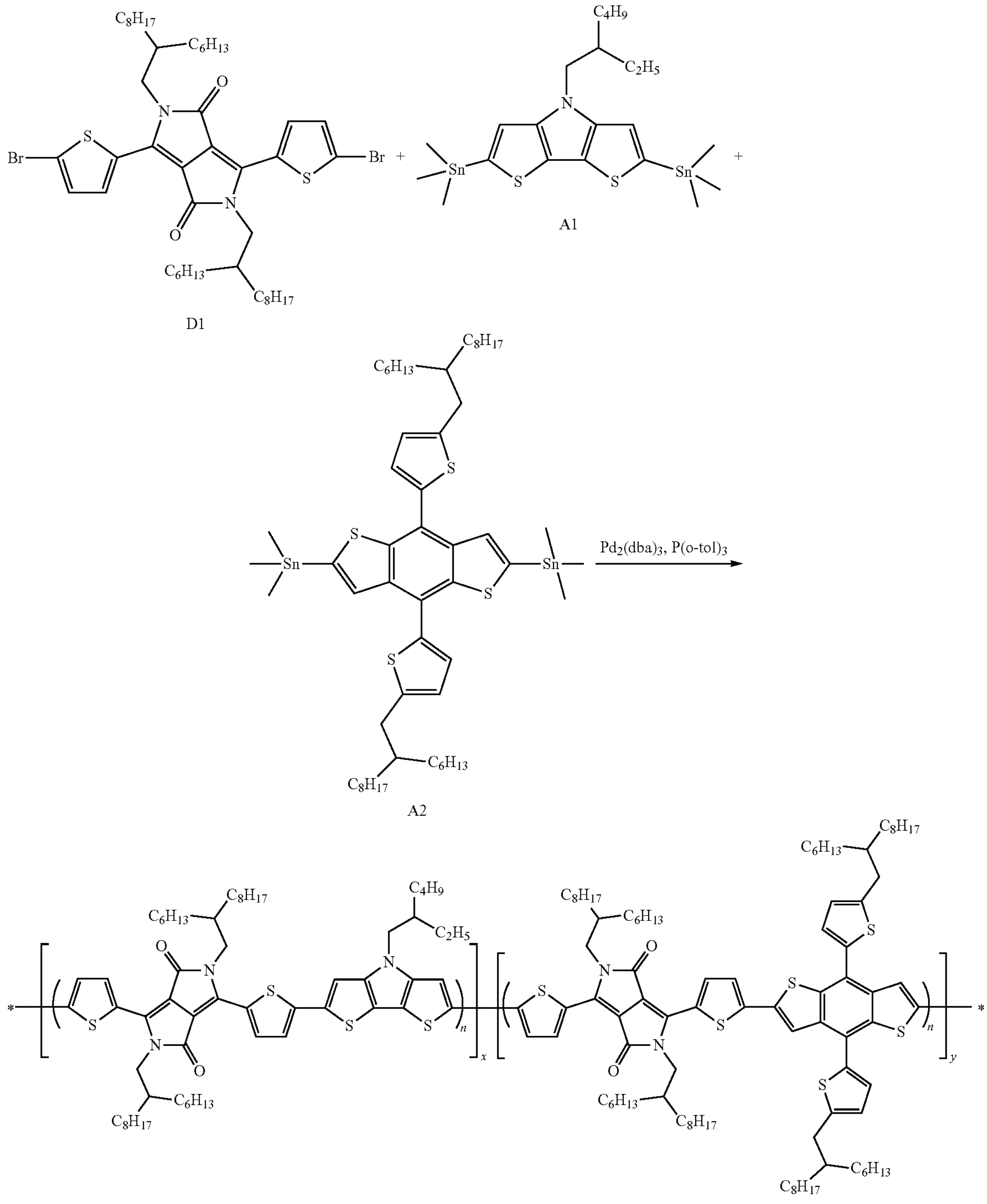

D1

A1

A2

BP1, x = 0.8, y = 0.2

A2 (0.062 g, 0.055 mmol) and D1 (0.050 g, 0.055 mmol) were placed in a 100 mL double-neck reaction flask. Under magnetic stirring, chlorobenzene (2.50 mL) was added and dissolved. The reaction was purged with argon for 30 minutes, and then tris(dibenzylideneacetone)dipalladium ($Pd_2(dba)_3$, 0.0116 g, 0.0127 mmol) and tris(o-methylphenyl)phosphine ($P(o\text{-}tol)_3$, 0.003 g, 0.009 mmol) were added. The system was placed in a preheated 130° C. oil bath under positive argon pressure for 1 hours to form solution A. A1 (0.136 g, 0.221 mmol) and D1 (0.200 g, 0.221 mmol) were placed in a 100 mL double-neck reaction flask. Under magnetic stirring, chlorobenzene (10 mL) was added and dissolved. The reaction was purged with argon for 30 minutes, and then tris(dibenzylideneacetone)dipalladium ($Pd_2(dba)_3$, 0.008 g, 0.009 mmol) and tris(o-methylphenyl) phosphine ($P(o\text{-}tol)_3$, 0.011 g, 0.035 mmol) were added. The system was placed in a preheated 130° C. oil bath under positive argon pressure for 15 minutes to form solution B.

After the solutions A and B were removed from the oil bath, the solution B was transferred to the reaction flask of the solution A with a double-ended needle and argon pressure, and put back into the 130° C. oil bath for 17 hours. After cooling down to room temperature, the reaction mixture was poured into methanol to precipitate a black solid. The solid was collected by filtration and purified by Soxhlet extraction (methanol and ethyl acetate) for 16 hours. After the Soxhlet extraction, the solid in the filter cartridge was taken out, dried and then reprecipitated with chlorobenzene and methanol. The solid was collected by filtration. After the solid was rinsed with acetone and dried in vacuum, the product was obtained (0.278 g, yield: 82%).

According to the above synthesis method, it can be clearly seen that in Comparative Example RP1, the reactants D1, A1 and A2 are directly added into the reaction at the same time, so the synthesized will be a random copolymer with two repeat unis of D1-A1 and D1-A2 which arranged randomly. In Example BP1 of the present invention, D1 and A1, and D1 and A2 were separately reacted to form two blocks of a polymer 1 and a polymer 2 respectively, and then the two blocks were reacted together. The resultant synthesized will therefore be a block copolymer. It can be seen from the structural chemical formula listed above that the two are different types of polymers. Different types of copolymers will have different physical and chemical properties. Therefore, when comparing the two, it is necessary to confirm the type of copolymers of the two, and it is not possible to generalize them. The comparison results of different types of copolymers will be described below.

Figure 2:
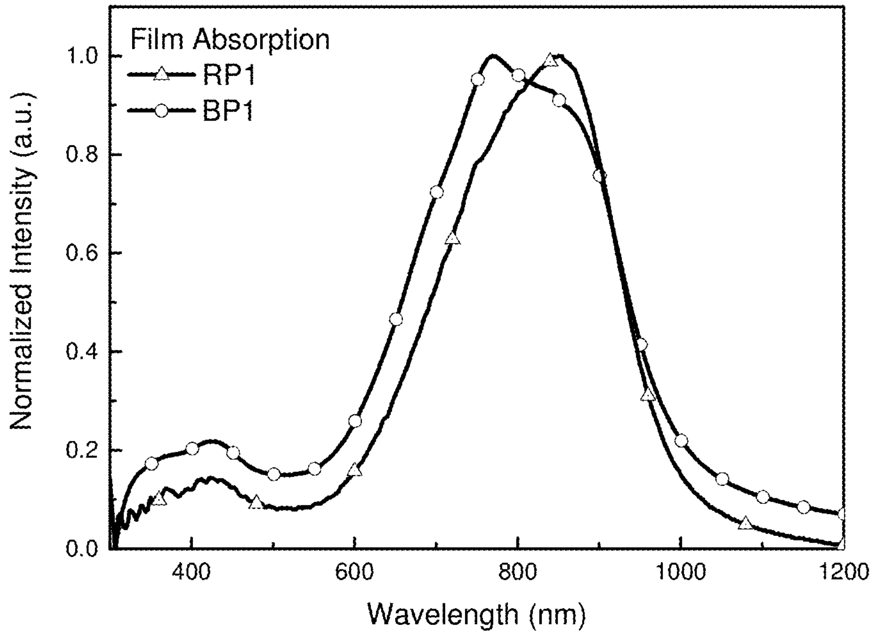
FIG. 2 shows an absorption spectrum of Comparative Example RP1 and Example BP1 of the block conjugated polymer material of the present invention in thin film state.
Figure 3:
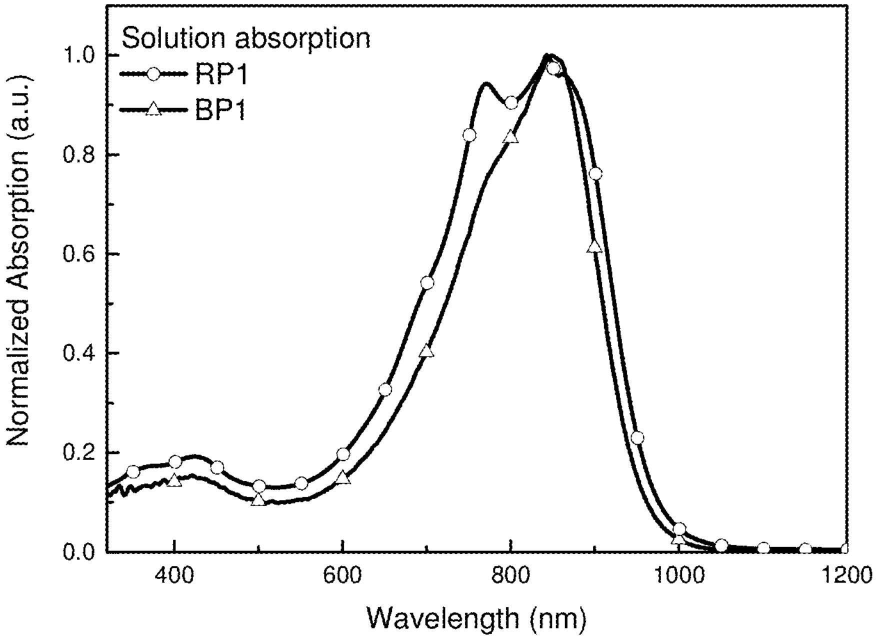
FIG. 3 shows an absorption spectrum of comparative example RP1 and example BP1 of the block conjugated polymer material of the present invention in solution state.

The material performance test of Comparative Example RP1 and Example BP1, including material optical properties and electrochemical properties tests:

Please refer to FIG. 2, FIG. 3, and Table 1. FIG. 2 shows an absorption spectrum of Comparative Example RP1 and Example BP1 of the block conjugated polymer material of the present invention in thin film state. FIG. 3 shows an absorption spectrum of comparative example RP1 and example BP1 of the block conjugated polymer material of the present invention in solution state. Table 1 shows the data results of FIG. 2 and FIG. 3.

TABLE 1

Data results of FIG. 2 and FIG. 3.

| Material | Solid content (Solvent: o-xylene) | Viscosity @ 25° C. (cps) | Energy Gap (eV) | HOMO/LUMO (eV) |
|---|---|---|---|---|
| RP1 | 8 mg/mL | 17.96 | 1.25 | −5.01/−3.76 |
| BP1 | 8 mg/mL | 9.66 | 1.24 | −5.09/−3.85 |

As shown in FIG. 2 and FIG. 3 and Table 1, Example BP1 has a good performance in the absorption spectrum. The maximum absorbance value of the film state of Example BP1 is at 770 nm, and the on-set value of absorbance is at 1001 nm. It can be seen from the thin film state absorption spectrum that it has good absorption properties at 700~1000 nm. The optical properties of Example BP1 are similar to the absorption spectrum of Comparative Example RP1, but the full width at half maximum (FWHM) and band interval of the absorption peak of Example BP1 are slightly larger than those of Comparative Example RP1. The results of absorption spectrum show that both BP1 and RP1 have good optical properties. The absorption spectrum width of BP1 is wider than that of RP1 because the block composition method can better display the physical properties of the composed fragments than the random composition method. Therefore, it is speculated that the block polymer is beneficial to the dark current suppression effect.

Preparation and performance testing of organic photodetector devices of organic optoelectronic devices:

A glass coated by a pre-patterned indium tin oxide (ITO) with a sheet resistance of ~15 Ω/sq is used as a substrate. The substrate is ultrasonically oscillated in soap deionized water, deionized water, acetone, and isopropanol in sequence, and washed in each step for 15 minutes. The washed substrate is further treated with a UV-ozone cleaner for 15 minutes. The top coat of AZO (Aluminum-doped zinc oxide) solution is spin coated on the ITO substrate with a spin rate of 2000 rpm for 40 seconds, and then baked at 120° C. in air for 5 minutes to form an electron transporting layer (ETL). The active layer solution was prepared in o-xylene (the weight ratio of donor material:acceptor material is 1:1~2). The concentration of the donor material was 20 mg/mL. The donor material includes the block conjugated polymer material aforementioned. To completely dissolve the active layer material, the active layer solution is stirred on a hot plate at 100° C. for at least 3 hours. After cooling down to room temperature, filter with PTFE filter membrane (pore size 0.45~1.2 μm), and then heat the active layer solution for 1 hour. Then, the active layer solution is returned to the room temperature for spin coating, and the spin rate was used to control the film thickness in the range of 100~200 nm. Finally, the thin film formed by the coated active layer is annealed at 100° C. for 5 minutes, and then transferred to a thermal evaporation machine. A thin layer (8 nm) of $MoO_3$ is deposited as a hole transporting layer under a vacuum of $3\times10^{-6}$ Torr. In this experiment, a Keithley™ 2400 source meter was used to record the dark current ($J_d$, at a bias of −0.5 V) in the absence of light. External quantum efficiency system was used to measure external quantum efficiency (EQE) with a range of 300~1100 nm (bias voltage 0~−0.5 V), and silicon (300~1100 nm) is used for light source calibration.

It should be noted here that, in practical applications, the first electrode preferably has good light transmittance. The first electrode is usually made of a transparent conductive material, preferably selected from one of the following conductive material groups: indium oxide, tin oxide, halogen-doped tin oxide derivative (such as Florine Doped Tin Oxide, FTO), or composite metal oxides such as indium tin oxide (ITO) and indium zinc oxide (IZO). The material of the second electrode is a conductive metal, preferably silver or aluminum, more preferably silver. Suitable and preferred materials for ETL include, but are not limited to, metal oxides such as $ZnO_x$, aluminum doped ZnO (AZO), $TiO_x$ or nanoparticles thereof, salts (such as LiF, NaF, CsF or $CsCO_3$), amines (such as primary amines, secondary or tertiary amines), conjugated polymer electrolytes (such as polyethyleneimine), conjugated polymers (such as poly[3-(6-trimethylammoniumhexyl)thiophene], poly(9,9)-bis(2-ethylhexyl-fluorene)-b-poly[3-(6-trimethylammoniumhexyl)thiophene] or poly[(9,9-bis(3'-(N,N-dimethylamino))propyl)-2,7-fluorene)-alt-2,7-(9,9-dioctylfluorene)], and organic compounds such as tris(8-quinolinyl)-aluminum(III) ($Alq_3$), 4,7-diphenyl-1,10-phenanthroline), or a combination of one or more of the foregoing. Suitable and preferred materials for HTL include, but are not limited to metal oxides such as ZTO, $MoO_x$, $WO_x$, $NiO_x$ or nanoparticles thereof, conjugated polymer electrolytes such as PEDOT:PSS, polymeric acids such as polyacrylates, conjugated polymers such as polytriarylamine (PTAA), insulating polymers such as nafion films, polyethyleneimine or polystyrene sulfonates, organic compounds such as N,N'-diphenyl-N,N'-bis(1-naphthyl)(1,1'-biphenyl)-4,4'-diamine (NPB), N,N'-diphenyl-N,N'-(3-methylbenzene base)-1,1'-biphenyl-4,4'-diamine (TPD), or a combination of one or more of the above.

Figure 4:
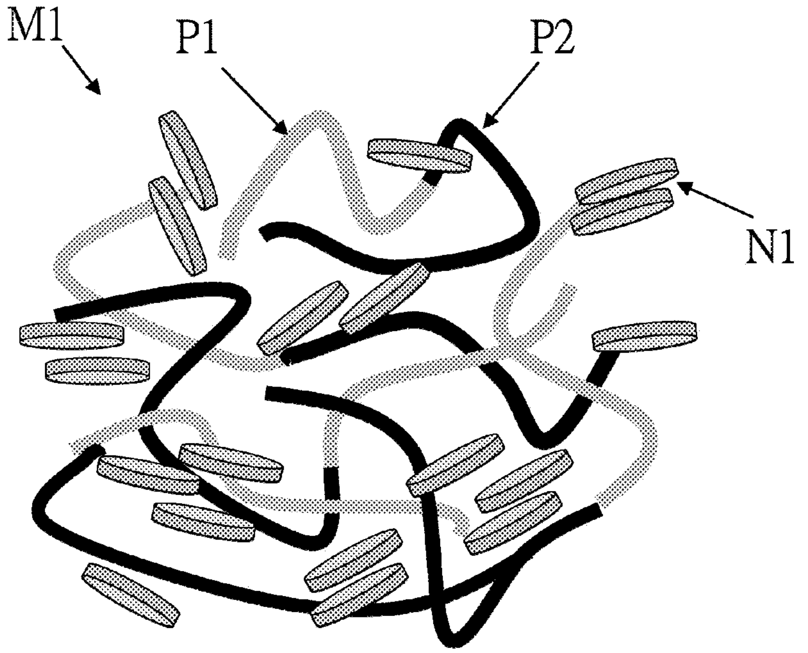
FIG. 4 shows a schematic structural diagram of one embodiment of an active layer material of the present invention.
Figure 5:
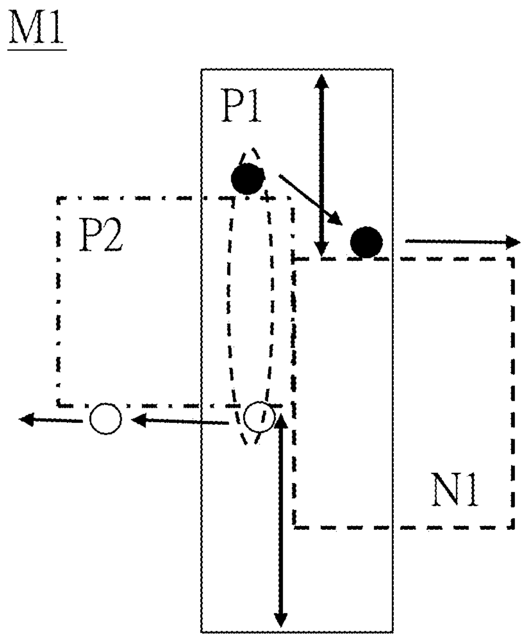
FIG. 5 shows a schematic diagram illustrating the carrier transporting action of the active layer material of the present invention.

Please refer to FIG. 4 and FIG. 5. FIG. 4 shows a schematic structural diagram of one embodiment of an active layer material M1 of the present invention. FIG. 5 shows a schematic diagram illustrating the carrier transporting action of the active layer material M1 of the present invention. As shown in FIG. 4, this case proposes a concept, by using a block conjugated polymer material copolymerized with a polymer 1 P1 with high energy gap and a polymer 2 P2 with low energy gap as a p-type material, and then being mixed with an n-type material N1 to form an active layer material M1 as shown in FIG. 4. The active layer material M1 is deposited on the target substrate by coating or printing by a wet process for photoelectron conversion. Among them, the block conjugated polymer material contains two or more blocks. As shown in FIG. 5, the block includes the polymer 1 P1 with high energy gap and the polymer 2 P2 with low energy gap. Among them, the energy band of the polymer 1 P1 is selected by the solid line, the energy band of the polymer 2 P2 is selected by the dot and line, and the energy band of the n-type material N1 is selected by the dotted line. The moving direction of the solid circle is the electron flow direction, and the moving direction of the hollow circle is the hole flow direction. The polymer 2 P2 with low energy gap is mainly used for absorbing light and performing exciton diffusion and carrier transporting after dissociating with the adjacent n-type material N1 in the active layer material. During the process, the polymer 1 P1 with high energy gap is next to the polymer 2 P2 and the n-type material N1. Because the polymer 1 P1 increases the energy barrier between the polymer 2 P2 and the n-type material N1 (as shown by the double arrow position in FIG. 5), the polymer 1 P1 with high energy gap acts as a carrier blocking unit. The polymer 1 P1 can be used to suppress the carrier recombination probability, thereby reducing the generation of leakage current of the organic optoelectronic device.

Figure 6:
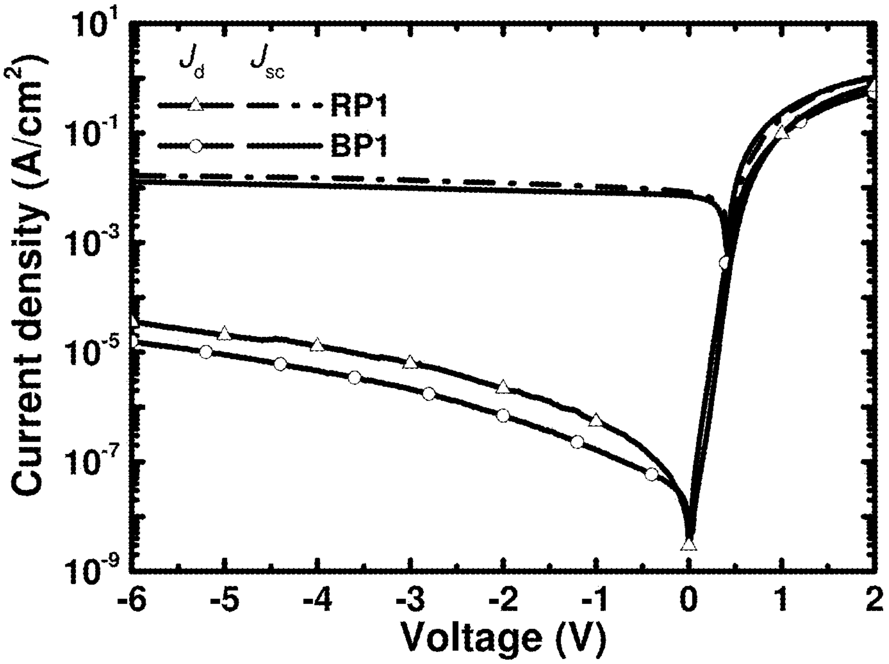
FIG. 6 shows a dark current test result of Comparative Example RP1 and Example BP1 of the active layer material of the present invention.

Please refer to FIG. 6 and Table 2. FIG. 6 shows a dark current test result of Comparative Example RP1 and Example BP1 of the active layer material of the present invention. Table 2 shows the test data results of FIG. 6.

TABLE 2

Test data results for FIG. 6

| Active layer material | | | | | | | | |
|---|---|---|---|---|---|---|---|---|
| p-type | n-type | Dark current (A/cm$^2$) | | | | D* ($10^{11}$ Jones) | | |
| material | material | −0.5 V | −2 V | −4 V | −6 V | 450 nm | 650 nm | 940 nm |
| RP1 | [60]PCBM | $1.7 \times 10^{-7}$ | $2.2 \times 10^{-6}$ | $1.3 \times 10^{-5}$ | $3.6 \times 10^{-5}$ | 1.19 | 1.29 | 1.53 |
| BP1 | | $7.1 \times 10^{-8}$ | $6.9 \times 10^{-7}$ | $4.6 \times 10^{-6}$ | $1.6 \times 10^{-5}$ | 2.09 | 3.02 | 1.95 |

As shown in FIG. 6 and Table 2, the synthesized p-type materials Comparative Example RP1 and Example BP1 were respectively combined with the n-type material [60] PCBM as an active layer material and fabricated into an organic optoelectronic device. The results prove that the organic optoelectronic device of Example BP1 mainly composed of block copolymer exhibits lower dark current under each bias voltage. In addition, in terms of detectivity (D*), because the Example BP1 has a lower dark current, the detectivity is also higher than that of the Comparative Example RP1. The above test results have verified the above-mentioned hypothesis of the action of the high energy gap polymer and the low energy gap polymer in the active layer material.

Based on the above experimental results, the block conjugated polymer material of the present invention is a p-type material that can adjust dark current. Compared with the random copolymer, the block copolymer of the present invention can suppress the generation of leakage current through the block with high energy gap. According to the above calculation formula, a higher detectivity can be obtained, and it can have a good performance in the organic photodetector device.

With the detailed description of the above embodiments, it is hoped that the features and spirit of the present invention can be more clearly described, and the scoped of the present invention is not limited by the embodiments disclosed above. On the contrary, the intention is to cover various changes and equivalent arrangements within the scope of the patents to be applied for in the present invention.

What is claimed is:

1. A block conjugated polymer material comprising a structure of formula I:

(formula I)

$$-\left[\text{polymer 1}\right]_o\left[\text{polymer 2}\right]_p-$$

wherein the polymer 1 is a p-type polymer having a maximum absorption wavelength of ≤800 nm in film form, and the polymer 1 comprises a first electron donor and a first electron acceptor arranged alternately;

the polymer 2 is a p-type polymer having a maximum absorption wavelength of >800 nm in film form, and the polymer 2 comprises a second electron donor and a second electron acceptor arranged alternately; and o and p>0.

2. The block conjugated polymer material of the claim 1, wherein the polymer 1 is one of the following structures:

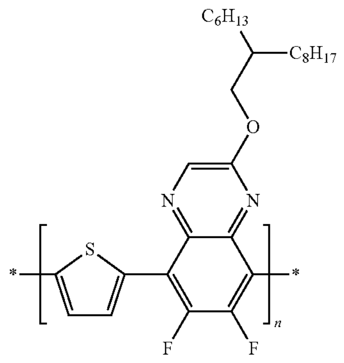
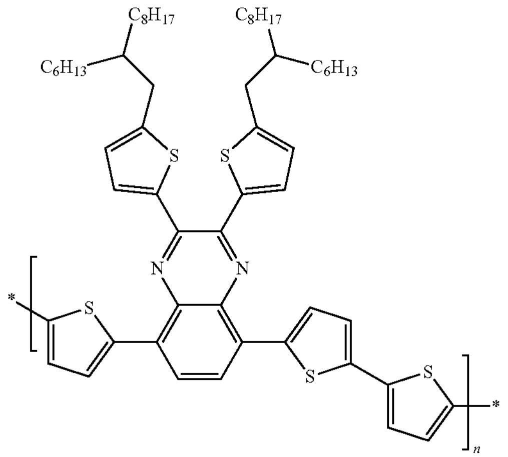
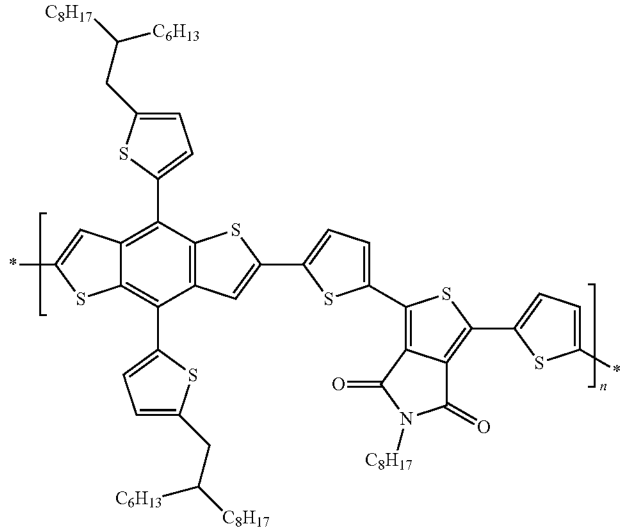
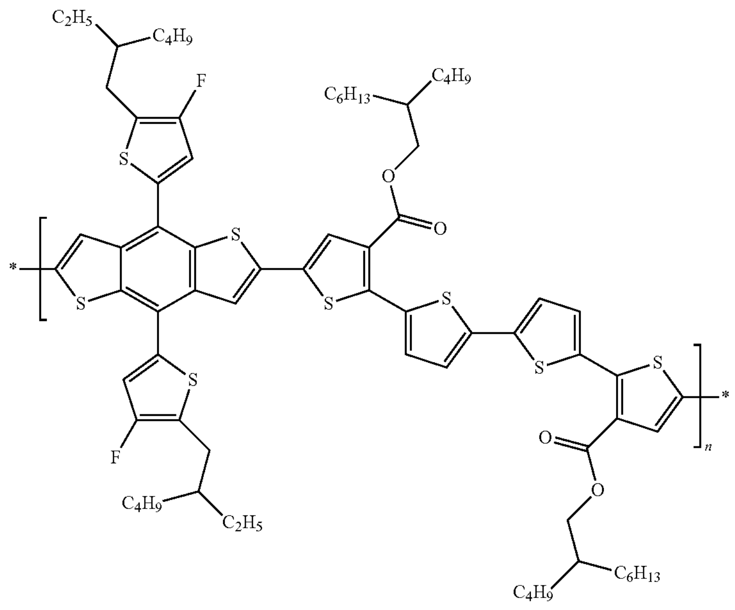

-continued
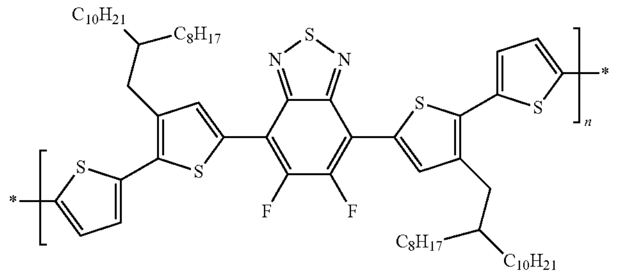
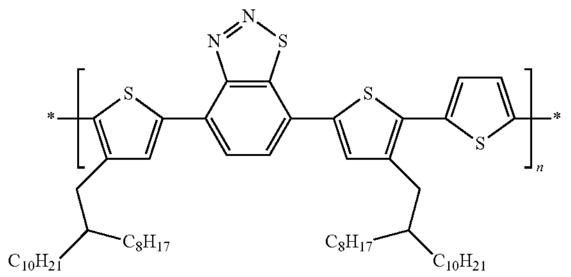
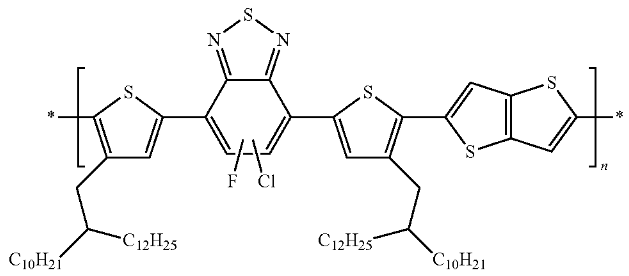
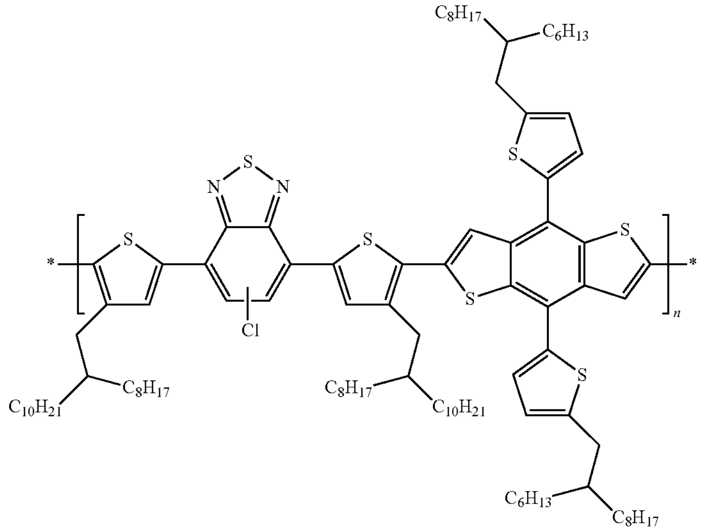
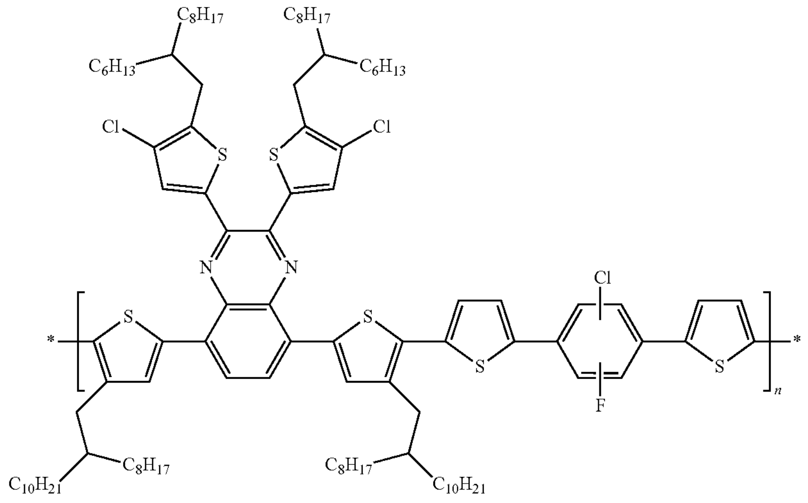

-continued
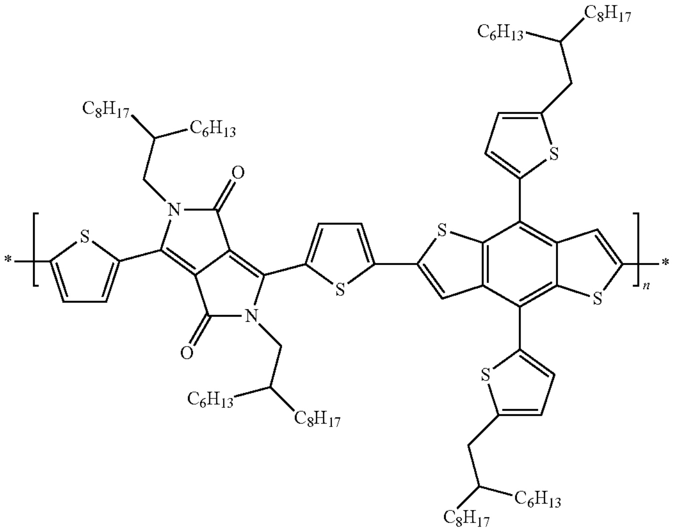
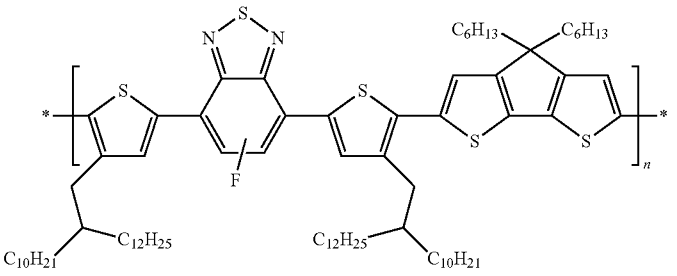
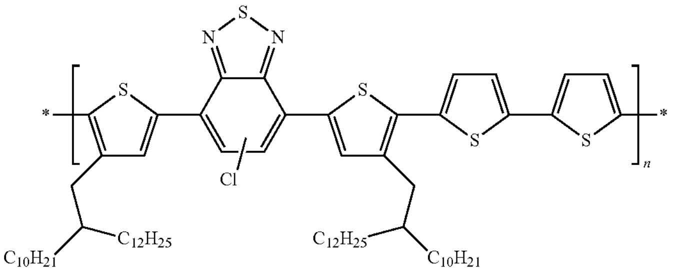
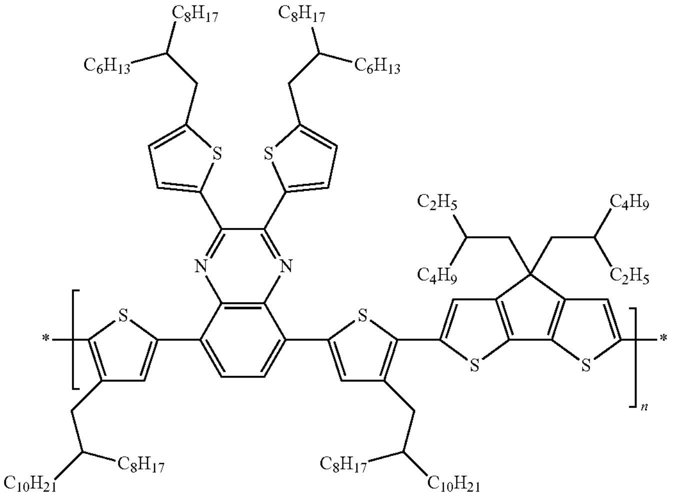

-continued
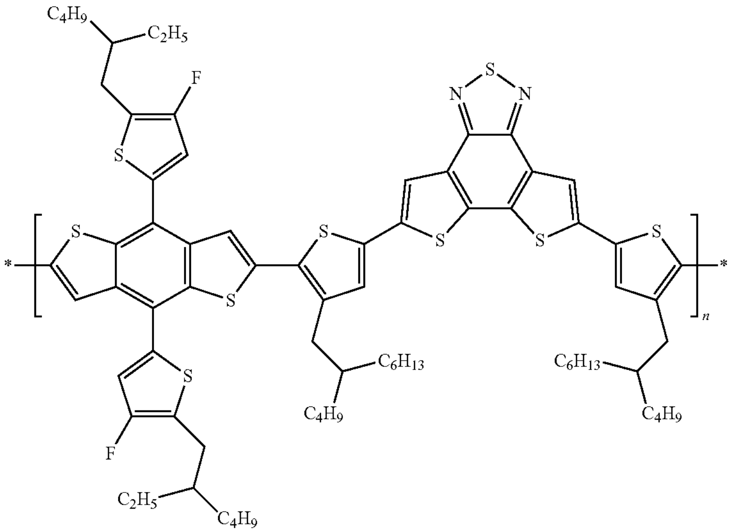
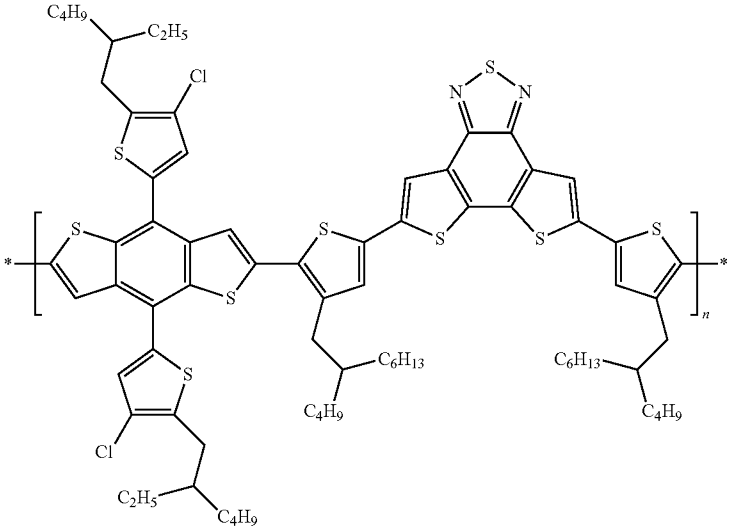
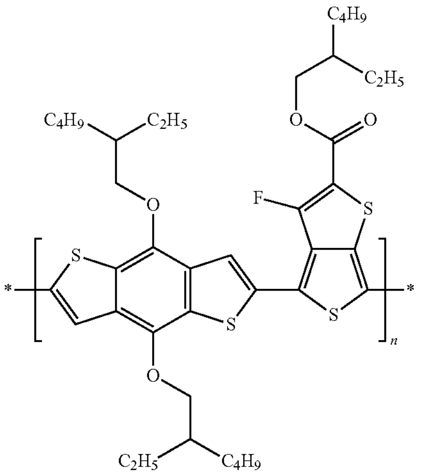
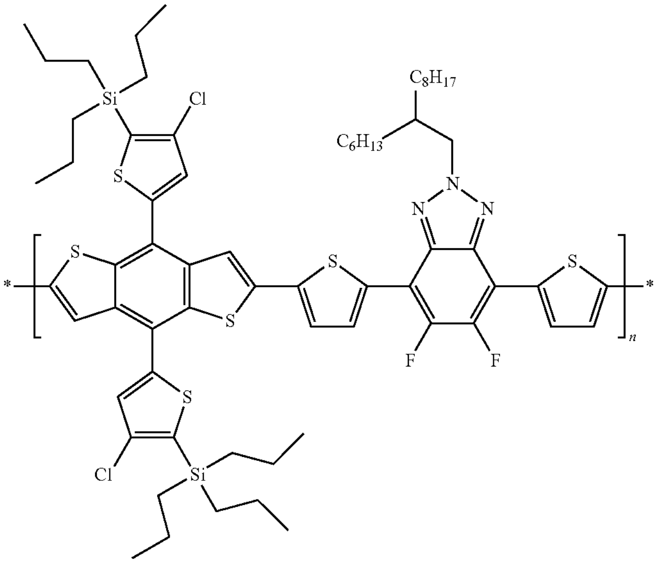

-continued
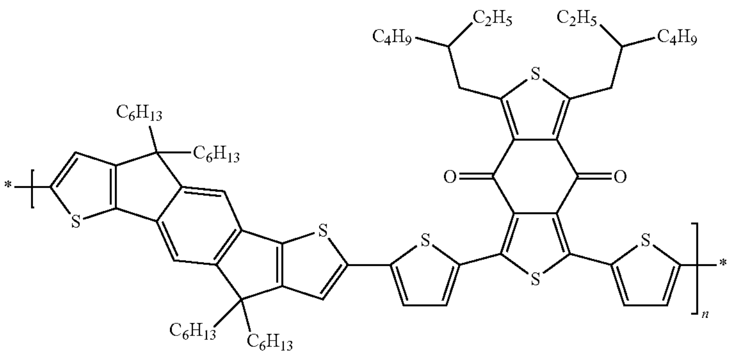
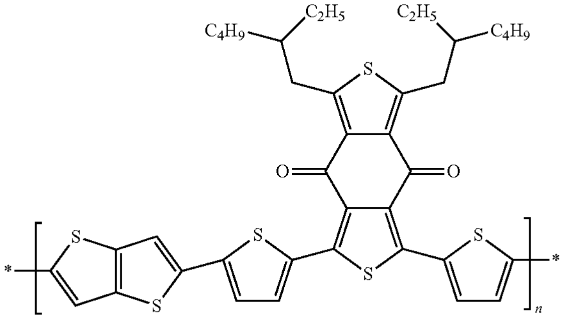
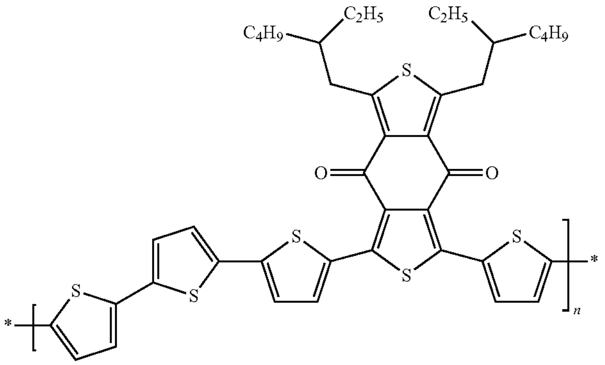
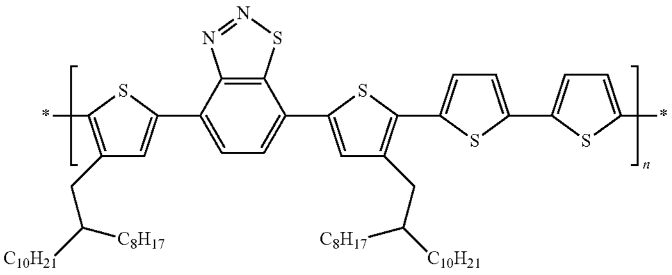

-continued
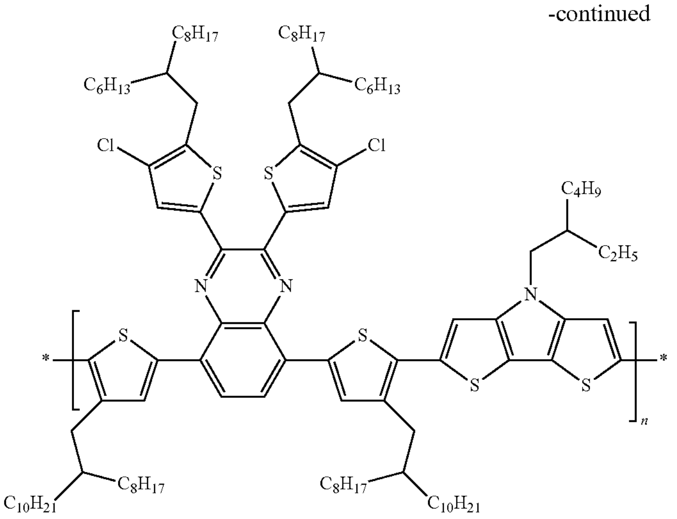
wherein n is positive integer.
3. The block conjugated polymer material of the claim 2, wherein the polymer 2 is one of the following structures:
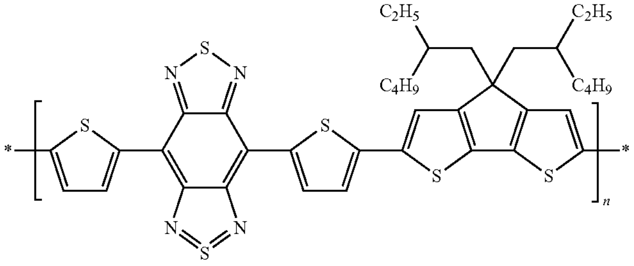
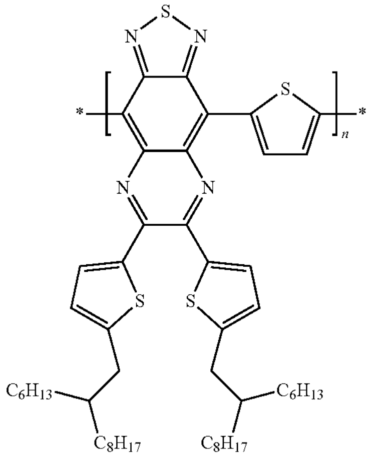
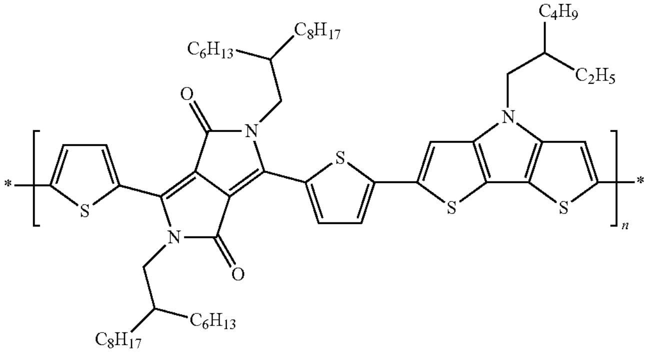

-continued
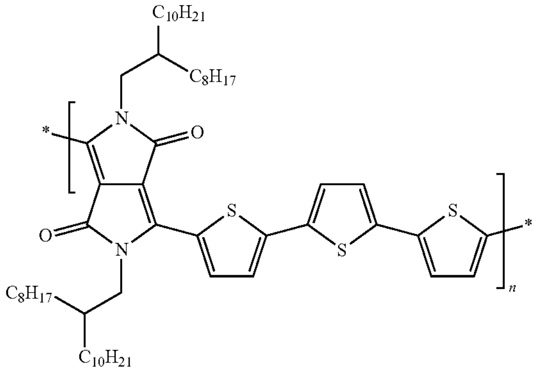
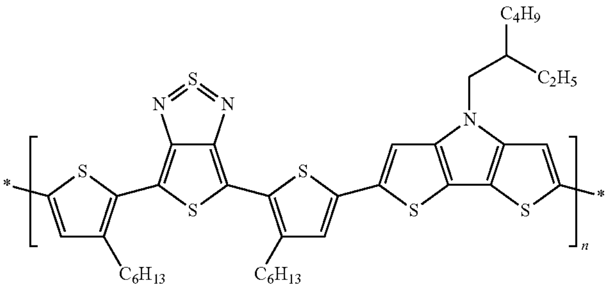
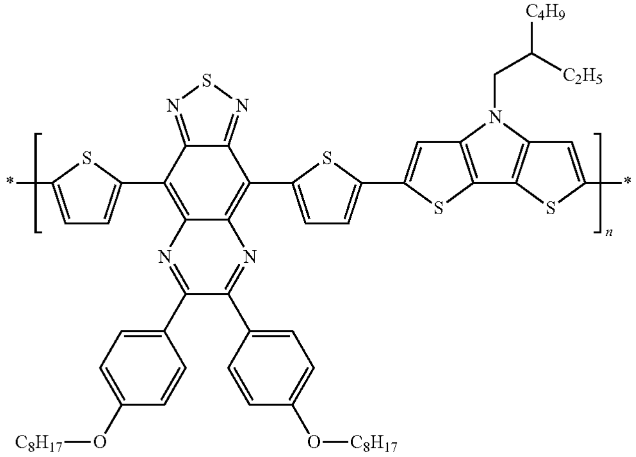
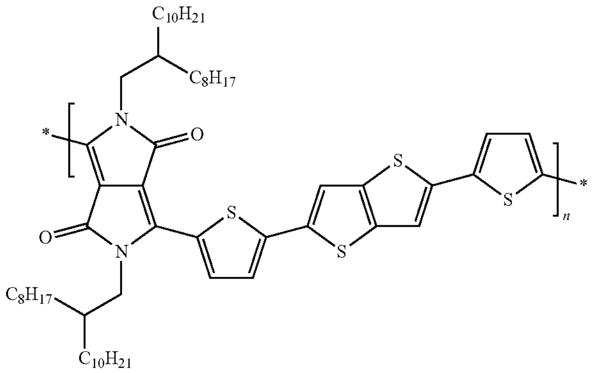
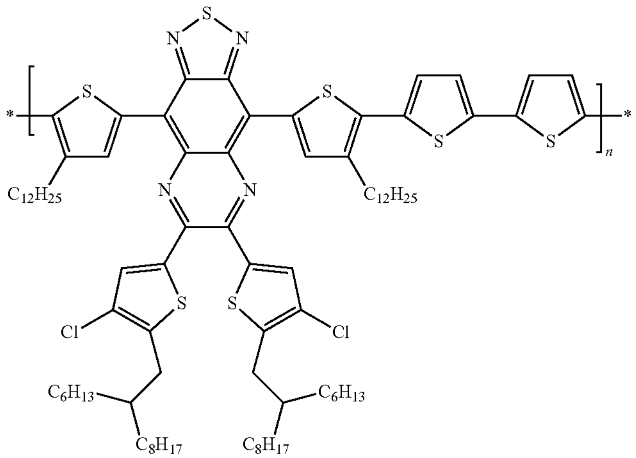

-continued
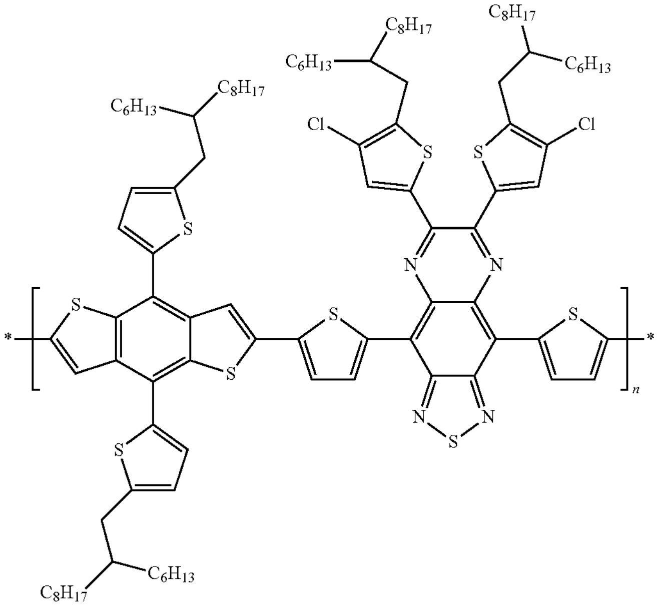
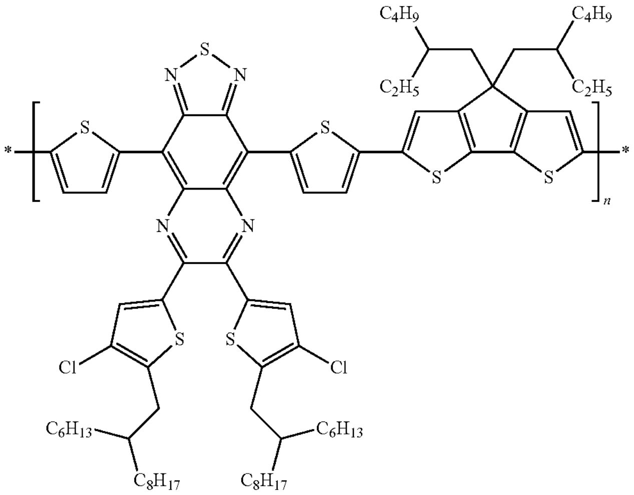
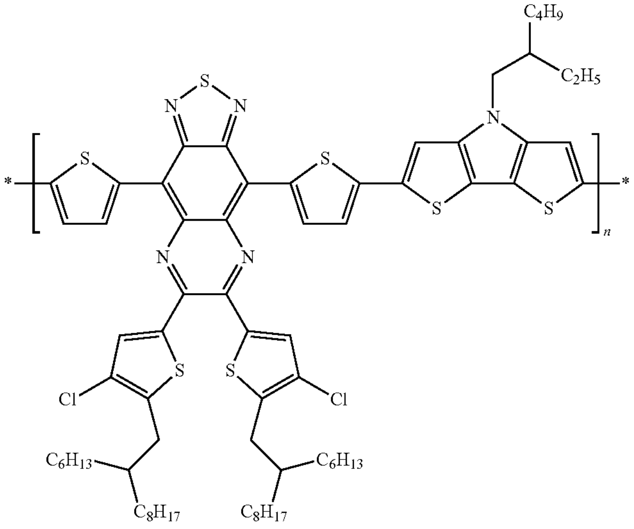

-continued

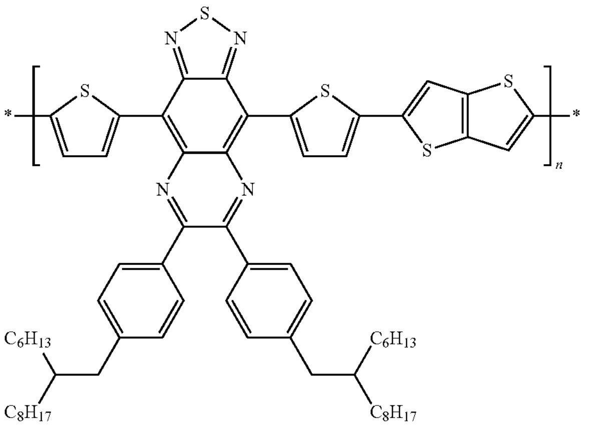

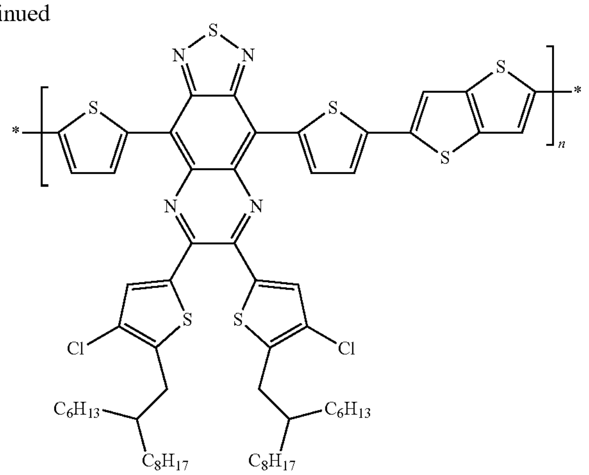

wherein n is positive integer.

4. An active layer material comprising:

a p-type material comprising the block conjugated polymer material of claim 1; and an n-type material comprising a non-fullerene material structure or a fullerene material structure with an electron-withdrawing group, and the energy gap of the n-type material is less than 2.5 eV.

5. The active layer material of the claim 3, wherein the structure of the non-fullerene material comprises a structure of formula II: Ar2-Ar1-Ar2 (formula II);

wherein Ar1 comprises a conjugated structure with 5 to 40 carbon, and comprises more than one fused ring or fused heterocyclic ring; and Ar2 comprises a monocyclic structure with ketone or a fused ring structure with ketone.

6. The active layer material of the claim 5, wherein Ar1 is one of the following structures:

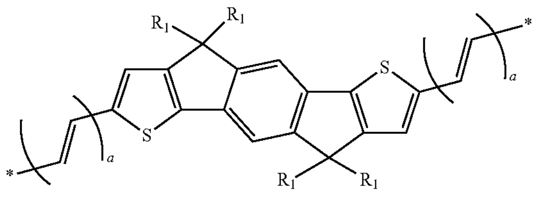

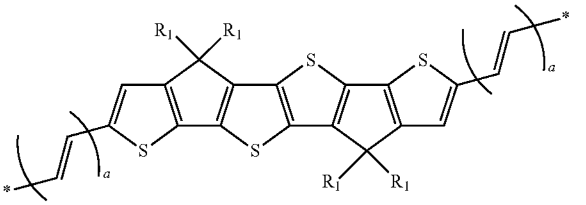

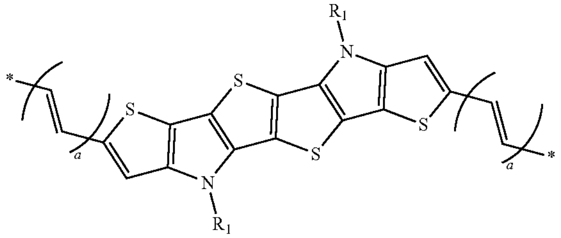

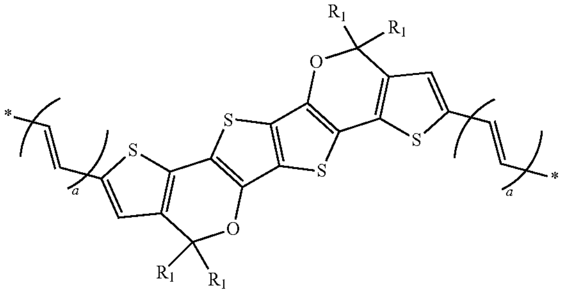

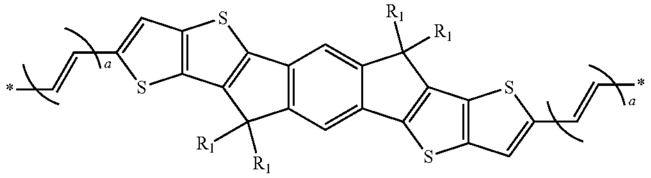

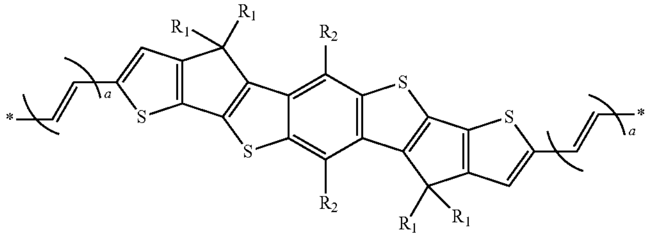

-continued
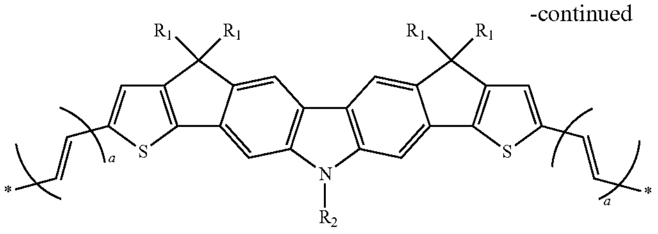
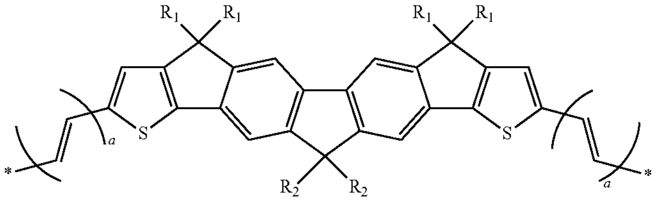
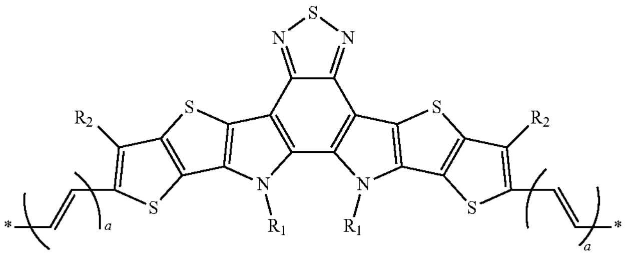
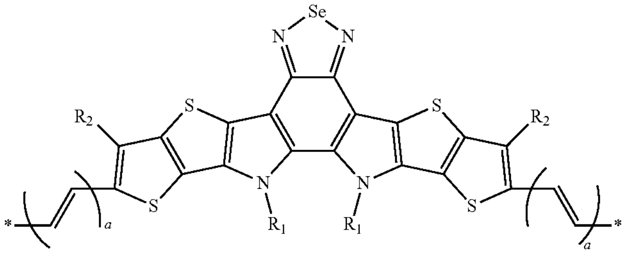
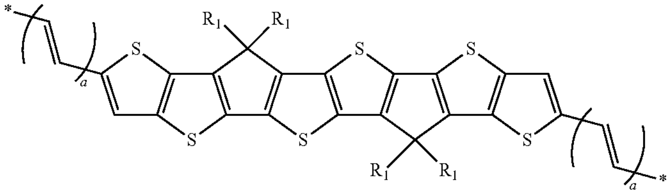
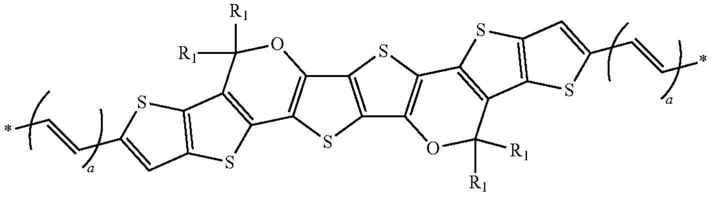
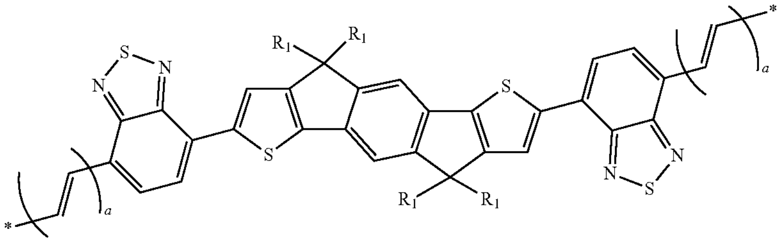

-continued

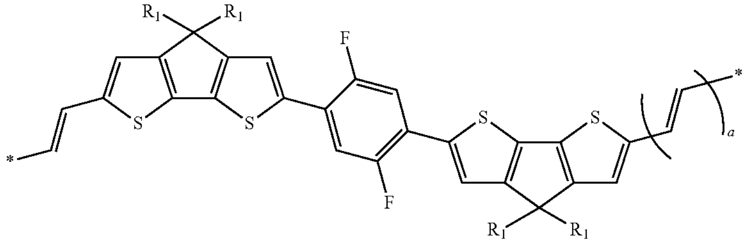

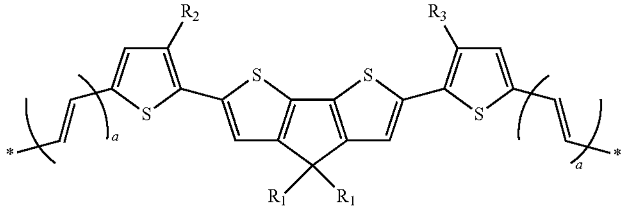

wherein a=0 or 1; and $R_1$, $R_2$ and $R_3$ are those independently selected from the following group: C1~C30 alkyl, C1~C30 silyl, C1~C30 alkoxy, C1~C30 alkylthio, C1~C30 haloalkyl, C2~C30 ester group, C1~C30 alkylaryl, C1~C30 alkylheteroaryl, $C_1$~C30 silylaryl, $C_1$~C30 silylheteroaryl, C1~ C30 alkoxyaryl, C1~C30 alkoxyheteroaryl, C1~C30 alkylthioaryl, C1~C30 alkylthioheteroaryl, C1~C30 haloalkylaryl, C1~C30 haloalkylheteroaryl, C1~C30 ester aryl or C1~C30 ester heteroaryl.

7. The active layer material of the claim 5, wherein Ar2 is one of the following structures:

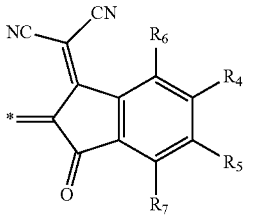
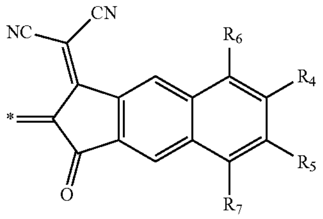

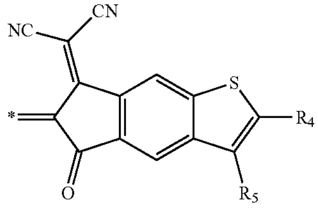

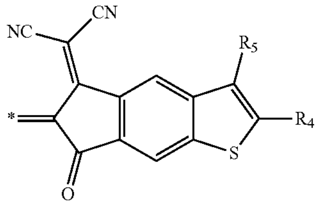
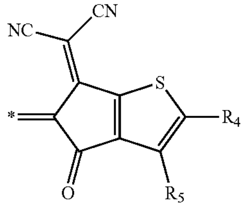

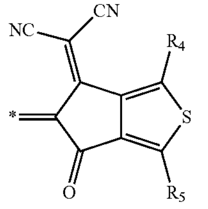
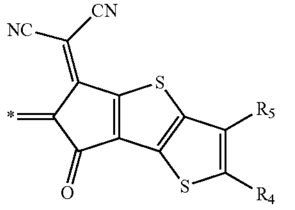

-continued

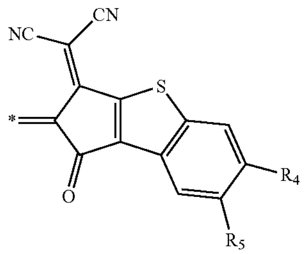

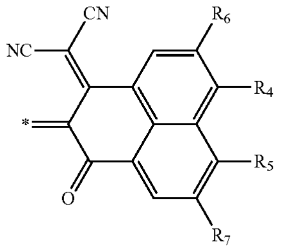
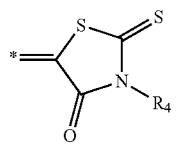

wherein $R_4$, $R_5$, $R_6$ and $R_7$ are independently selected from one of the following groups: C1~C30 alkyl, C1~C30 silyl, C1~C30 alkoxy, C1~C30 alkylthio, C1~C30 haloalkyl, halogen, hydrogen and cyano.

8. The active layer material of the claim 4, wherein the fullerene material structure is one of the following structures;

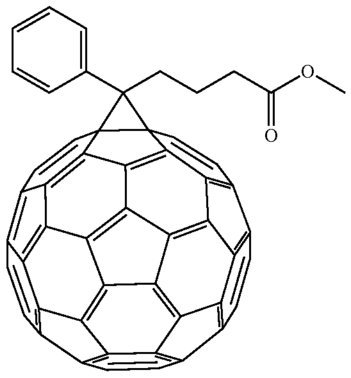

-continued

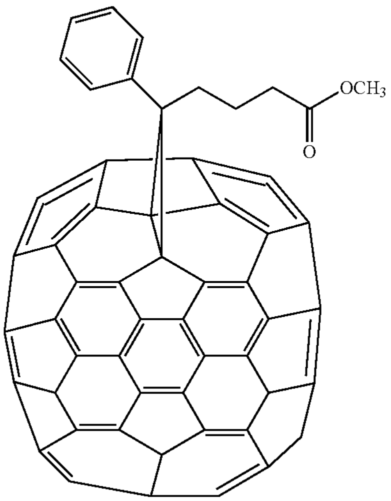

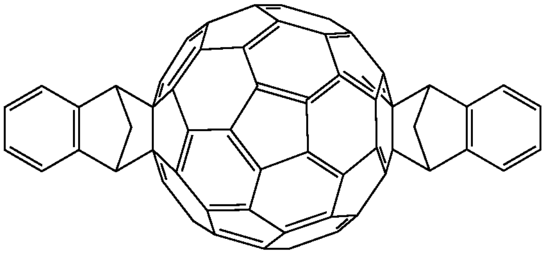

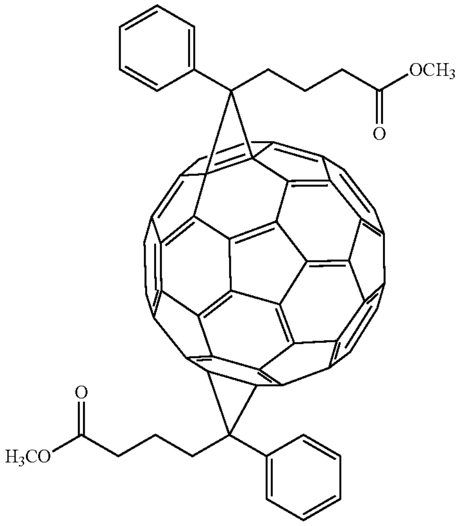

-continued

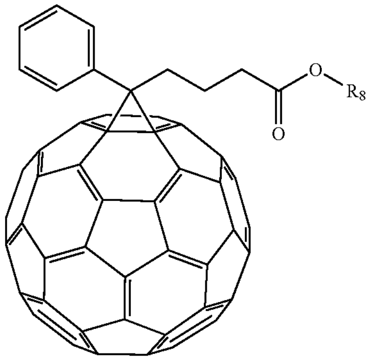

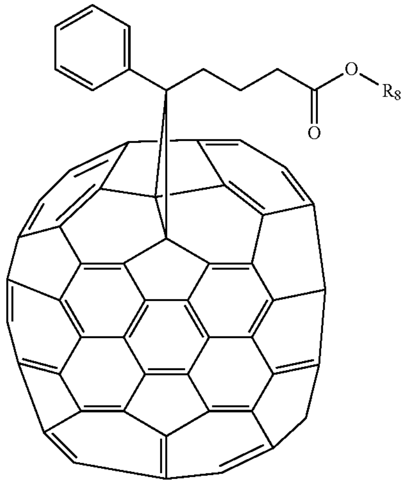

wherein Ra is C2~C30 alkyl.

9. An organic optoelectronic device comprising:

a first electrode;

an active layer which at least comprises the active layer material of claim 4; and a second electrode, wherein the active layer is disposed between the first electrode and the second electrode, and at least one of the first electrode and the second electrode is a transparent or semi-transparent electrode.

10. The organic optoelectronic device of claim 9, further comprising a first carrier transporting layer and a second carrier transporting layer, wherein the first carrier transporting layer is disposed between the first electrode and the active layer, the active layer is disposed between the first carrier transporting layer and the second carrier transporting layer, and the second carrier transporting layer is disposed between the active layer and the second electrode.

* * * * *